United States Patent [19]
DeYong et al.

[11] Patent Number: 5,355,435
[45] Date of Patent: Oct. 11, 1994

[54] ASYNCHRONOUS TEMPORAL NEURAL PROCESSING ELEMENT

[75] Inventors: Mark R. DeYong, Las Cruces, N. Mex.; Randall L. Findley, Austin, Tex.; Thomas C. Eskridge, Las Cruces, N. Mex.; Christopher A. Fields, Rockville, Md.

[73] Assignee: New Mexico State University Technology Transfer Corp., Las Cruces, N. Mex.

[21] Appl. No.: 885,423

[22] Filed: May 18, 1992

[51] Int. Cl.[5] ............................................. G06F 15/18
[52] U.S. Cl. ...................................... 395/24; 307/201
[58] Field of Search ...................... 395/24, 27; 307/201

[56] References Cited

U.S. PATENT DOCUMENTS

| | | | |
|---|---|---|---|
| 4,660,166 | 4/1987 | Hopfield | 364/807 |
| 4,943,931 | 7/1990 | Allen | 364/513 |
| 5,004,932 | 4/1991 | Nejime | 307/201 |
| 5,155,377 | 10/1992 | Castro | 307/201 |
| 5,172,204 | 12/1992 | Hartstein | 307/201 |
| 5,214,745 | 5/1993 | Sutherland | 395/22 |
| 5,237,210 | 8/1993 | Castro | 307/201 |
| 5,255,348 | 10/1993 | Novov | 395/24 |

Primary Examiner—Allen R. MacDonald
Attorney, Agent, or Firm—Jeffrey D. Myers; Deborah A. Peacock

[57] ABSTRACT

An asynchronous temporal neural processing element. The processing element is useful in solving problems from the class of temporal signal processing problems and is modeled closely on the sub-cellular biology and electrophysiology of neurons having chemical synapses.

19 Claims, 58 Drawing Sheets

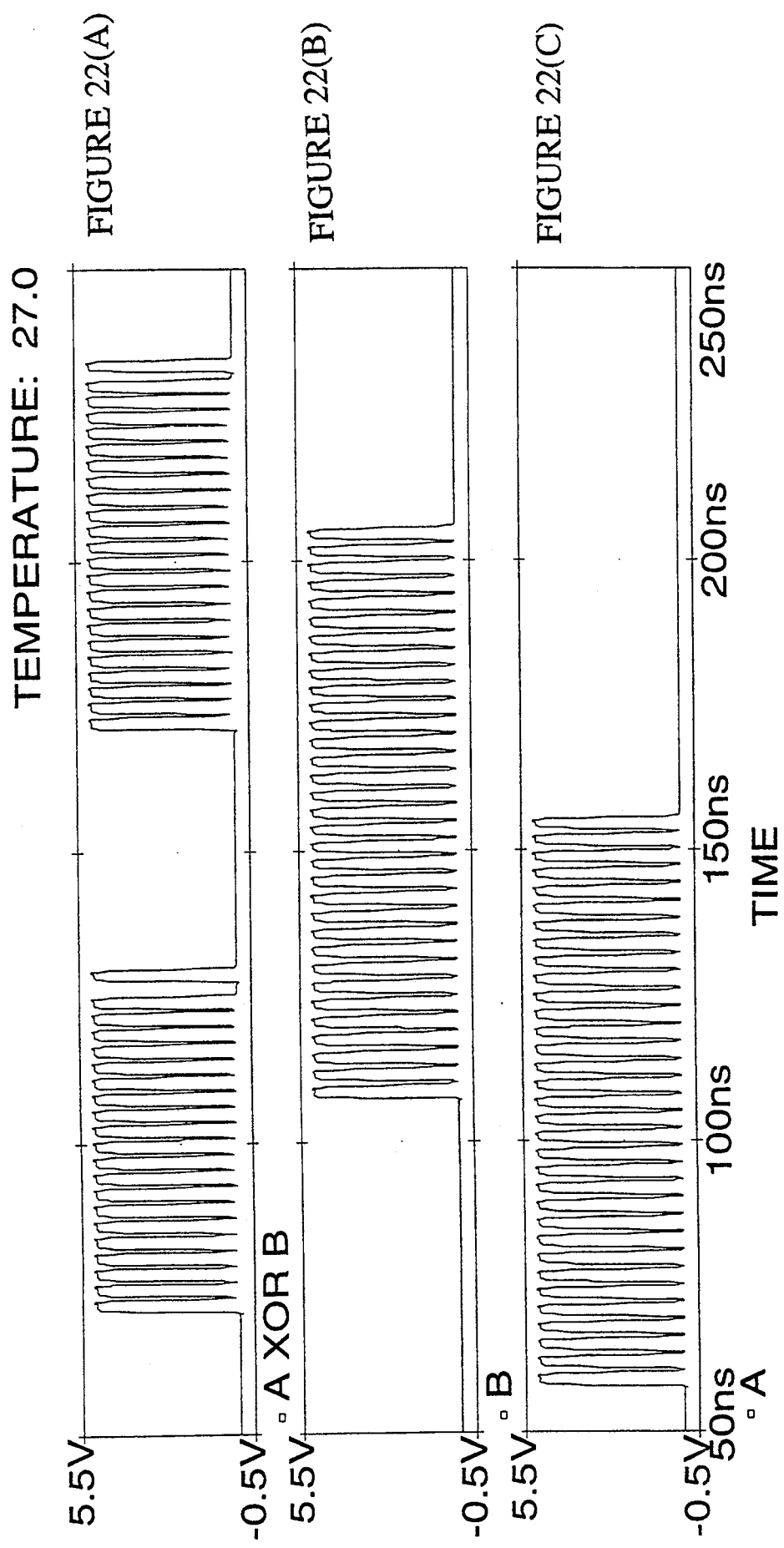

PULSE OSCILLATOR

FOUR BIT OSCILLATOR

SINGLE CELL OSCILLATOR

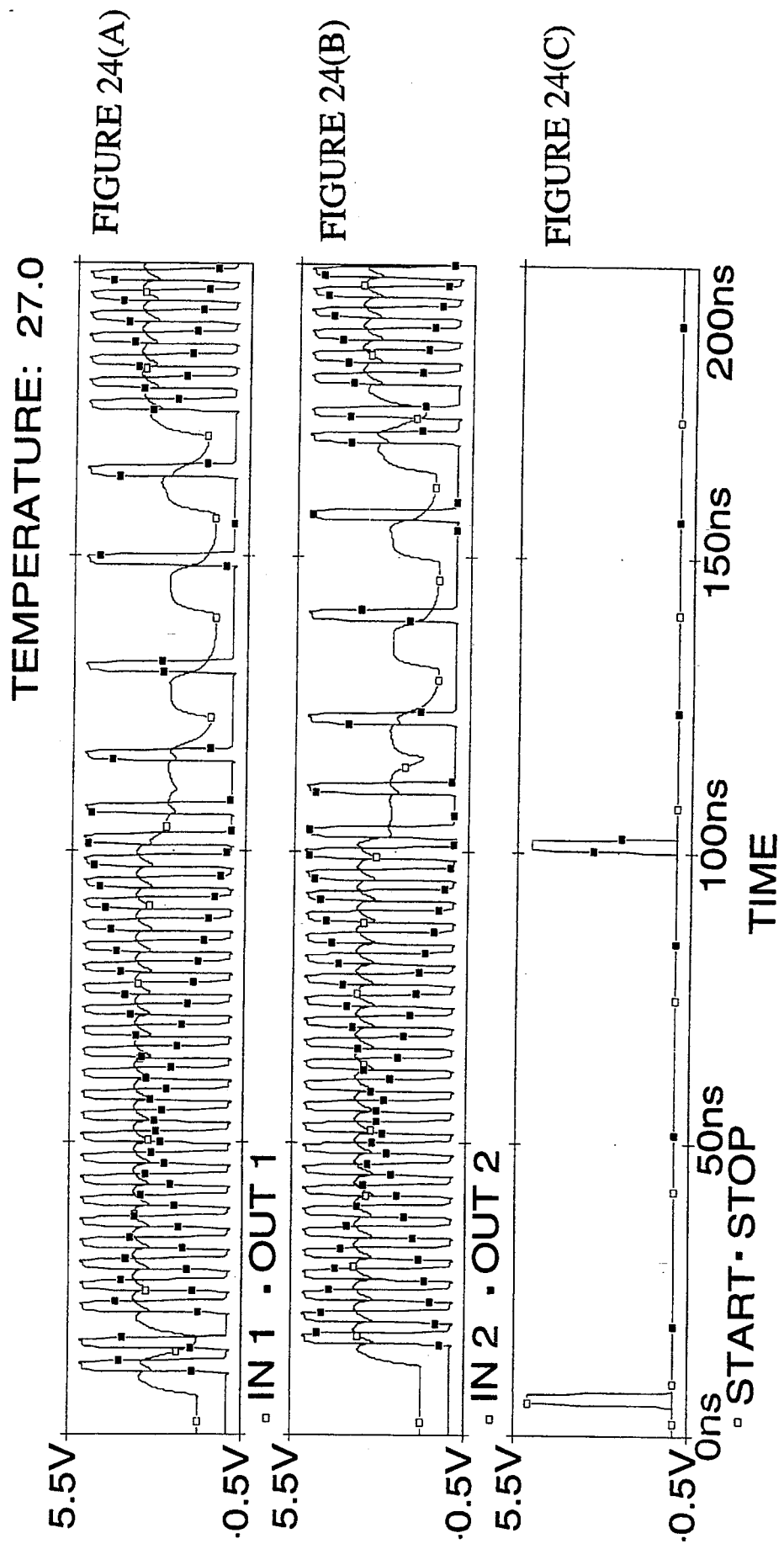

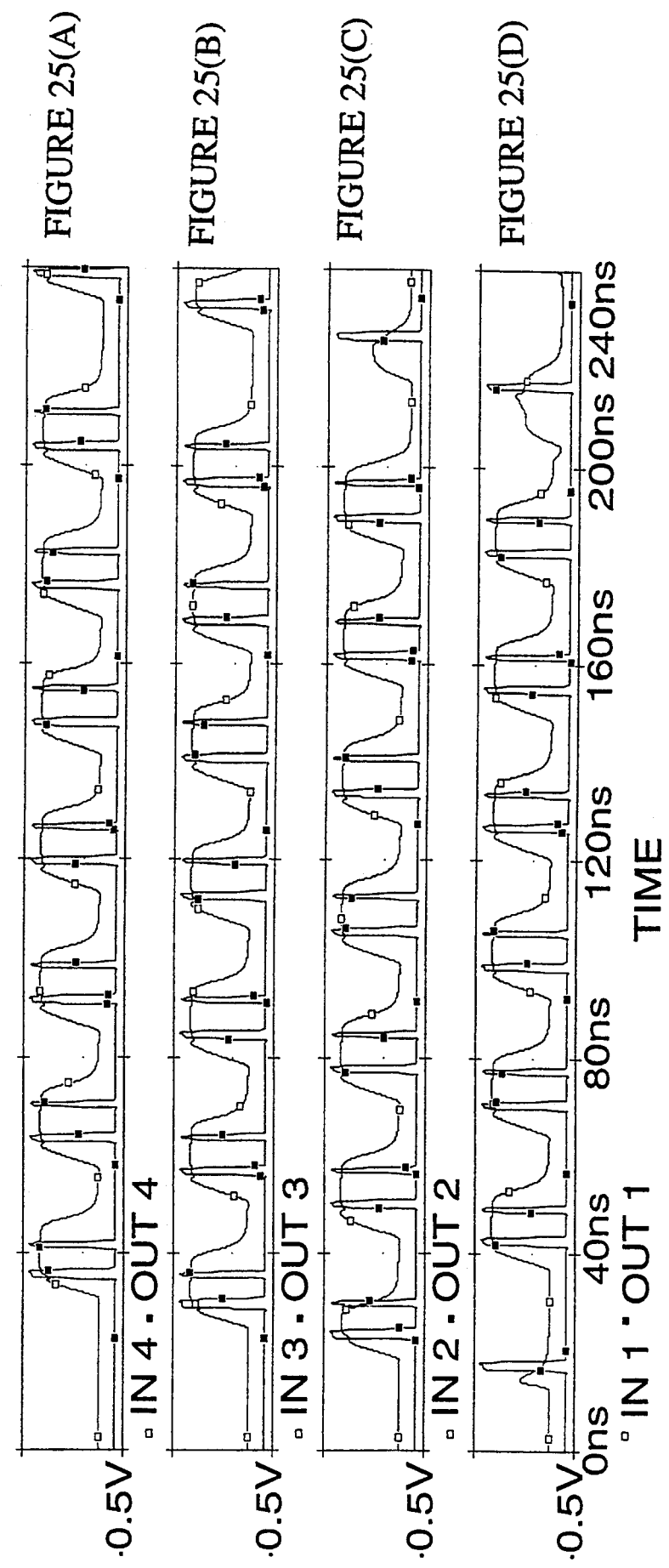

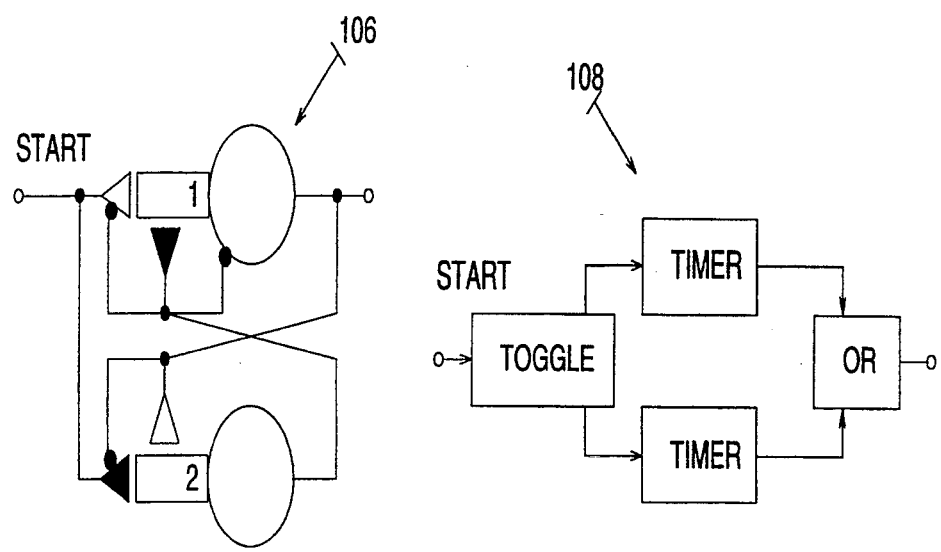
FIGURE 28(A)
FIGURE 28(B)
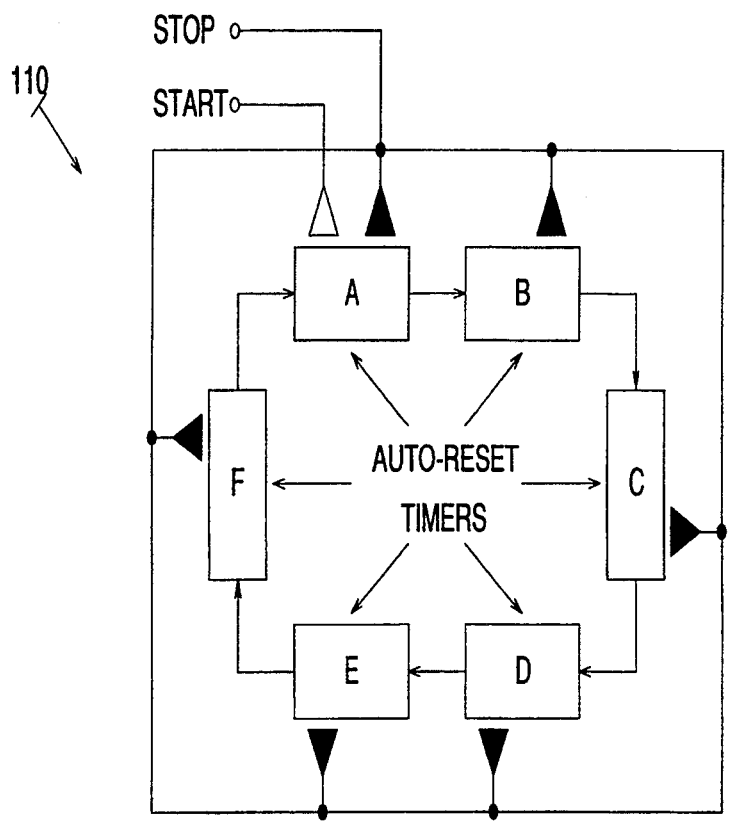
FIGURE 28(C)

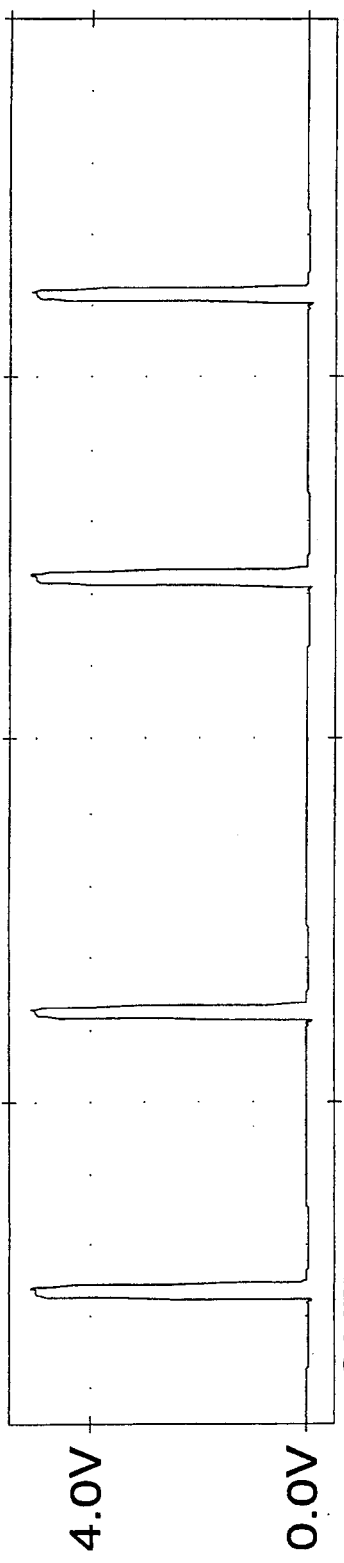
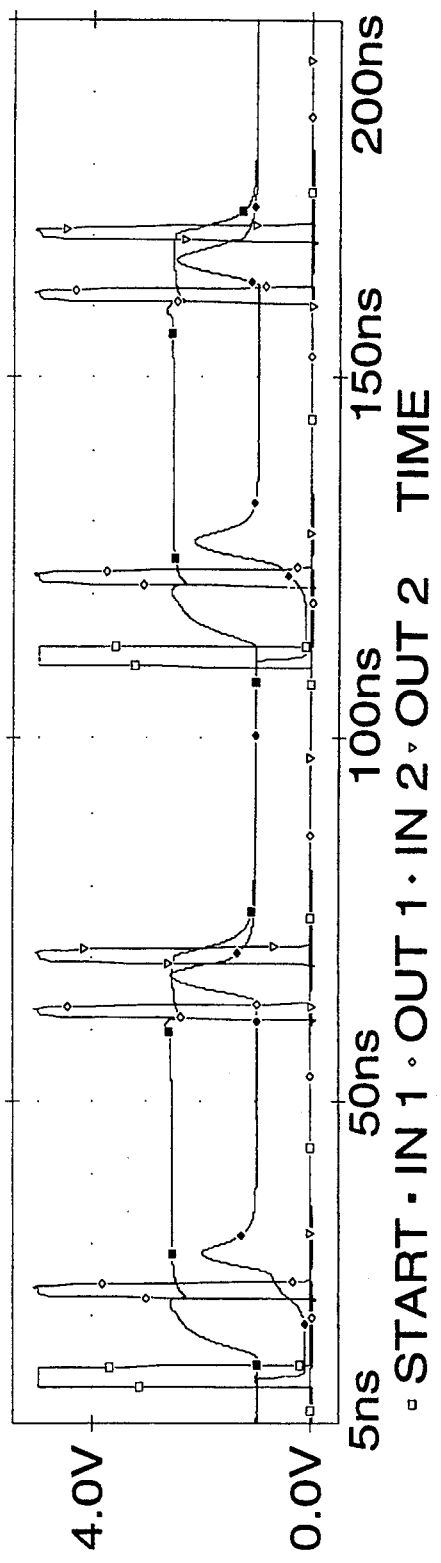

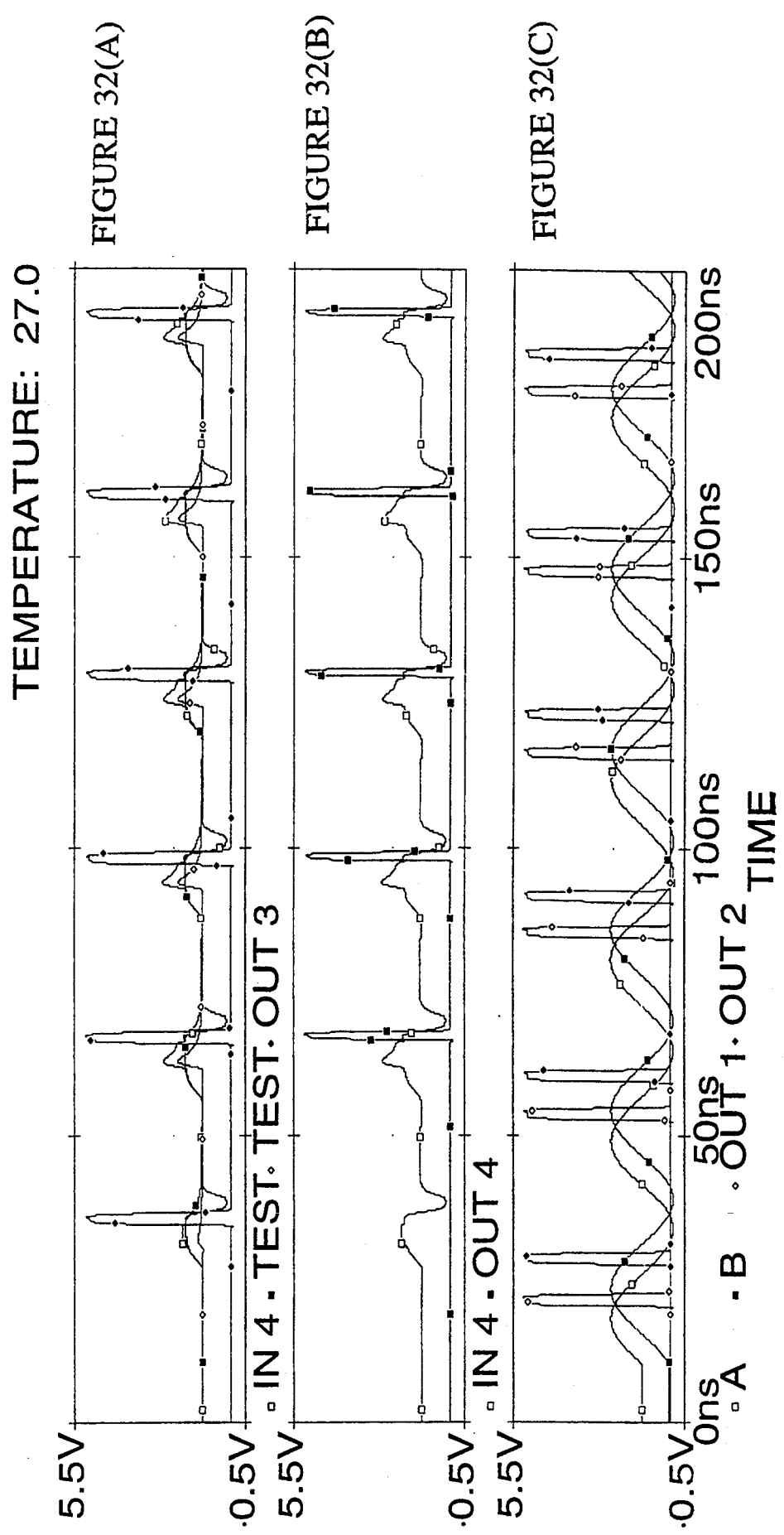

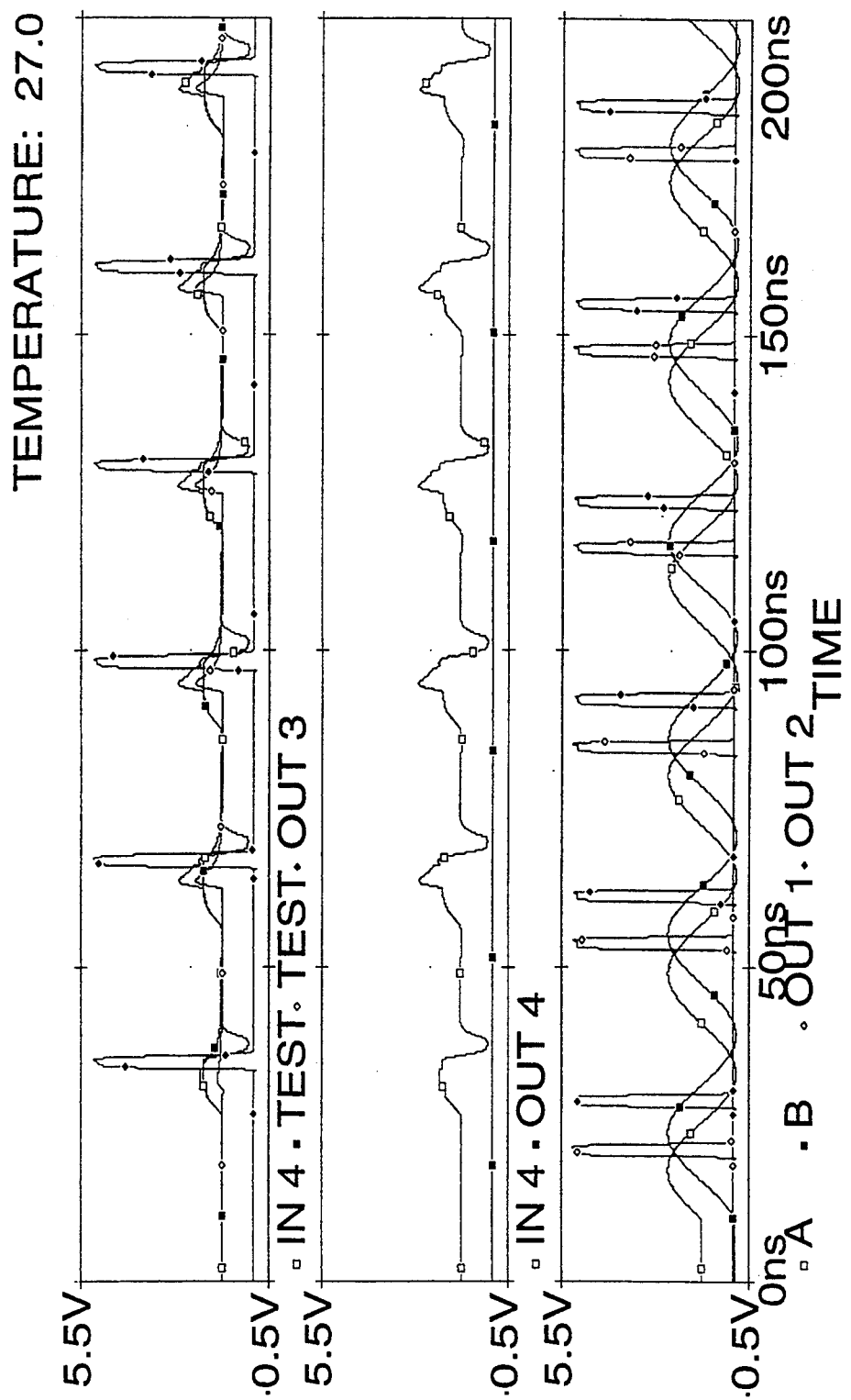

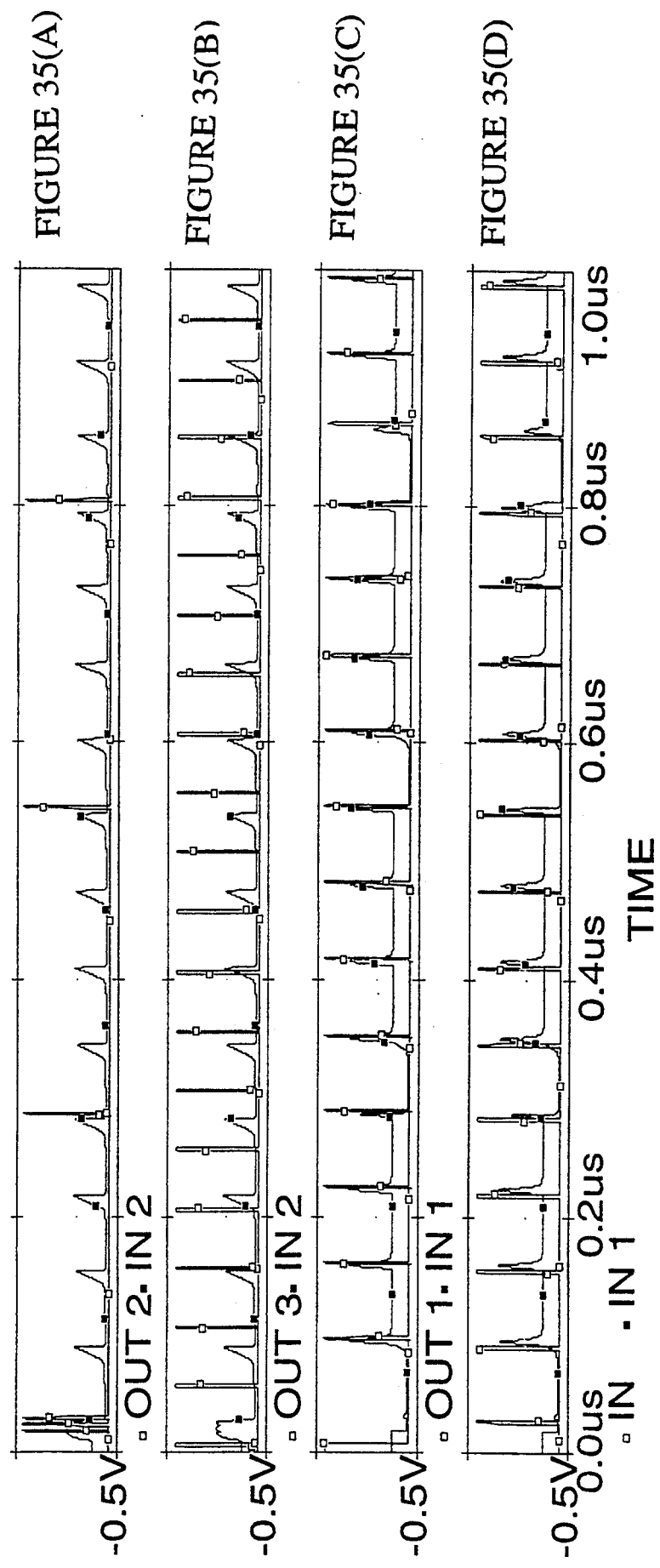

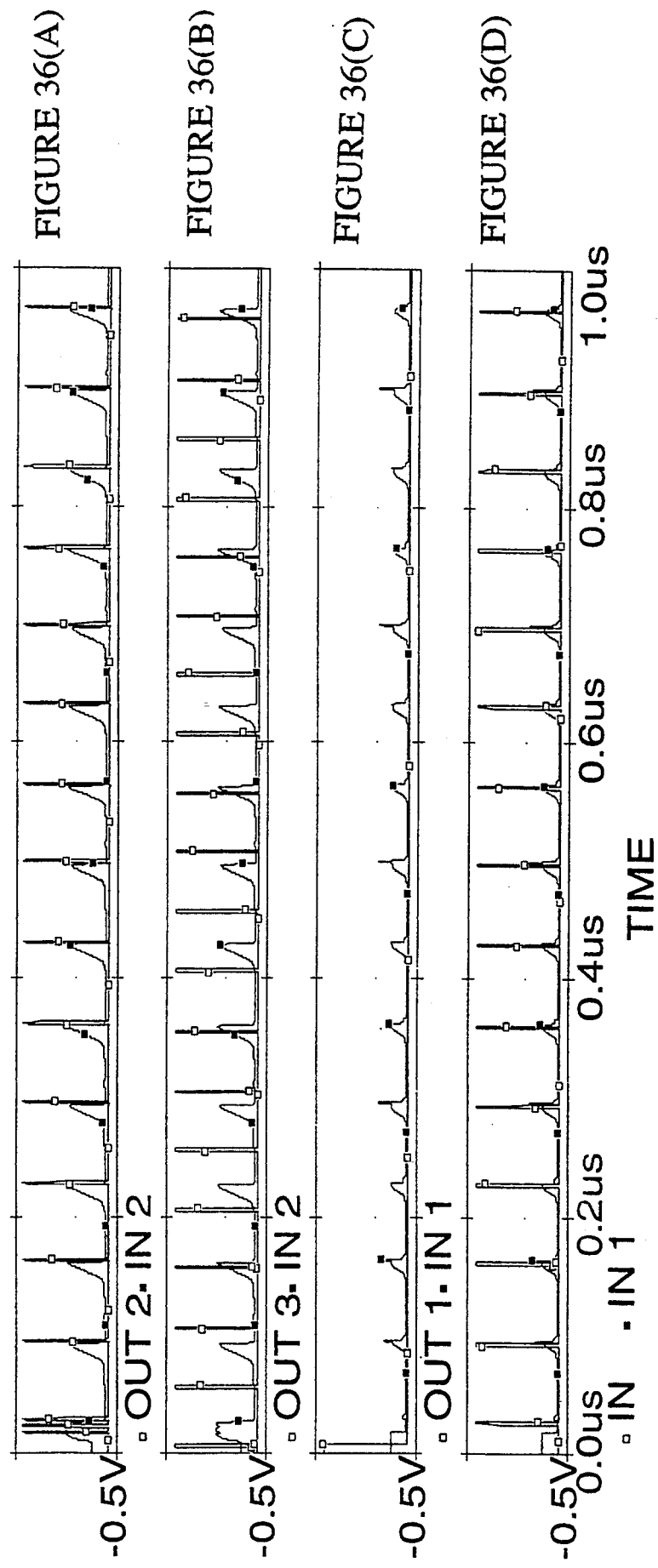

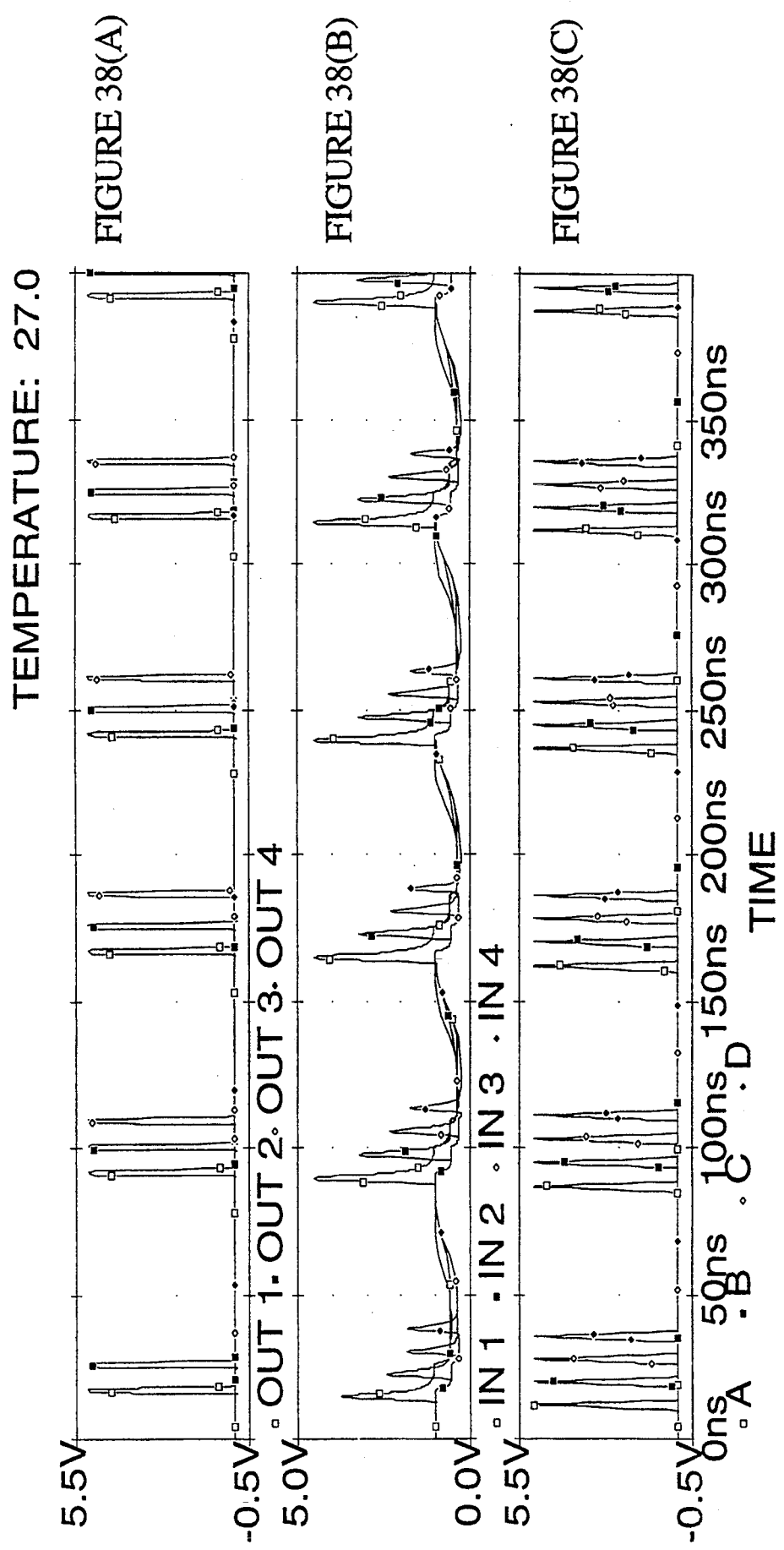

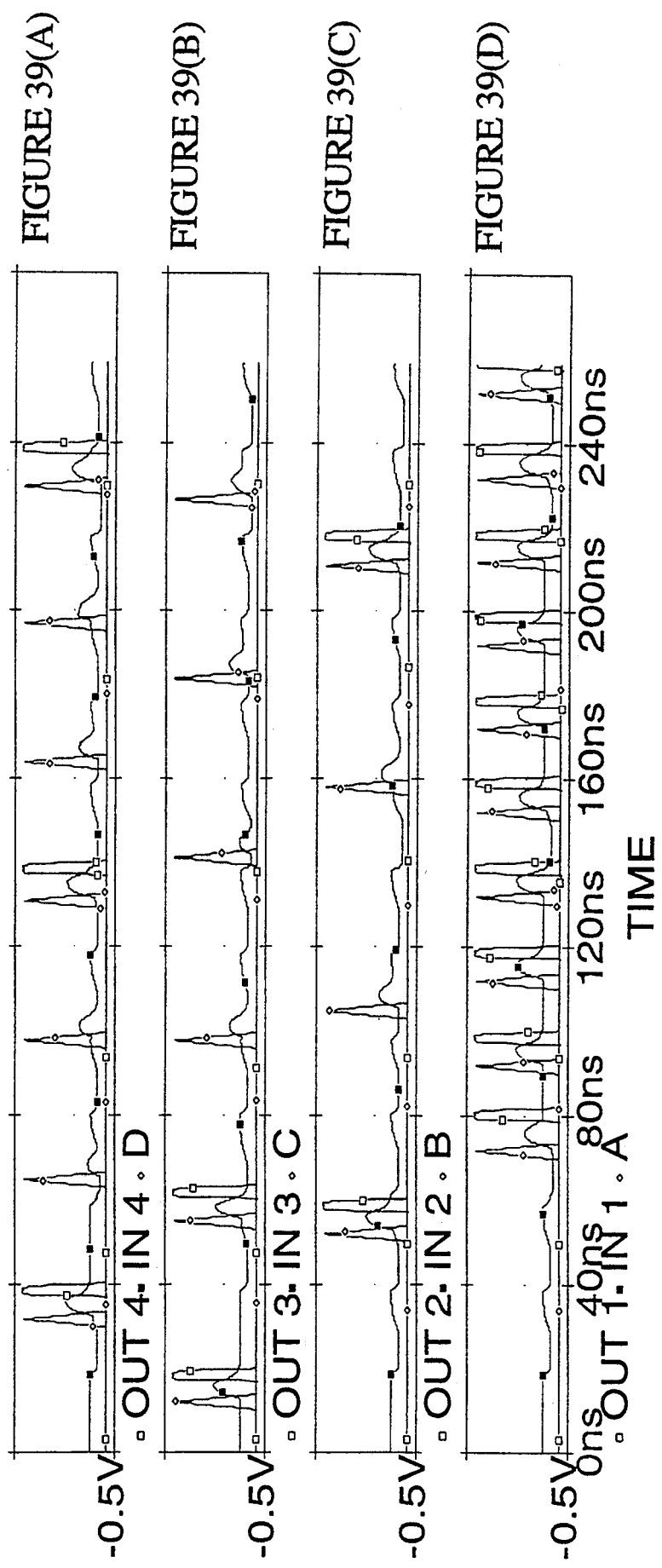

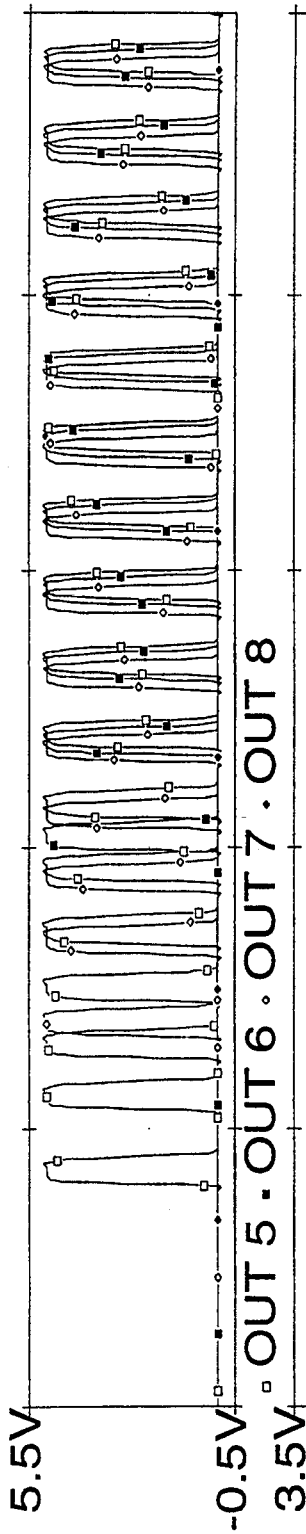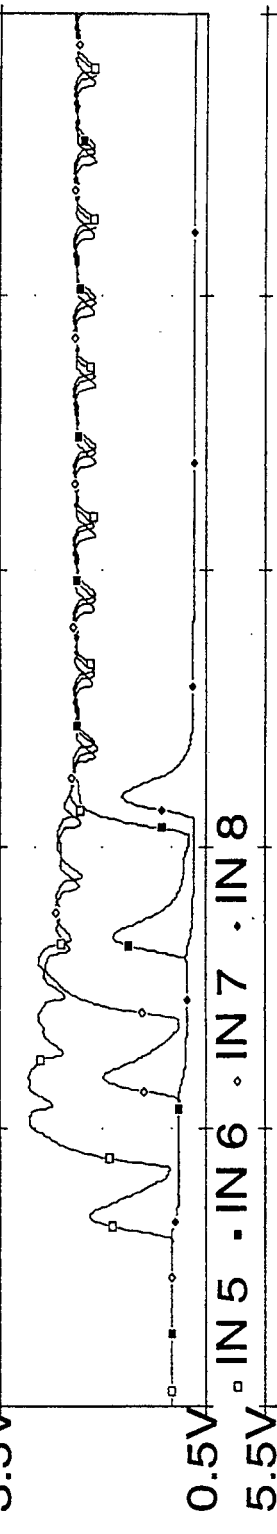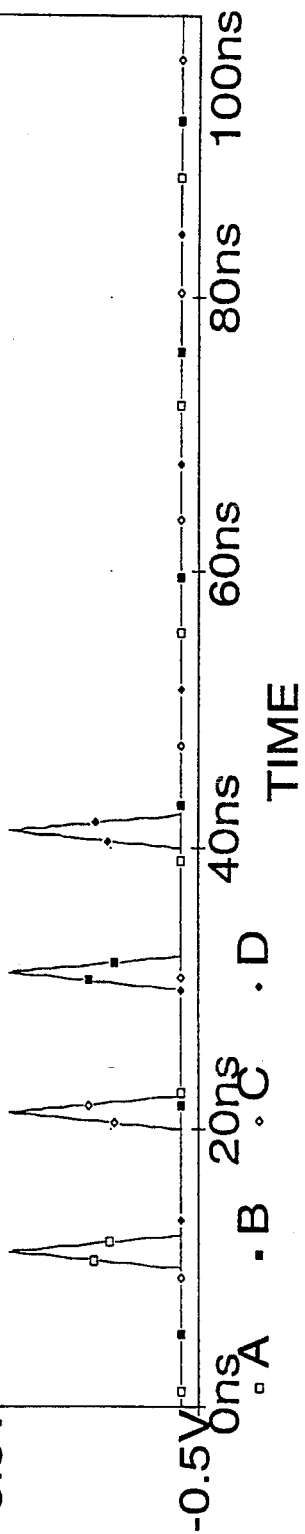

ASYNCHRONOUS TEMPORAL NEURAL PROCESSING ELEMENT

GOVERNMENT RIGHTS

The U.S. Government has a paid-up license in this invention and the right in limited circumstances to require the patent owner to license others on reasonable terms.

BACKGROUND OF THE INVENTION

The present invention relates to processing elements in electronic neutral networks and to data processing systems generatable by combinations of such processing elements. In particular, the present invention relates to asynchronous temporal processing elements which simulate neuron electrophysiology at subcellular levels. The present invention is useful in solving a wide range of temporal signal processing problems.

Artificial Neural Networks

Artificial Neural Networks (ANNs) are computational mechanisms that are structured and act in a manner that is analogous to biological neurons, as is shown in FIG. 1. In its simplest form, an ANN consists of a number of Processing Elements (PEs) interconnected via weighted connections. In ANNs, the processing elements are typically called "neurons" and the connections are called "synapses". The signal lines from the neurons to synapses are called "axons", and those from the synapses to the neurons are called "dendrites". These elements are called the "Standard Components" of the neural system. Each neuron is impinged upon by numerous synapses, which carry current from neighboring neurons. The input currents are integrated by the capacitance of the neuron in what is called the "post synaptic potential" (PSP) until a critical threshold is reached, at which point an "action potential" (AP) is generated. In biological systems, the PSP is a continuous in time, continuous in amplitude signal, and the AP is a continuous in time, discrete in amplitude signal. The action potential is propagated down the axon to a synapse connecting the neuron with another neuron.

Although these elements can be quite simple, the large amount of them required to perform practical tasks makes their implementation complicated. The most common PE, in which incoming signals are summed and then convolved with a sigmoidal transfer function, embodies two basic assumptions. First, it is assumed that communication between neurons can be approximated by a slowly-varying scalar value, which is typically interpreted as the frequency of APs. Second, it is assumed that computation within neurons occurs instantaneously —i.e., that there is no delay between the arrival of an incoming signal and its effect on the output. While these assumptions are biologically unrealistic, they are generally viewed as providing an adequate approximation that is relatively straightforward to implement, from which practical computational studies can be effected.

The present invention takes an alternative approach of designing a PE that directly models the signal processing in biological neurons. A custom asynchronous temporal VLSI design for the network elements is provided by the present invention which models the functional and behavioral characteristics of biological neurons. Other characteristics of biological neurons that are mere artifacts of organic implementations are omitted. Based on this approach, the literature can be effectively distinguished from the present invention by focusing on two major areas: implementation methods and behavioral characteristics.

Implementation Methods

There are three principal implementation methodologies used in VLSI neural networks. They are Conventional Analog, Digital, and a Hybrid of analog and digital. The implementation techniques used in the fabrication of neuron circuits play a large role in determining the efficiency of systems of such neurons. Analog devices have an advantage over digital devices of generally affording faster processing at a lower hardware overhead. Analog signals also naturally convey temporal information in the input. However, digital devices provide greater noise immunity and a building-block approach to system design. The PEs of the present invention exploit a hybrid approach in which the internal computation of the neuron is implemented in analog, and the extracellular communication can be performed either asynchronously or synchronously. This approach is based explicitly on the electrophysiology of spiking neurons, and gives the best of both worlds: the speed and low hardware overhead of analog and the noise immunity and building-block nature of digital components.

The following sections identify representative systems of each implementation method and discuss their weaknesses.

Conventional Analog

Conventional Analog systems are systems in which the range of permissible amplitudes of input and output signals are continuous. Conventional analog systems follow an axiomatic framework which asserts, among others, that the transient is linear and can be discounted as containing no information. However, transient behavior can be used in some instances to characterize the steady state. For example, in a conventional analog implementation of multiplication, the transient can be used to characterize how long the system will take to settle to steady state, or if it will settle. However, the transient does not contain any information relevant to the solution of the multiplication problem. Transients are used to characterize the physical behavior of the analog system and are not used in the functional behavior of the system. This neglect of the transient can have a detrimental effect on the processing power of the analog system, as will be demonstrated later in the section on behavioral characteristics, FIGS. 53 and 54.

Analog circuits are commonly used because of their speed and small implementation size. Analog waveforms also provide a natural means for modeling biological signals such as PSPs. Analog circuits have a fairly constant power dissipation due to the fixed current biases required to keep the devices in the proper operation mode. This is advantage over digital circuits which have power surges due to circuit switching, but utilizes more power than the PE of the present invention. The PE of the present invention is a data-driven device that is only active when there is data present. When data is not present, the system is at rest, therefore minimizing the overall power dissipation of the system.

In M. C. Maher, S. P. Deweertyh, M. A. Mahowald, C. A. Mead, "Implementing Neural Architectures Using Analog VLSI Circuits", IEEE Transactions on Circuits and Systems, Vol. 36, No. 5, May 1989, pp. 643-652, analog VLSI circuits are developed that model biological sensory systems. An example system is described which models the first stages of retinal processing. In particular, the model is concerned with the processing that occurs in the receptors and the outer plexiform layer of the visual system. Since these aspects of the visual system are at a much higher level than a basic neuron, the model abstracts away much of what is included in the present invention. For example, the Maher et al. system does not model synapses, axons, somas, or dendrites explicitly: the effects of these complex components are simply assumed to be subsumed within the overall behavior of their neuron. The neuron itself is again abstracted away from the actual biology to include only a means of producing action potentials, not modeling pre or post synaptic potentials. Similar work was reported in C. Mead and M. Mahowald, "A silicon model of early visual processing," Neural Networks, Vol. 1, no. 1, pp. 91-97, 1988. Other work directed by C. Mead, reported in John Lazzaro and C. Mead, "A silicon model of auditory localization," Neural Computation, Vol. 1, no. 1, pp. 47-57, 1989, applies the same techniques mentioned above to modeling the auditory localization of a barn owl.

This work is relevant to the present invention because of the leading role C. Mead has played in the development of analog VLSI systems for modeling biology. However, the level at which the biological systems are modeled are much more abstract than that of the present invention. Thus, many of the behaviors presented in the Examples section could not be accomplished using Mead's methods.

Digital

There has been interest in developing digital neural network systems and processing elements due to the availability of development tools for digital circuits and the expertise to use them. Digital neural processing elements also have the advantage of conforming to automated testing procedures, which analog systems lack. Because of the difficulty in implementing the inherently analog aspects of biological neurons, many digital neural processing elements implement instead the idealized mathematical expression of the multiplication of synapse weight by the activation value produced in the axon hillock. These circuits do not have particular circuitry for the standard components, but rather implement a simple form of microprocessor, complete with Arithmetic Logic Units (ALUs) and on-board RAM memory. There are many networks that conform to the above description, such as:

- M. S. Melton, T. Phan, D. S. Reeves, and D. E. Van den Bout, "The TIn-MANN VLSI Chip", IEEE Transactions on Neural Nets, Vol 3, no. 3, 1992, pp. 375-384.
- N. Mauduit, M. Duranton, J. Gobert, and J. Sirat, "Lneuro 1.0: A Piece of Hardware LEGO for Building Neural Network Systems", IEEE Transactions on Neural Nets, Vol 3, no. 3, 1992, pp. 414-422.
- D. Hammerstrom, "A VLSI Architecture for High-Performance, Low-Cost, On-chip Learning", Proceedings of the International Joint Conference on Neural Networks. Vol. II, June 1990, pp. 537-544.

These implementations all have the same problems, namely:

1. Standard components of the neural element are not explicitly modeled and therefore the resulting systems will not have an adequate range of behaviors.
2. An example of the point number one is in the weighting of the synapses. Synapses have time-varying weights that are critically dependent on the inputs that have passed over them previously. In digital circuits, synapse weights are modeled as a fixed value that may be updated at various intervals. However, because the updates of the synapse weights occur at clocked cycles, their response cannot be to the incoming data, but only to the system clock.
3. Because the circuits are digital, temporal aspects inherent in biological neural networks are either missed or shifted (see Continuous/Asynchronous vs. Discrete/Synchronous below). Due to this, the output of these systems will not preserve what in many cases are critically important aspects of input signals.
4. Digital circuits are often very large due to the size of common components such as RAM and multipliers. This generally results in a lower density of PEs per square centimeter on an integrated circuit.
5. Digitally implemented chips will generally require much more power than an analog system, due to its larger size, and because in digital circuits, all switches must switch at the same time.
6. Because numeric information must be stored as digital bit steams with limited resolution, there are a number of analog values that cannot be realized. This limitation may prevent an adequate solution for a given problem from being found.

Hybrid Analog/Digital

Hybrid Analog/Digital systems are proposed to circumvent the problems associated with either analog or digital only implementations of VLSI neural networks. The idea is to compensate for the weaknesses of one technology with the strengths of the other. For example, communication with analog signals has the disadvantage of being susceptible to noise. This can be overcome by using digital communication techniques.

One system that uses this technique is W. A. J. Waller, D. L. Bisset, and P. M. Daniell, "An Analogue Neuron Suitable for a Data Frame Architecture". in *VLSI for Artificial Intelligence and Neural Networks*, J. G. Delgado-Frias and W. R. Moore, eds., Plemum Press, New York, 1991. The synapse weights are stored digitally, then are converted via a Digital-to-Analog converter to an analog value. This is then passed through a synapse, with converts the analog value into a number of pulses. These pulses are then counted by digital circuitry, and produced as output. While this is clearly a design motivated by engineering considerations, it does illustrate the types of integration that can be made using a hybrid approach.

Other types of hybrid systems generally attempt to perform internal computations in analog and external communication digitally. However, in the examples given above, which are prototypical of the field, this amounts to implementing digital circuits in analog. As such, these methods will have many of the same problems as conventional analog and digital circuits.

Biological vs. Non-Biological

A principal motivation behind the design of the present invention was to realistically model a biological neuron without sacrificing speed and computational power. Biological realism in neural modeling is motivated both by the goal of understanding the behavior of biological nervous systems, and by the realization that biological neurons are complex, versatile signal processing devices that are evidently well-suited to a very large variety of computational tasks. Neurons are hybrid analog/discrete devices, in which inputs are processed by the time-dependent convolution of relatively slowly-varying post synaptic potentials, and outputs are transmitted over long distances by fast, relatively loss-free action potentials. This integration of continuous, Asynchronous analog input processing with discrete, pulse-encoded communication allows neurons to make use of time and phase difference information between signals arriving in real time to represent both temporal and spatial information. It also allows neurons to exchange information in times much smaller than their internal processing times, hence breaking the communication bottleneck that hobbles many massively parallel systems. The combination of high-speed, discrete communication and versatile analog computation renders neurons, as is shown in the Examples section, ideal for many time-dependent signal processing applications.

Accordingly, the conceptual basis for the present invention is the functional homology between a voltage-gated ion channel—the active device of electrophysiology—and a single transistor. The choice of channels as the basis of the model allows the achievement of robust performance with a smaller number of components than models based on the analogy between neurons and operational amplifiers. Where there are many biological aspects of neurons that are important in developing robust ANNs, there are also some aspects that are present only because of the neuron's implementation in organic matter. One way the present invention differs from biological neurons is in its generality. The present invention is intended to model an abstracted, generic neuron with action potentials and chemical synapses, not a specific neuron type. Biological neurons are generally specialized for particular functions and synaptic environments; the present PE, in contrast, develops a general model that can be specialized as needed. Another artifact of the implementation of biological neurons in organic matter is their voltage requirements and operating speeds. Biological neurons work on the millivolt voltage and the millisecond time ranges. The preferred embodiment of the present PE is scaled to the voltage and time domains most naturally implemented in silicon: 0–5 volts and nanoseconds to microseconds. This scaling allows development of applications for high-speed TSPs that cannot be addressed by models such as Mead's, that work on the milliseconds to seconds time scale of biological neurons.

Time-Dependent vs. Time-Independent

Many ANNs are based on the assumption that each input vector is independent of other inputs, and the job of the neural network is to extract patterns within the input vector that are sufficient to characterize it. For problems of this type, which amounts to spatial pattern recognition, a network that assumes time independence will provide acceptable performance. However, there is a large class of problems where the input vectors are not independent and the network must process the vector with respect to its temporal characteristics and relation to previous vectors. Network architectures that assume time independence are typically unwieldy when applied to a temporal problem, and require additional inputs, neuron states, and/or feedback structures. Although temporal characteristics can be converted into activation levels, this is difficult to do without losing information that is critical to solving the problem efficiently. Networks that assume time dependence have the advantage of being able to handle both time dependent and time independent data.

Continuous/Asynchronous vs. Discrete/Synchronous

Many problems amenable to solution by ANNs require that the temporal aspects of the system input to be taken into account. To accomplish temporal dependency, the implemented systems must be continuous and asynchronous. Both of these conditions are required because if a system is discrete or synchronous, errors will be introduced into the system by missing signals in the digitization process or by shifting signals in both the digitization and synchronizing processes. FIG. 52 illustrates the information losses caused by digitizing a pulse stream representing a continuous input signal and by enforcing synchronicity on the processing elements. At the first input spike, a low amplitude, long duration PSP begins in the continuous/asynchronous (CA) case which is only registrable at time T1 in the discrete/Synchronous (DS) case. When the second spike arrives, the amount of current that it adds to the PSI in the CA case pushes it over the threshold Vth, causing an axon hillock to fire at time T2. Voltages V1 and V2 show two additional possibilities for the PSPs after the second spike. With voltage V1, the current level at the time of the next digitization will be lower than the threshold, and therefore the digitizing system will have missed the axon hillock firing altogether. With voltage V2, the current level remains at a high enough level so that the digitization will recognize the current as being enabled. It could then command the axon hillock to fire at time T3. However, important temporal properties of the input signals have been changed by delaying the order to fire by Td. This delay could be as much as the digitizing window Ts.

A similar situation arises in conventional analog circuits. FIG. 53 shows a PSP which we interpret to be the same for the CA circuit as for the conventional analog circuit. Although the conventional analog circuit can receive as input the continuous-time input signal, it imposes an implicit digitization scheme by requiring the resulting output PSP, V1, to be in a "steady-state" behavior before it can be used by other components. An element of a conventional analog circuit will be in steady-state when the increase or decrease in the level or frequency of the output falls below a set tolerance. Until that time, the element is said to be in "transient" behavior, which is ignored. The first input AP in FIG. 53 has a leading edge at time T1 and a falling edge at time T2. The rise time of the low-amplitude, long-duration PSP V1 contained in the time interval TD1 could be considered a transient, with time TD2 being an intermediate steady state. When the second input AP arrives it generates a PSP that adds with the previous PSP. If the resulting combined PSP follows the solid line, the period from T3 until the PSP completely dissipates is considered a transient period with rest as the steady-state value. It is possible to view the entire period from T1 until the dissipation of the PSP as transient, if TD2 is viewed as transient. If the PSP follows V2, the period TD3 is a transient, with V2 as the steady state. If the PSP follows V1 the period TD4 is a transient, with V1 as the steady-state value. In any of these cases, the time delay between AP1 and AP2, as well as the transient PSP amplitude, is assumed to contain no information.

As has been mentioned, and will be explicitly demonstrated in the Examples section, information can be carried in the transient signals based on the delay between the input pulses. Although these pulses can cause significant changes to the PSP, they can be considered to be in the transient region of a conventional analog circuit and will be ignored by such a circuit. In conventional analog circuits, where all computation is carried out by level-to-level transformations, no information about the temporal characteristics of the input signals can be used to distinguish the input.

Triggerable vs. Non-Triggerable

Due to the fine granularity of the temporal differences between incoming APs to a PE, the PE must be a triggering type device in order to maintain the temporal characteristics of the input. A triggering device has a threshold defined such that whenever the threshold is exceeded (e.g., by current level or frequency), the device is turned on. The axon hillocks of the present invention are an example of a triggering device. When the potential of the soma passes the threshold of an axon hillock, the hillock fires an AP.

By setting the threshold such that the device will always be active, any triggerable device can be made into a non-triggerable device. There are some applications where this may be desirable, but to do so will cause information about the temporal characteristics of the input to be lost, or at least require a significant amount of computation to recover.

Non-linear vs. Linear

Many devices in the present invention have non-linear dynamics which arise because of the method used to implement the PE. Allowing the PE to have non-linear components, especially a non-linear transform from APs to PSPs, allows the PE to solve more difficult problems that it could if it were linear. This is because non-linear elements are able to solve non-periodic dynamical systems, while linear elements are able to solve only periodic dynamical systems.

Allowing the circuitry to contain subsystems with non-linear dynamical properties also reduces the power and size requirements of the circuits. Since all transistors have inherent non-linear properties, no device can be made completely linear. Typical implementation methods utilize additional circuitry to extend system linearity. The additional circuitry increases the power consumption and the space required to implement the complete circuit.

The approach taken with the present invention is to allow and utilize the entire non-linear range of the devices obtainable in the implementation medium; i.e., silicon, GaAs, etc.

Accordingly, the PE of the present invention provides an ability to process asynchronous temporal information not heretofore available.

SUMMARY OF THE INVENTION

The present invention is of a neural network processing element, a plurality of which comprise a neural network, comprising: one or more chemical synapse simulators; a neuron soma simulator; one or more dendrite simulators operably connecting a chemical synapse simulator to the neuron soma simulator; an axon simulator; an axon hillock simulator operably connecting the neuron soma simulator to the axon simulator; one or more asynchronous signal receptors for receiving asynchronous signals and for providing the signals to the chemical synapse simulators; and one or more asynchronous signal transmitters for sending asynchronous signals from the means for simulating an axon. In the preferred embodiment, the chemical synapse simulators comprise excitatory, inhibitory, and shunting synapse simulators, which simulate both presynaptic and post synaptic regions. Preferably, the processing element includes one or more bias adaptation networks for dynamically controlling one or more operational parameters of the axon hillock simulator, such as threshold/delay level, action potential pulsewidth level, and refractory period, or one or more operational parameters of the chemical synapse simulators, such as current amplitude, current duration, and delay period. The asynchronous signal transmitters preferably send asynchronous pulsed signals. The processing element additionally comprises an asynchronous reset for returning the processing element to its initial conditions.

The present invention is also of an apparatus for solving temporal signal processing problems comprising a plurality of asynchronous temporal neural processing elements, each of the neural processing elements comprising a resistive/capacitive network for simulating a neuron soma. In the preferred embodiment, the neural processing elements additionally comprises an axon hillock simulator (preferably a voltage-controlled oscillator) which monitors the voltage level of the resistive/capacitive network means. The axon hillock simulator is biased by one or more DC bias voltages which control threshold/delay level, action potential pulsewidth level, and/or refractory period. The neural processing elements additionally comprise at least one chemical synapse simulator (excitatory, inhibitory, and/or shunting) which draws or supplies current from or to the resistive/capacitive network. The chemical synapse simulator is biased by one or more DC bias voltages which control current amplitude, current duration, and delay period.

The invention is also of a bias adaptation network for controlling a biased parameter of a slave neural network processing element, comprising: one or more receptors of one or more signals from one or more master neural network processing elements; a determinator of the present location of a bias level corresponding to the voltage biased parameter of the slave neural network element on the bias/parameter nonlinearity; and a bias modifying element for adjusting the bias level by a delta amount dependent on the location on the bias/parameter nonlinearity, the adjustment being asynchronously time dependent with respect to the one or more signals from the one or more master neural network processing elements. The bias adaptation network preferably additionally comprises oscillation compensation means.

Additionally, the invention is of a general purpose neural network processing element for receiving a plurality of input signals from a plurality of sources comprising: a neuron soma simulator; an axon hillock simulator which monitors a potential of the neuron soma simulator; and a plurality of receptors of one of the input signals, each of the receptors comprising an excitatory synapse simulator which provides energy to the neuron soma simulator and an inhibitory synapse simulator which draws energy from the neuron soma simulator. In the preferred embodiment, each of the receptors additionally comprises a shunting synapse simulator which causes the neuron soma simulator to return to its resting potential. Each of the receptors is independently disableable and each of the synapse simulators is as well. Furthermore, each of the receptors and the axon hillock simulator are independently biasable.

The present invention is also of a neural network processing element comprising a chemical synapse simulator and a modifying element for adjustably controlling the processing delay period of the chemical synapse simulator to a delay period between a maximum of at least approximately one second and a minimum of at least approximately one nanosecond.

The invention is also directed to a neural network processing element comprising processors of asynchronous signals and asynchronous data-driven controllers for adjusting the processing delay period of the asynchronous means for processing signals. In the preferred embodiment, the controllers can produce a delay period between a maximum of at least approximately one second and a minimum of at least approximately one nanosecond.

The invention is additionally directed to a neural network processing element implemented in any medium, the processing element comprising asynchronous signal processors and having a maximum processing speed approximately equal to the maximum physical signal transmission speed of the medium. In the preferred embodiment, the processing element has a maximum processing resolution of at least approximately two orders of magnitude lower than the maximum physical signal transmission speed of the medium.

The invention is also of a coupled-grid retinal processor comprising: an array of charge coupled devices for detecting photons and for generating signals upon detection of photons; and a multi-layered network of asynchronous temporal neural network processing elements for processing said signals.

The invention is further directed to a method of processing asynchronous signals comprising the steps of: receiving one or more asynchronous action potential signals; providing the action potential signals to one or more chemical synapse simulators; modifying the amount of energy stored in a neuron soma simulator; and sending an asynchronous action potential signal from an axon hillock simulator.

A primary object of the present invention is to provide a neural network processing element capable of both receiving and sending asynchronous signals.

An additional object of the present invention is to provide a neural network processing element useful in solving temporal signal processing problems.

Another object of the present invention is to provide a neural network processing element which simulates neuron activity at a subcellular level, including simulation of three types of chemical synapse (excitatory, inhibitory, and shunting); dendrites; soma; axon hillock; and axon.

Yet another object of the present invention is to provide dynamically varying bias control of signal amplitude, pulsewidth, duration, refractory period, and delay.

Still another object of the present invention is to provide an adaptation module for neural network processing elements which alters operating characteristics of the processing elements based upon system state.

An additional object of the present invention is to provide a general purpose neural network processing element having a plurality of synapse triads, each synapse being independently disableable, from arrays of which general purpose neural networks may be constructed which permit emulation of any circuitry constructible from a plurality of neural network processing elements of the invention.

A primary advantage of the present invention is that the processing element is operable at speeds ranging from a nanosecond (when implemented in silicon circuitry) to essentially infinity (one second or more).

Another advantage of the present invention is that the processing element may be implemented in media other than silicon or using signals other than electrical and operate at a maximum speed corresponding to the physical transmission speed of the signals through the implementation medium.

An additional advantage of the present invention is that the processing resolution of the circuitry may be up to two orders of magnitude finer than the physical transmission speed of the signals through the implementation medium.

Still another advantage of the present invention is that small and fast analog circuitry may be rapidly designed to handle a wide range of temporal signal processing problems, including: continuous windowed logic; single and multiple bit pulse oscillation; general purpose cognition and memory; timing; phase shift demodulation and quantification; filtering; winner-take-all problems; and audio and video processing.

Yet another advantage of the present invention is that a means for asynchronous reset of a processing element is provided.

BRIEF DESCRIPTION OF THE DRAWINGS

FIG. 22 is a graph of the simulated behavior of the exclusive-or network of FIG. 21;

FIG. 24 is a graph of the simulated behavior of the pulse oscillator network of FIG. 23;

FIG. 25 is a graph of the simulated behavior of the four bit oscillator network of FIG. 23;

FIG. 28 a block diagram of timing systems employing the processing element;

FIG. 29 is a graph of the simulated behavior of the auto-reset timer network of FIG. 28 having a short duration between output action potentials;

FIG. 32 is a graph of the simulated behavior of the phase shift demodulator of FIG. 31 when presented with an acceptable phase shift;

FIG. 33 is a graph of the simulated behavior of the phase shift demodulator of FIG. 31 when, presented with a non-acceptable phase shift;

FIG. 35 is a graph of the simulated behavior of the high-pass filter of FIG. 34 when presented with an acceptably high frequency input stream;

FIG. 36 is a graph of the simulated behavior of the high-pass filter of FIG. 34 when not presented with an acceptably high frequency input stream;

FIG. 38 is a graph of the simulated behavior of the temporal winner-take-all network of FIG. 37;

FIG. 39 is a graph of the simulated behavior of the single-layer MAXfNET network of FIG. 37;

FIG. 40 is a graph of the simulated behavior of the general temporal winner-take-all network of FIG. 37;

DESCRIPTION OF THE PREFERRED EMBODIMENTS

The present invention is of an asynchronous temporal neural processing element (PE) closely modeling the sub-cellular biology of neurons which have chemical synapses. The PE is useful in solving a wide array of problems in the class of temporal signal processing problems, which class subsumes the class of nontemporal signal processing problems. The present invention is also of data processing system components fabricatable from the PE.

Figures 1A, 1B, 1C:
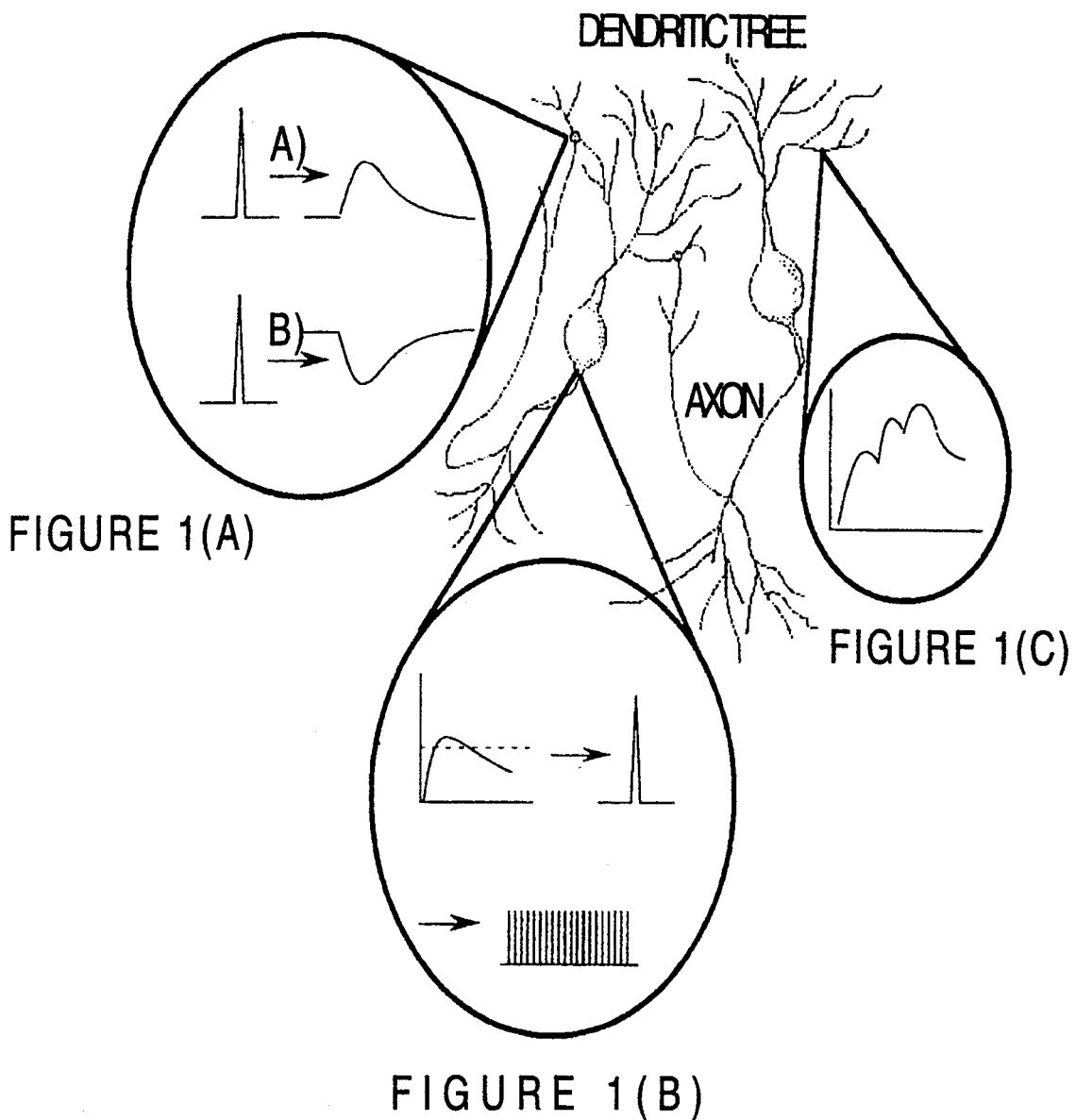
FIG. 1 is an illustration of the types of signals generated by a network of typical neurons.
Figure 2:
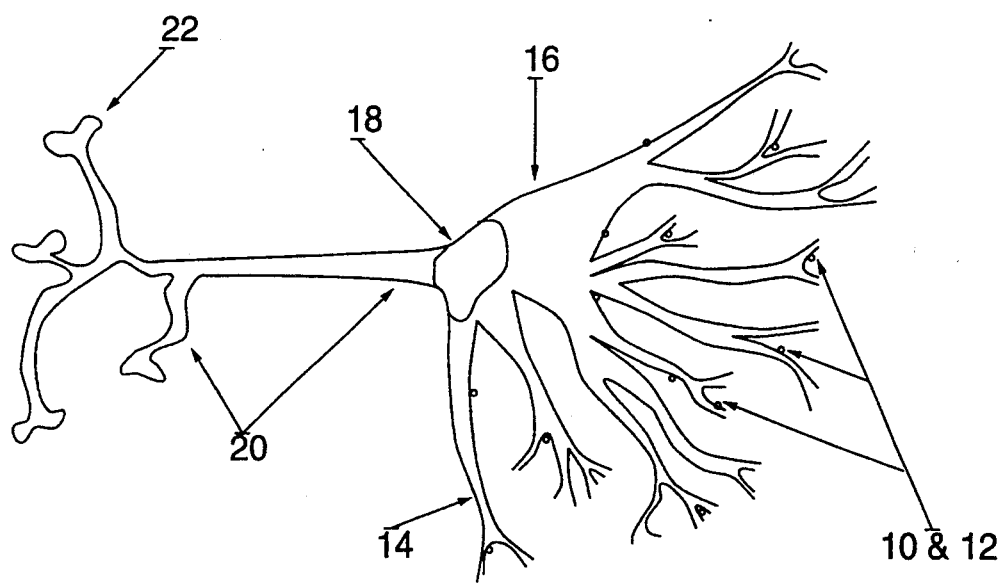
FIG. 2 is an illustration of a typical neuron.

To understand the present invention, it is important to have a firm grasp of the anatomy and electrophysiology of true neurons. FIG. 2 shows the seven regions of interest in the neuron: the excitatory post synaptic region 10; the inhibitory post synaptic region 12; the dendritic tree 14; the cell body (Soma) 16; the action potential initiation zone (Axon Hillock) 18; the axon and collaterals 20; and the presynaptic region 22.

Figure 3:
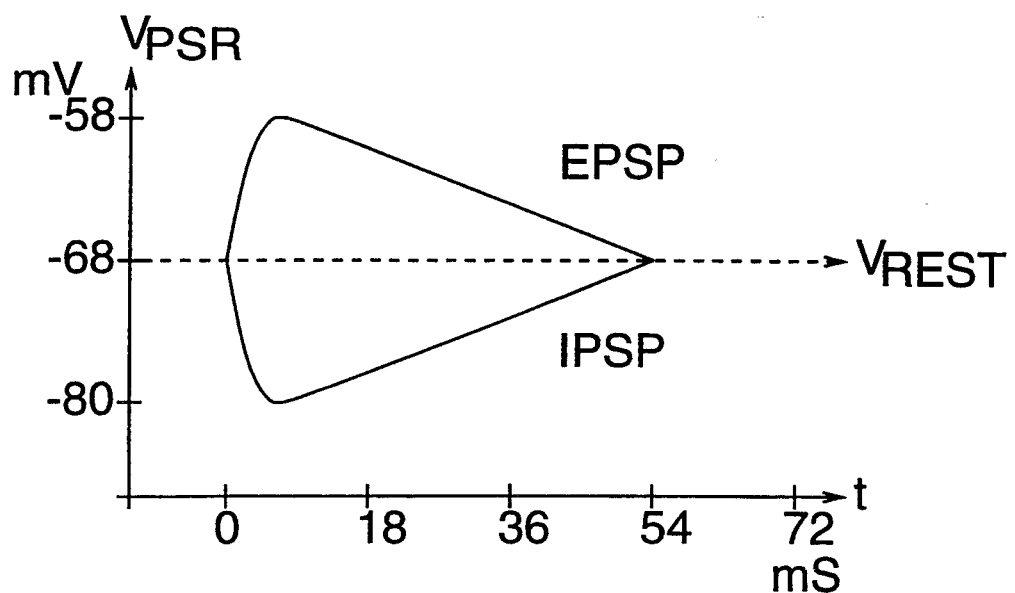
FIG. 3 is a graph of typical waveforms of an excitatory post synaptic potential and an inhibitory post synaptic potential in a typical neuron.
Figure 4:
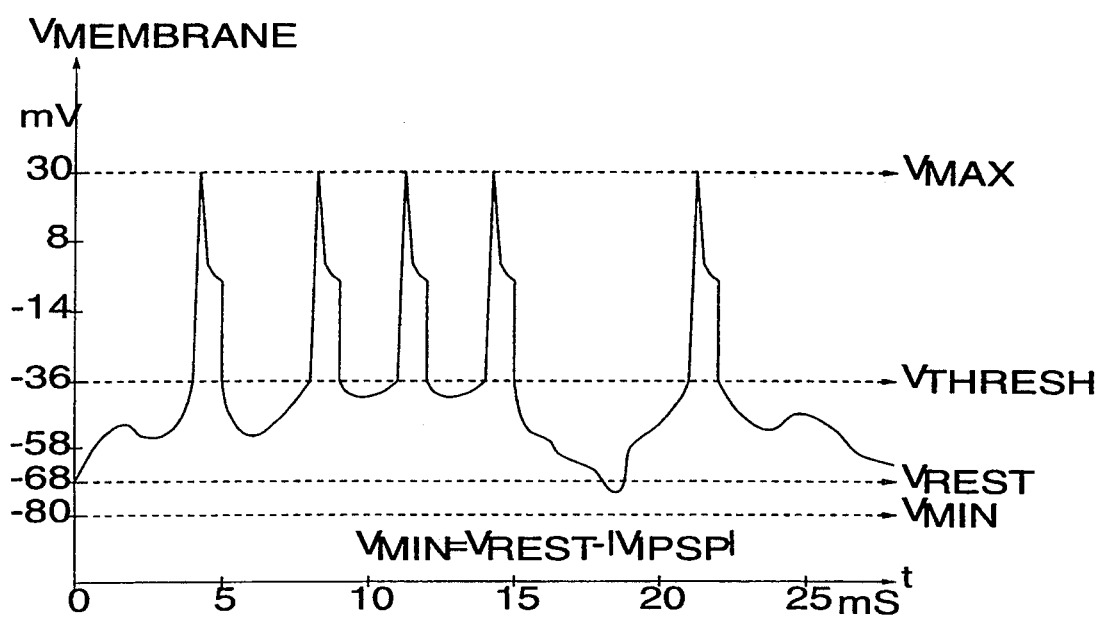
FIG. 4 is a graph of typical spikes generated by the axon hillock of a typical neuron.

Computation within the cell is by weighted convolution of Post Synaptic Potentials (PSPs). FIG. 3 shows both an Excitatory and an Inhibitory PSP, (EPSP and IPSP, respectively). Communication between cells is via: streams of impulse-like Action Potentials (APs). A typical stream of APs can be seen in FIG. 4. Notice the APs ride atop the convolved EPSPs and IPSPs, and are referenced from a threshold voltage. In FIG. 3 and FIG. 4, the voltage and time scales are for biological systems.

The three waveforms (APs, EPSPs, and IPSPs) occur as a result of changes in the conductances of ion channels through the cell membrane. The flow of four ions ($Na^+$, $K^+$, $Cl^-$, and $Ca^{2+}$) into and out of the cell due to these conductance changes causes the membrane to become either hyperpolarized or depolarized. Hyperpolarization occurs when the inside of the cell becomes negative with respect to the outside, whereas depolarization is the movement of the membrane potential towards zero, causing the interior of the cell to become positive with respect to the outside. When the membrane potential of the action potential initiation zone reaches the threshold value in the depolarization region, an AP is fired.

Figure 5:
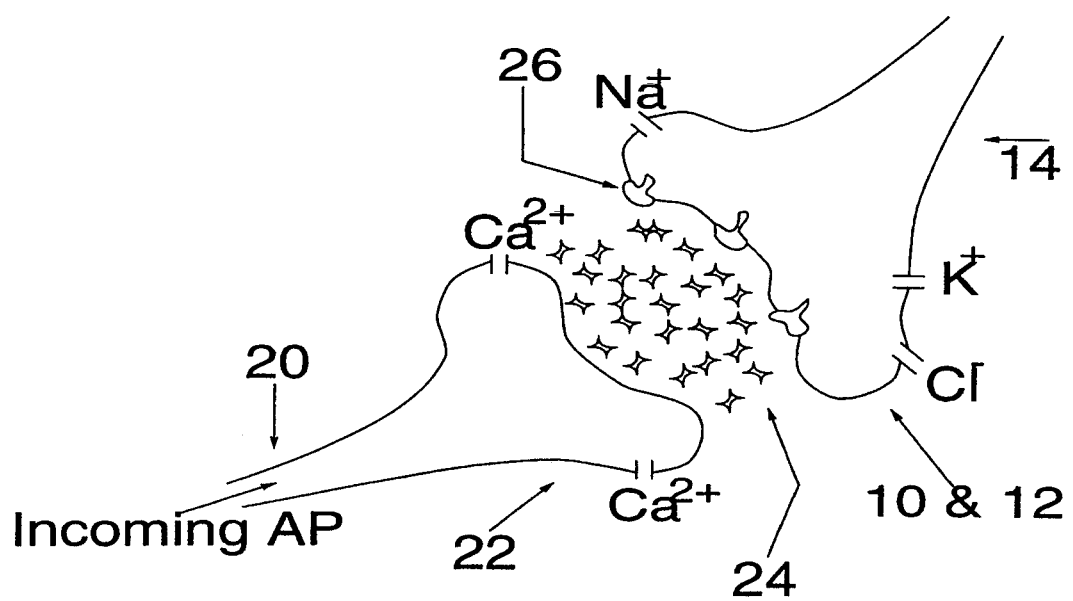
FIG. 5 is an illustration of a typical chemical synapse.

An expanded view of a synapse showing the sodium, potassium, and chlorine channels in the Post Synaptic Region (PSR) and the calcium channels in the presynaptic region can be seen in FIG. 5. The intracellular and extracellular concentrations and membrane permeability of the ions is given in Table 1. Notice that the concentrations of the Na+, Ca²+, and Cl⁻ ions are higher out, side the cell and the K+ ion concentration is higher inside the cell. This concentration gradient is maintained by the ion pump system in the membrane. The values shown in Table 1 are for a cell in the resting state.

In the absence of signals, the post synaptic side of the membrane is at the resting potential, which is the membrane potential at which there is no flow of ions across the membrane, approximately −70 mV, the Nernst potential of chlorine ions. This potential is a function of the equilibrium points of the Na+, K+, and Cl⁻ ions, where equilibrium refers to the balancing of the potential and concentration gradients across the membrane. The resting potential of the membrane can be found using the Goldman or constant field equation $$V_M = 58\log\left(\frac{K_o + (p_{Na}/p_K)Na_o + (p_{Cl}/p_K)Cl_i}{K_i + (p_{Na}/p_K)Na_i + (p_{Cl}/p_K)Cl_o}\right) \quad (1)$$

where
$K_o$, $Na_o$, and $Cl_o$ refer to the ion concentrations outside of cell,
$K_i$, $Na_i$, and $Cl_i$ refer to the ion concentrations inside the cell,
$p_K$, $p_{Na}$, and $p_{Cl}$ refer to the membrane permeability of the ions.

Using the values from Table 1 and Equation 1 gives a resting membrane potential of −68.0 mV. The maximum membrane potential occurs when an action potential has been fired. This potential can also be calculated using Equation 1 and Table 1 ($V_{MAX}=30$ mV). Notice the only parameter that changes in Equation 1 is the membrane permeability of sodium, which is five hundred times larger during the generation of an AP. Note: these values given in Table 1 are only approximations and the values are not constant. Measured values show the maximum membrane potential during an AP to be approximately 50 to 60 mV.

As an AP enters the presynaptic region from an axon collateral it causes the conductance of the Ca²+ channels to increase, allowing calcium ions to flow into the presynaptic terminal, due to the potential gradient across the presynaptic region membrane and the concentration gradient of calcium. The amount of calcium influx determines the neurotransmitter released at the junction.

TABLE 1

| | Ion Concentrations and Membrane Permeabilities | | | |
|---|---|---|---|---|
| | Ion Concentration | | Membrane Permeability | |
| | Extracellular | Intracellular | Rest | AP |
| Na+ | 117 | 30 | 0.03 | 15 |
| K+ | 3 | 90 | 1 | 1 |
| Ca²+ | 10 | 0.3E−6 | 0 | 0 |
| Cl⁻ | 120 | 4 | 0.1 | 0.1 |
| | mM | | Relative to K+ | |

Neurotransmitter receptors on the PSR side of the junction receive the chemical signal from the presynaptic region. The bonding of a neurotransmitter and a receptor causes the receptor to induce a chemical reaction which alters the conductance of the ion channels. If the particular PSR is excitatory the receptors open the Na+ channels allowing sodium ions to flow into the PSR in response to the concentration gradient. This positive ionic current flow causes a change in the membrane potential of the PSR in the form of an EPSP. In an inhibitory PSR the receptors open the K+ channels allowing an outflux of potassium ions in response to the concentration gradient, which results in an IPSP. The PSP travels along the dendrite.

A dendrite can be thought of as a lossy transmission line, which delays and attenuates the PSP. Each segment of the dendrite has its own characteristic impedance. The dendrites join together to form the dendritic tree. The convolution of the PSPs is performed at the nodes of the tree as the signals propagate towards the soma. The direction of current flow is due to the thickenning of the dendrite as it approaches the soma, which lowers its RC time constant. The convolved signal representing the activity of the entire dendritic tree enters the cell body, causing the membrane to become either depolarized or hyperpolarized.

The action potential initiation zone monitors the soma potential to determine the state of the cell. If the cell membrane becomes depolarized to the threshold voltage, the sodium channels in the hillock open completely, causing a high influx of Na+ ions. This inward surge of positive ions pulls the membrane potential towards the Nernst potential for sodium, approximately +80 mV, generating the rising edge of an AP. At this point the potassium channels open, which prevents the membrane potential from reaching damaging levels. The K+ ions are pushed out of the cell by both the potential and concentration gradients, thus causing the falling edge of the AP. There is a minimum period of time needed for the cell to recover from the generation of an AP, called the refractory period. If the soma potential remains above the threshold value for this refractory period, another AP is fired. The length of the refractory period is inversely proportional to the soma activity. The AP streams move along the lossless axon and collaterals to the presynaptic regions on the dendritic trees of neighboring cells.

The number of ions transported across the membrane in the generation of an AP is minute with respect to the total number of ions in and around the cell, therefore the concentration ratios and thus the behavior of the cell remain unchanged after each AP firing.

As an AP enters the presynaptic region from an axon collateral it causes the conductance of the Ca²+ channels in the cell membrane to increase, allowing calcium ions to flow into the presynaptic terminal, due to the potential gradient across the presynaptic region membrane and the concentration gradient of calcium. The amount of calcium influx determines the neurotransmitter released at the junction. Neurotransmitter receptors on the post synaptic side of the junction receive the chemical signal from the presynaptic region. The bonding of a neurotransmitter and a receptor causes the receptor to induce a chemical reaction which alters the conductance of the ion channels. If the particular post synaptic region is excitatory, the receptors open the Na+ channels allowing sodium ions to flow into the post synaptic region in response to the concentration gradient. This positive ionic current flow causes a change in the membrane Potential of the post synaptic region in the form of an Excitatory Post Synaptic Potential (EPSP). In an inhibitory synapse the receptors open the K+ channels allowing an outflux of potassium ions in response to the concentration gradient, which results in an Inhibitory Post Synaptic Potential (IPSP).

Processing Element Simulation of Neuron Electrophysiology

Since electronic current in VLSI circuitry operates much faster than ionic current in neurons, the timing in the present invention has been linearly scaled to take advantage of this speed while maintaining the relative shapes and timing of the signals. VLSI circuitry is much more reliable when it operates in the saturation region than when it operates in the subthreshold region; therefore the voltage scale has also been scaled from the millivolt range of neural signals to the volt range of saturated MOS devices. The operating range of a typical neuron is roughly $-80$ mV, just below the Nernst potential for K+ ions, to roughly $+60$ mV, just above the Nernst potential of Na+ions. This range has been scaled linearly to the 0→5 volt range of the MOS devices. This maps the resting potential of approximately $-60$ mV to 1 volt and the typical threshold voltage of $-40$ mV to 1.7 volts. The operating range for temporal relations in neurons, which is in the ms range, has also been scaled to the ns range of the VLSI devices (approximately 1 ms per 10 ns in the present current PE).

Figure 6:
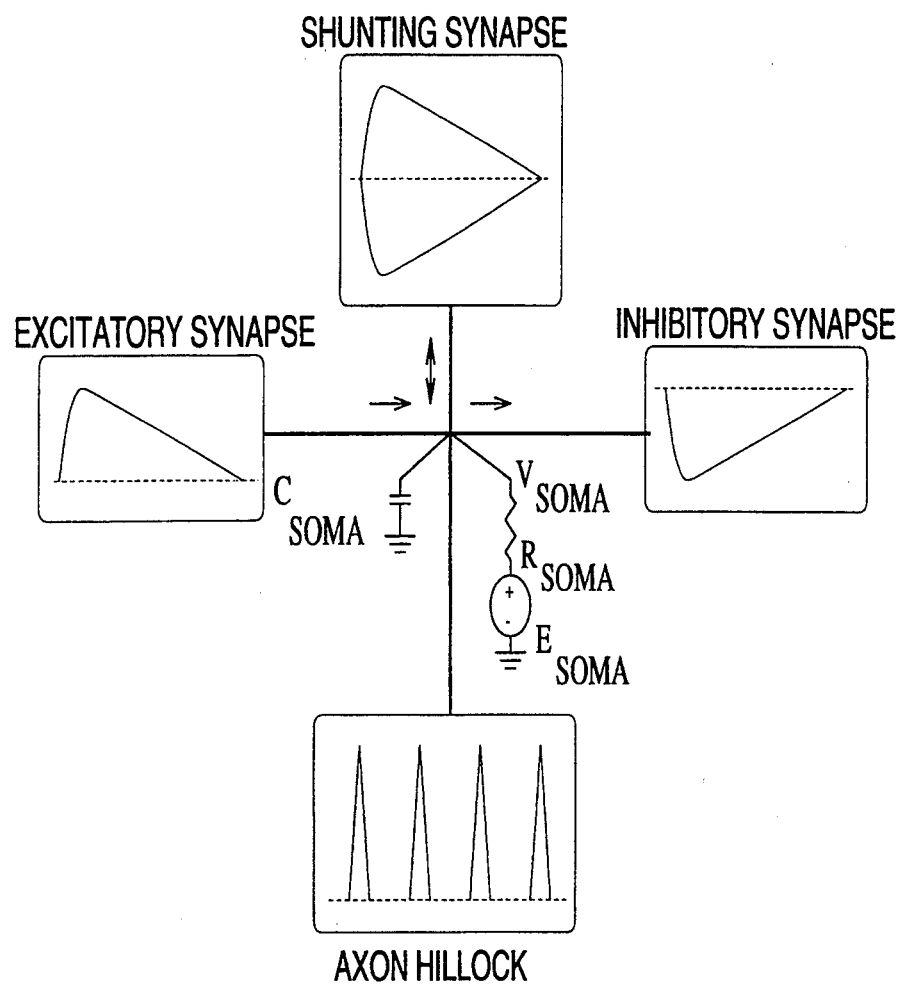
FIG. 6 is a functional diagram of the processing element of the present invention.

FIG. 6 shows a functional diagram of the PE of the present invention. Three types of chemical synapse models provide a current to or draw current from a summing node referred to as the soma (cell body) in response to an Action Potential (AP) at their input. These currents are time-varying waveforms and are referred to as Post Synaptic Potentials (PSPs). Excitatory PSPs (EPSPs) provide current to the soma, Inhibitory PSPs (IPSPs) draw current from the soma, and Shunting PSPs (SPSPs) maintain the cell at the resting potential and can either supply or draw current depending on the current state of the soma. EPSPs, IPSPs, and SPSPs are produced by excitatory, inhibitory, and shunting synapse circuitry, respectively. There are three adjustable parameters of the PSPs: amplitude, time-duration, and delay, which are controlled with DC bias voltages.

The soma node is modeled as a Resistive/Capacitive (RC) network with a membrane resting potential source (see FIG. 6). The time constant of the RC network sets the upper bound on the analog computation rate of a given PE. The processing speed of a PE is determined by the DC biases of that PE.

The soma activity is monitored by the axon hillock which generates AP streams that convey the current state of the PE. These AP streams feed to the synapses of neighboring PEs and possibly to synapses connected to the PE's own soma node. The hillock is a thresholding device with a hard threshold below which the output is inactive. Above the hard threshold is a time-dependent threshold region, where the delay before AP generation is proportional to the exceedance of the hard threshold. In this region the PE output frequency is a function of the soma voltage level, i.e., the hillock functions as a nonlinear Voltage-Controlled Oscillator (VCO). As the delay is reduced to its lower limit, which is the minimum propagation delay through the hillock circuitry, the input activity approaches the instantaneous threshold level (roughly one volt above the hard threshold). There are also three adjustable parameters of the axon hillock behavior: threshold/delay level, AP pulsewidth, and the separation between APs ( the "refractory period").

In both the synapses and axon hillock, the parameter variations with respect to the DC biases are very nonlinear, and offer an extremely wide dynamic range of behavior. Table 2 summarizes the dynamic range of the bias/parameter relationships of the complete PE. The Bias/Parameter relationships are very nonlinear, but offer a wide range of behavior. Practical infinity represents a duration long enough to be considered infinite with respect to the processing speed of the system.

Figure 7:
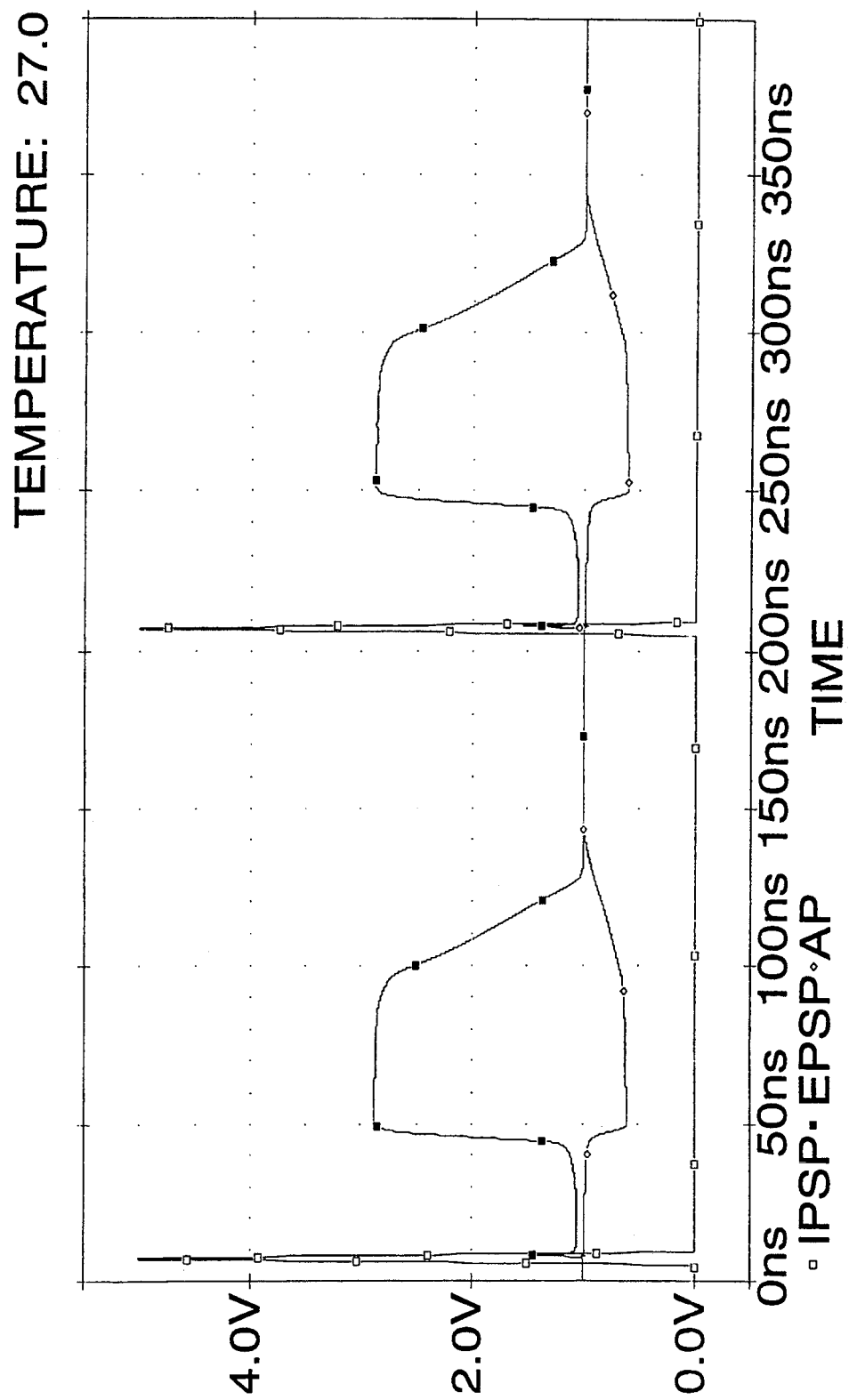
FIG. 7 is a graph of a simulation of the output generated by the processing element by simultaneously firing a shunting synapse and excitatory synapse on one node and a shunting synapse and inhibitory synapse on another node.
Figure 8:
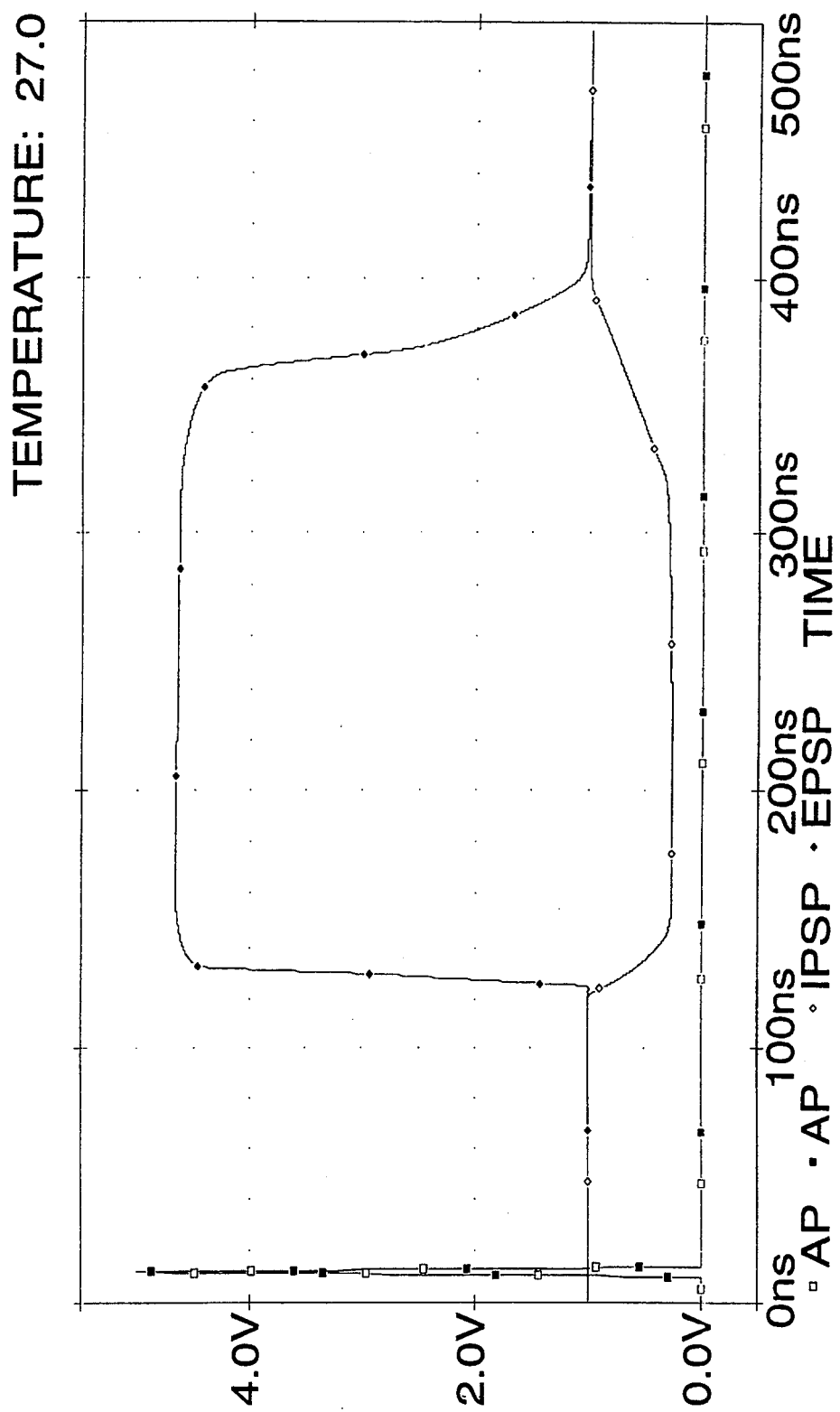
FIG. 8 is a graph of a simulation of the output generated by a processing element having a shunting synapse and excitatory and inhibitory synapses with built-in delay.
Figure 9A:
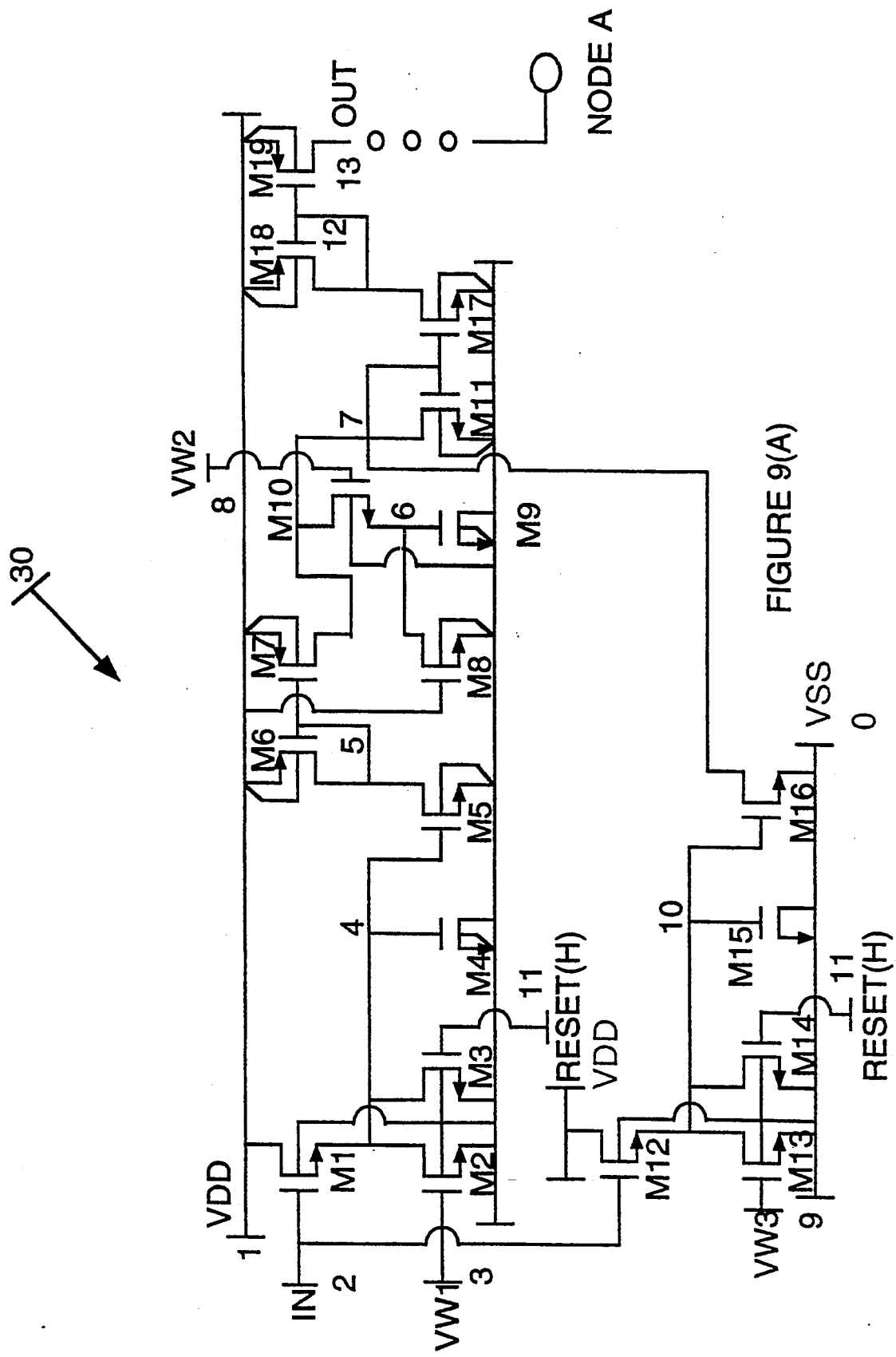
FIG. 9 is a schematic of the preferred processing element of the present invention.
Figure 9B:
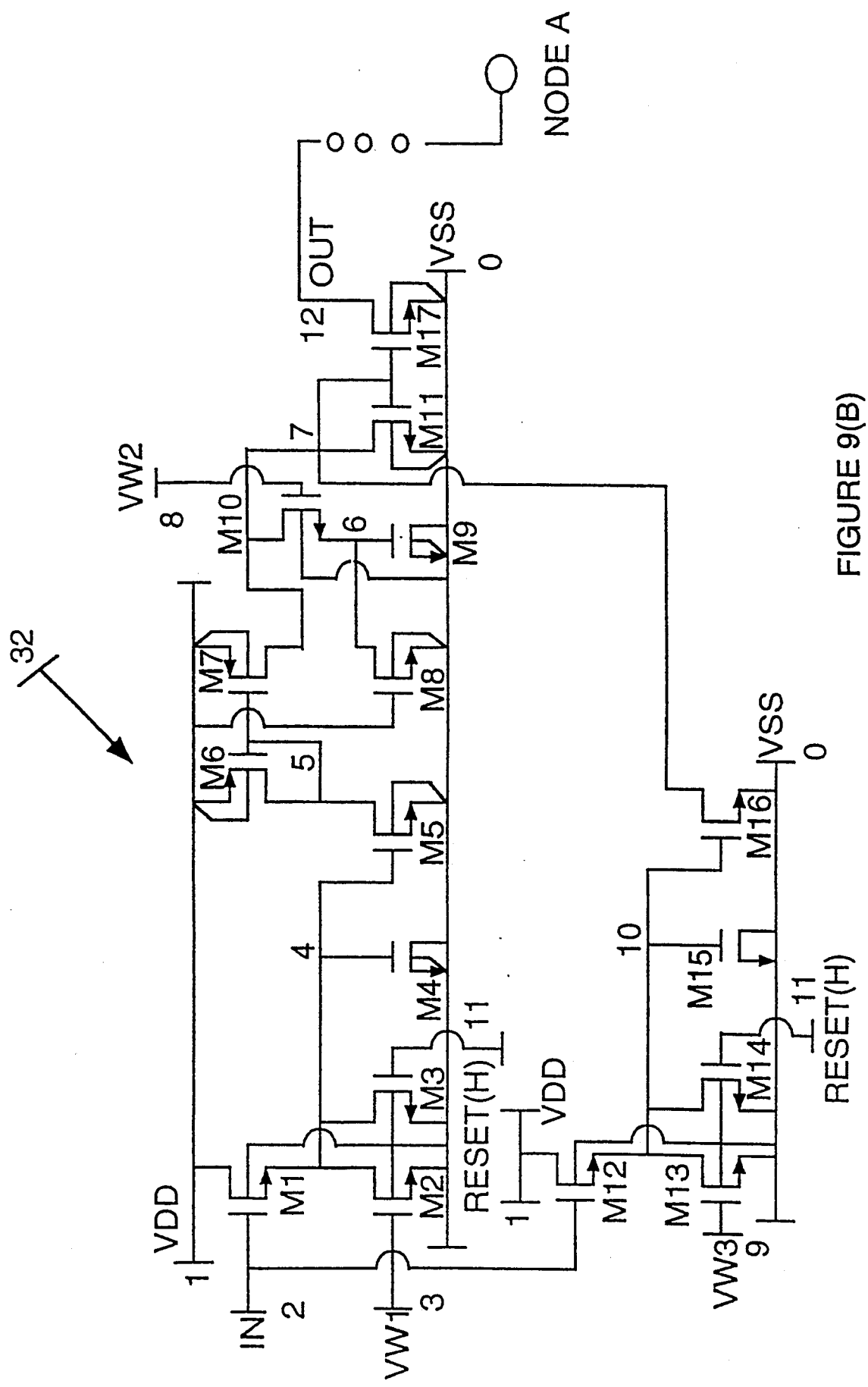
Figure 9C:
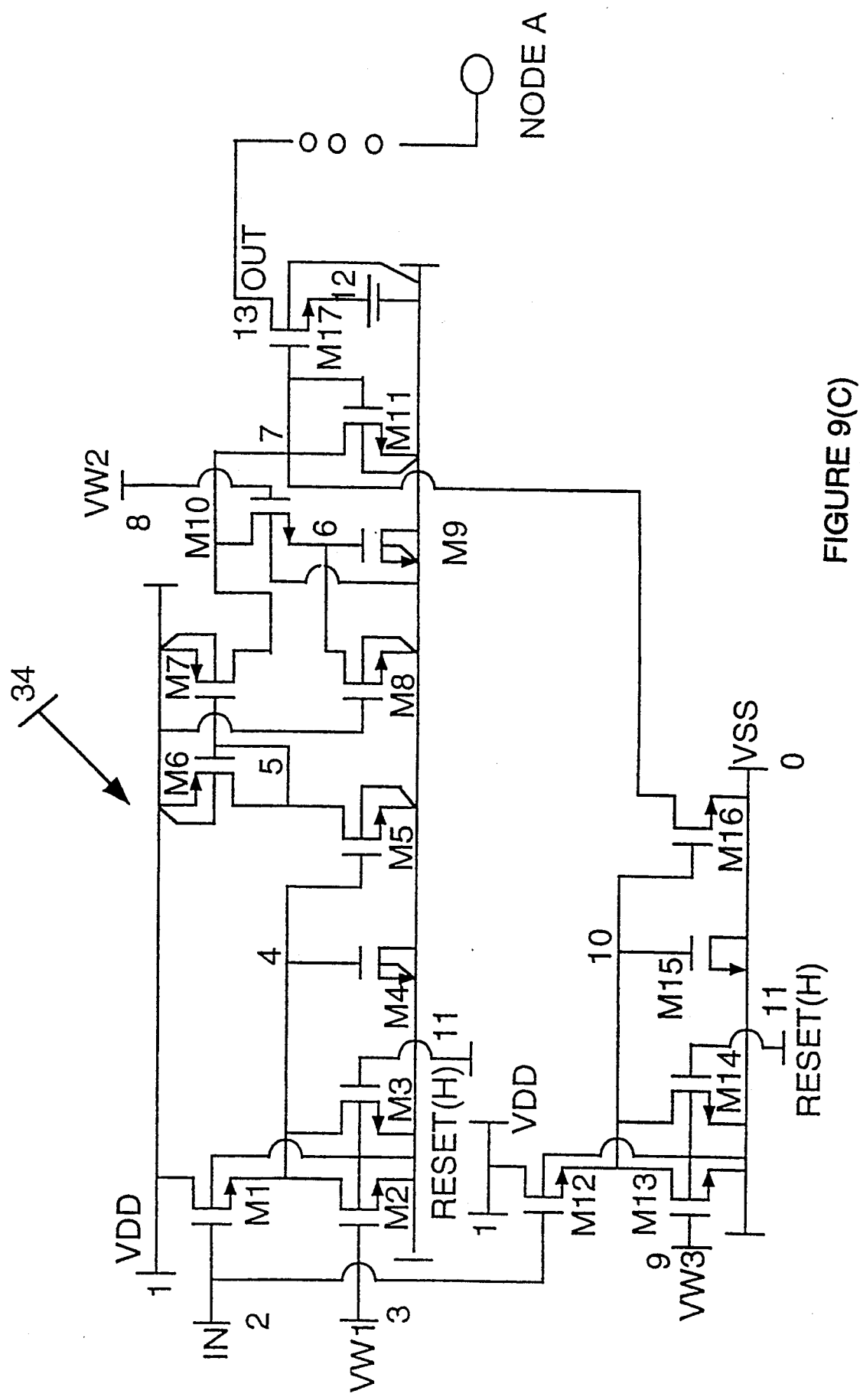
Figure 9D:
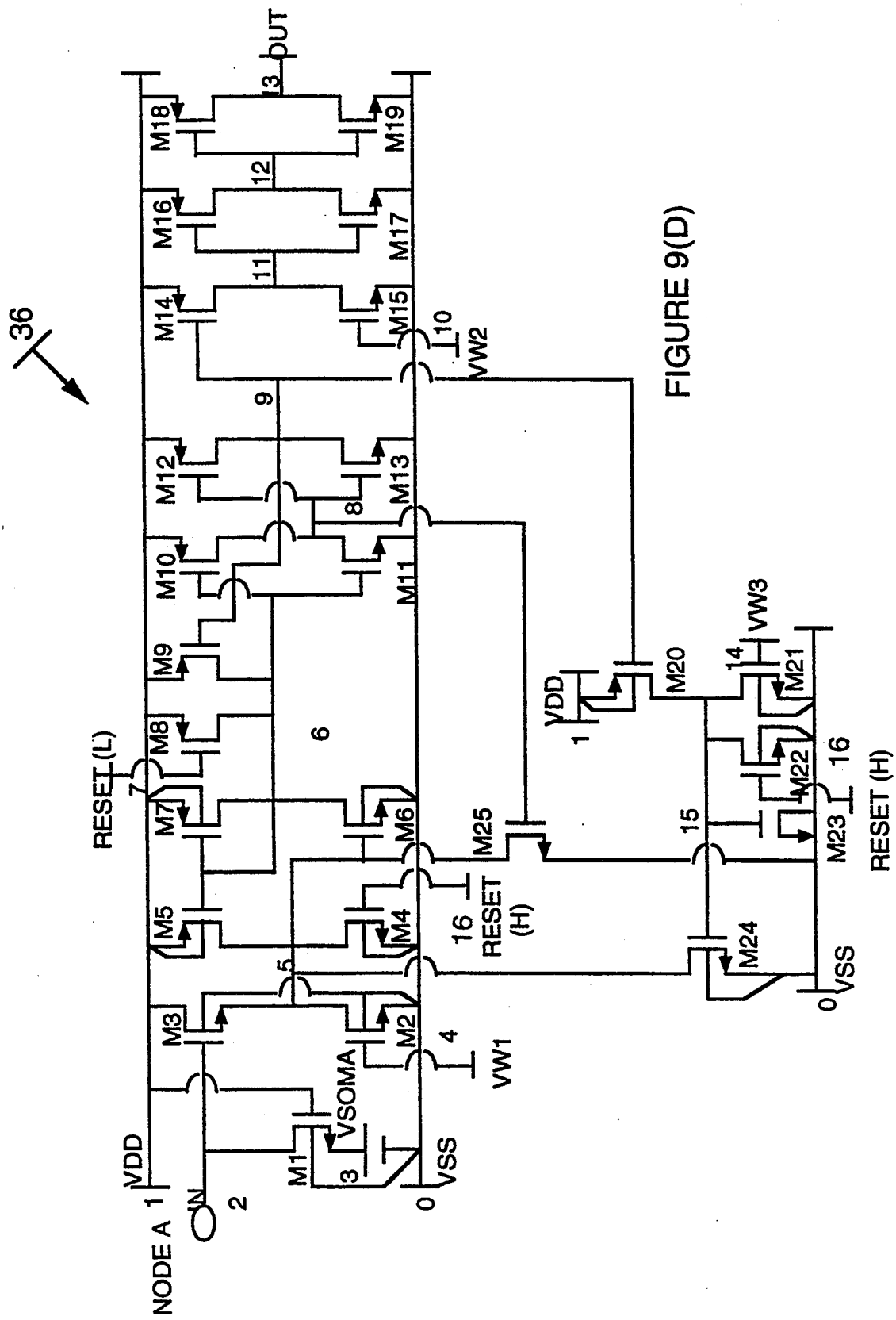

FIGS. 7 and 8 illustrate typical APs, EPSPs, IPSPs, and SPSPs produced by the PE of the present invention. FIG. 7 is the output generated by simultaneously firing a shunting synapse with an excitatory synapse on one node and a shunting synapse and an inhibitory synapse on a separate node. The resulting behavior appears as a delay in the generation of the EPSP and IPSP with respect to the AP arrival. In reality the EPSP, IPSP, and SPSP are all generated at the same time, almost immediately as the AP arrives. The shunting synapse holds the soma at the soma resting potential for its duration, and therefore appears as a delay rather than an explicit waveform. FIG. 8 is the I/O response of excitatory and inhibitory synapses with built in delay mechanisms. From FIGS. 7 and 8 it can be seen that the shunting synapse is useful if an induced delay is needed on an entire node; the delayed excitatory and inhibitory synapses are useful when a particular synaptic output is to be delayed.

One additional feature of the PE is an asynchronous reset capability. This

TABLE 2

| Summary of PE Bias/Parameter Relationships | | |
|---|---|---|
| Parameter | Bias (V) | Range |
| Synapse Bias/Parameter Behavior Range | | |
| Amplitude | 0 → 5 | EPSP 4 → 0 V<br>IPSP -1 → 0 V<br>SPSP N/A |
| Duration | 0 → 5 | practical ∞ → 0 ns |
| Delay | 0 → 5 | practical ∞ → 0 ns |
| Axon Hillock Bias/Parameter Behavior Range | | |
| Threshold/Delay | 0 → 5 | Delay 0 → practical ∞ ns<br>Hard Thresh 1 → 5+ V |
| Pulsewidth | 0 → 5 | 2 ns → practical ∞ |
| Refractory Period | 0 → 5 | practical ∞ → 0 ns | is motivated by the need for an instantaneous return to the initial conditions of the PE. While the reset feature is not a biologically accurate mechanism, it has been found to be useful in a variety of the systems that have been developed and will be discussed in the Examples section.

Early versions of the processing element are described in the following publications, which are incorporated by reference herein:

1. M. DeYong, R. Findley, and C. Fields (May 1992). The design, fabrication, and test of a new hybrid analog-digital neural processing element. IEEE Transactions on Neural Networks, Vol. 3, No. 3, pp. 363-374.
2. M. DeYong, and C. Fields (May 1992). Applications of hybrid analog-digital neural networks in signal processing. Proc. IEEE International Symposium on Circuits and Systems, San Diego, Calif. Vol. 5, pp. 2212-2215.

3. M. DeYong, R. Findley, and C. Fields (1990). Computing with fast modulation: experiments with biologically-realistic model neurons. Proc. Fifth Rocky Mountain Conf. on AI, Las Cruces, N. Mex., pp. 111-116.
4. C. Fields, M. DeYong, and R. Findley (1992). Computational capabilities of biologically realistic analog processing elements. In: J. Delgado-Frias, ed., *VLSI for Artificial Intelligence and Neural Networks*. New York: Plenum, pp. 175-183.
5. R. Findley, M. DeYong, and C. Fields (1990). High speed analog computation via VLSI implementable neural networks. Proc. Third Microelectronic Education Conference and Exposition, San Jose, Calif., pp. 113-123.
6. M. DeYong (1991). A VLSI implementation of a biologically realistic axon hillock. Master of Science Thesis, New Mexico State University, Electrical Engineering Department.
7. R. Findley (1991). The design and VLSI implementation of a biologically realistic chemical synapse. Master of Science Thesis, New Mexico State University, Electrical Engineering Department.

Schematic

FIG. 9 shows a schematic diagram of the processing element depicted in FIG. 6. The PE is comprised of excitatory synapse circuit 30, a inhibitory synapse circuit 32, a shunting synapse circuit 34, and the axon hillock and soma 36. In the axon hillock schematic 36 the soma resistance is represented by transistor M1 and the soma capacitance is represented by the parasitic capacitance of all devices connected to the soma node and is therefore minimal. The schematic diagram depicted in FIG. 9 comprises a complete processing element. In Example 14, first order integral node equations describing the dynamics of the PE of FIG. 9 are presented. Also included in Example 14 are the input files needed to simulate the excitatory synapse, inhibitory synapse, shunting synapse, and axon hillock using the Simulation Package with Integrated Circuit Emphasis (SPICE) circuit simulation package, available from MicroSim. Included in the input files are model statements defining the standard n-well 2-poly CMOS VLSI process.

A general neural network derived from the PE is a network where any PE output in the network can be input to any other PE in the network, inclusively. All systems illustrated in the Examples section are specific instances of the general network.

Description of Simulations

Figure 10:
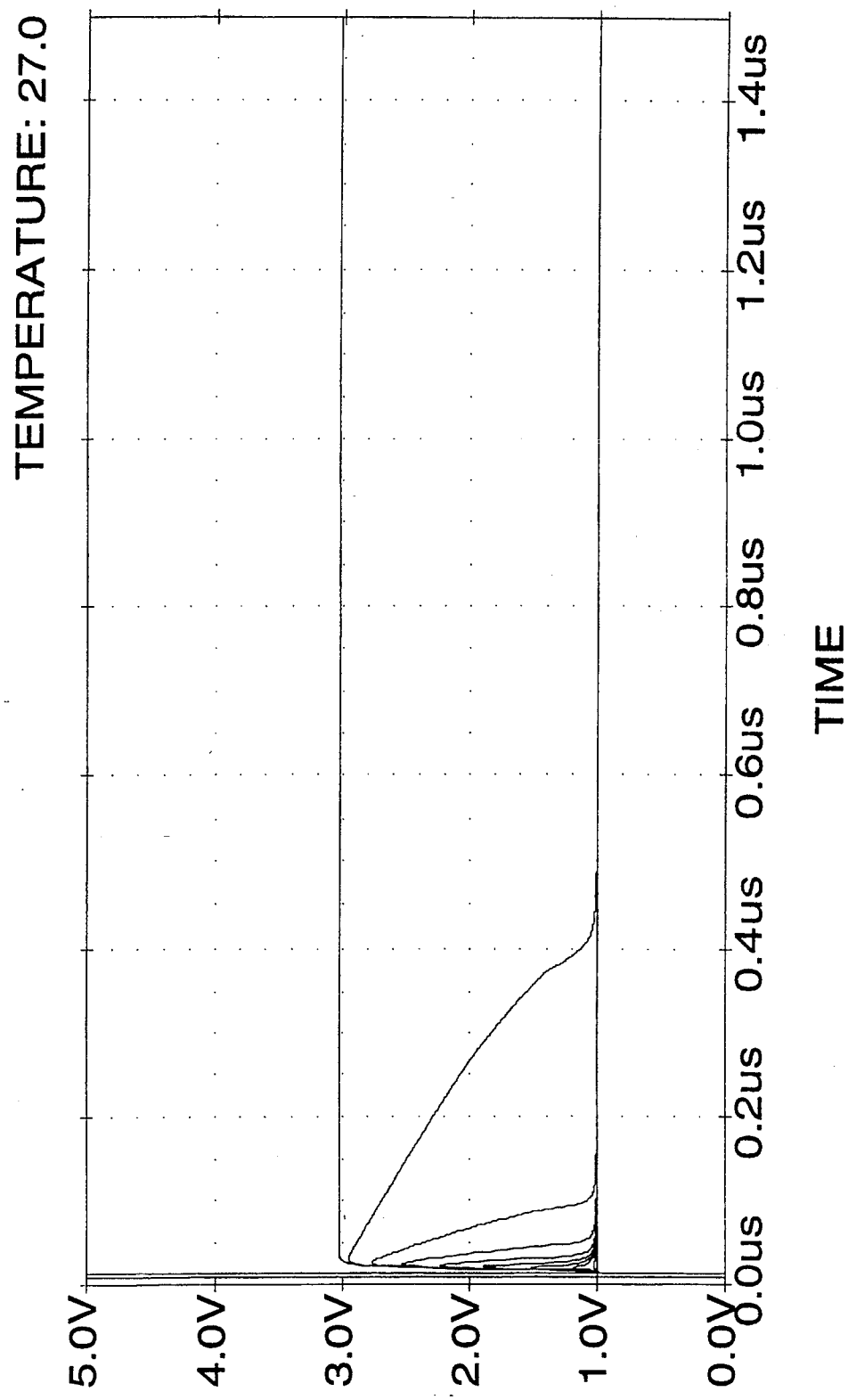
FIG. 10 is a graph of a simulation of excitatory post synoptic potentials generated by the processing element.

FIG. 10 shows the response of an excitatory synapse 30 to variations in Vw1. Vw1 takes values from 0 to 5 volts. Duration changes from infinity to zero. During the simulations, one bias is modified while the others are held constant.

Figure 11:
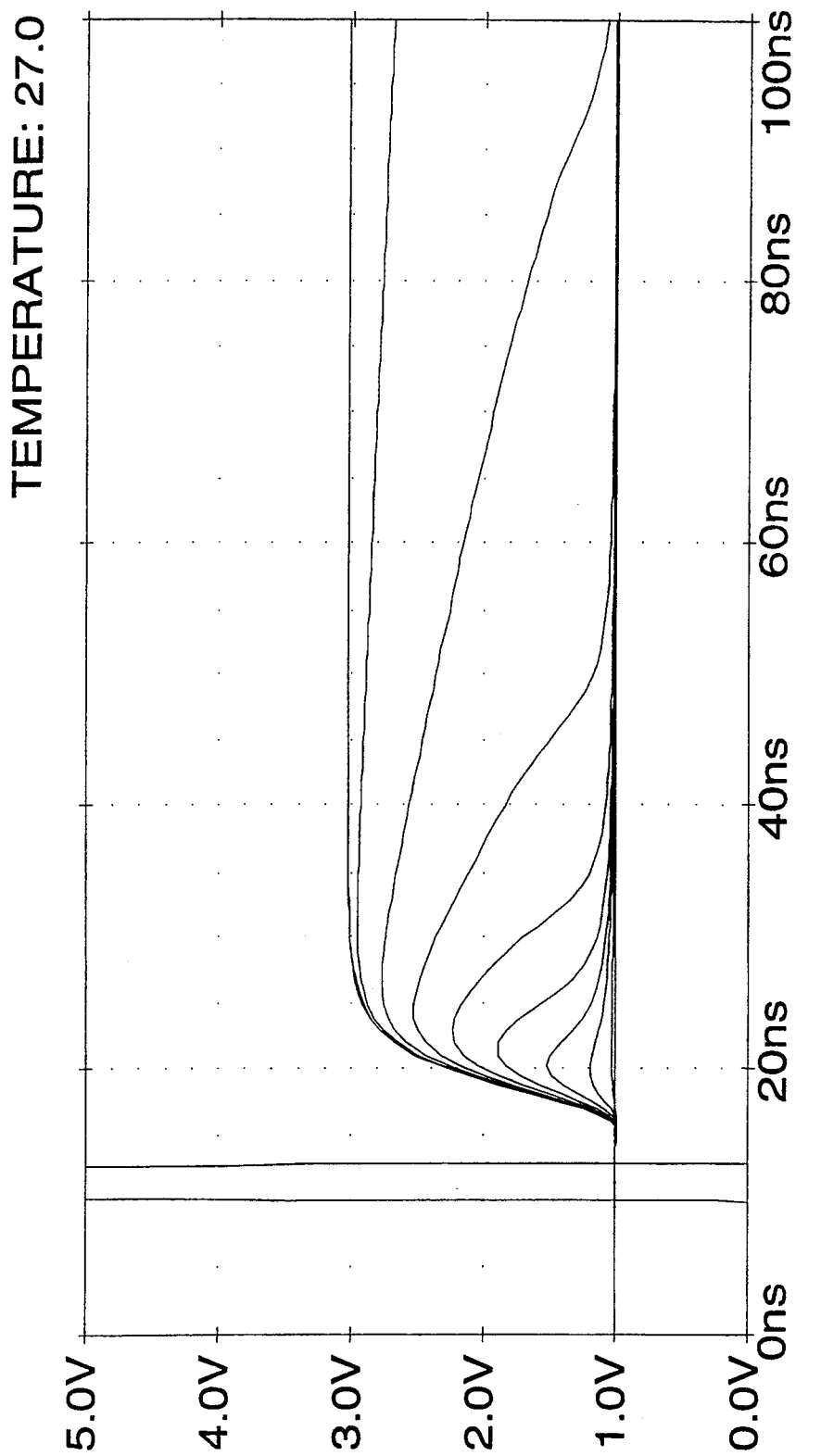
FIG. 11 is a graph of a simulation of excitatory post synaptic potentials generated by the processing element.

FIG. 11 shows an expanded view of the smallest rate-of-change area plotted in FIG. 10.

Figure 12:
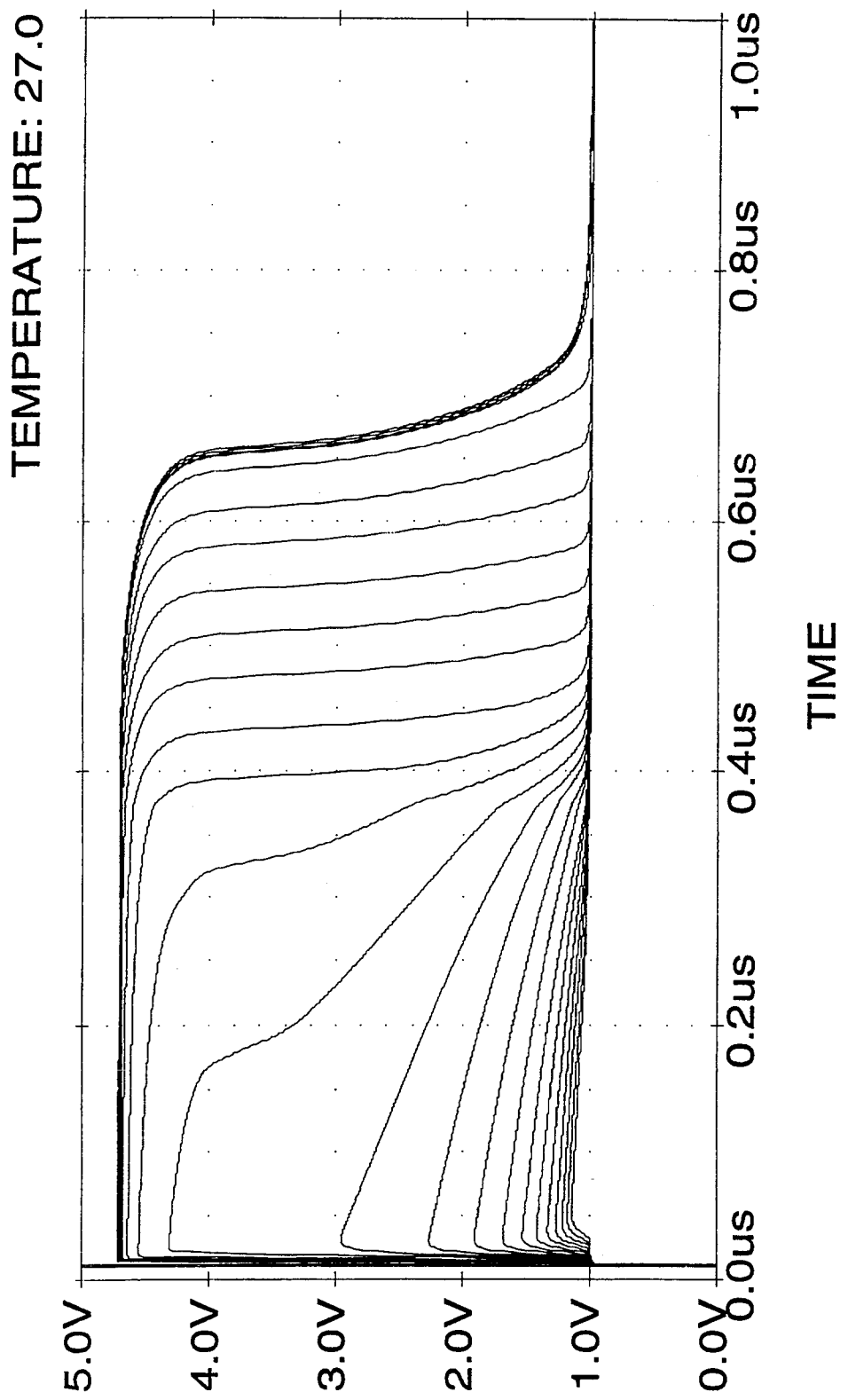
FIG. 12 is a graph of a simulation of excitatory post synaptic potentials generated by the processing element.

FIG. 12 shows the response of an excitatory synapse 30 to variations in Vw2. Vw2 takes values from 0 to 5 volts. Amplitude varies from approximately 5 to 0 volts.

Figure 13:
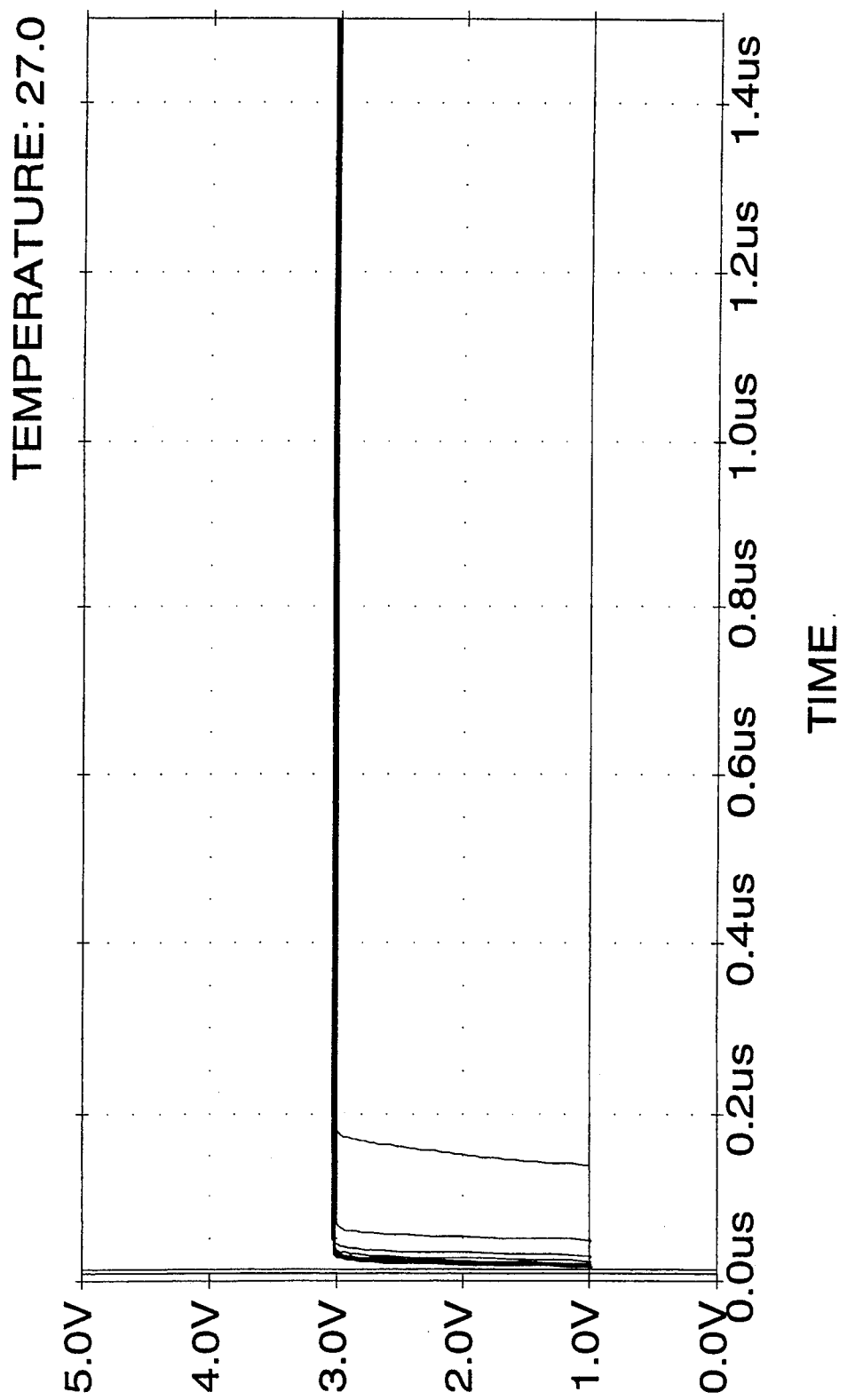
FIG. 13 is a graph of a simulation of excitatory post synaptic potentials generated by the processing element.

FIG. 13 shows the response of an excitatory synapse 30 to variations in Vw3. Vw3 takes values from 0 to 5 volts. Delay varies from approximately infinity to 1ns.

Figure 14:
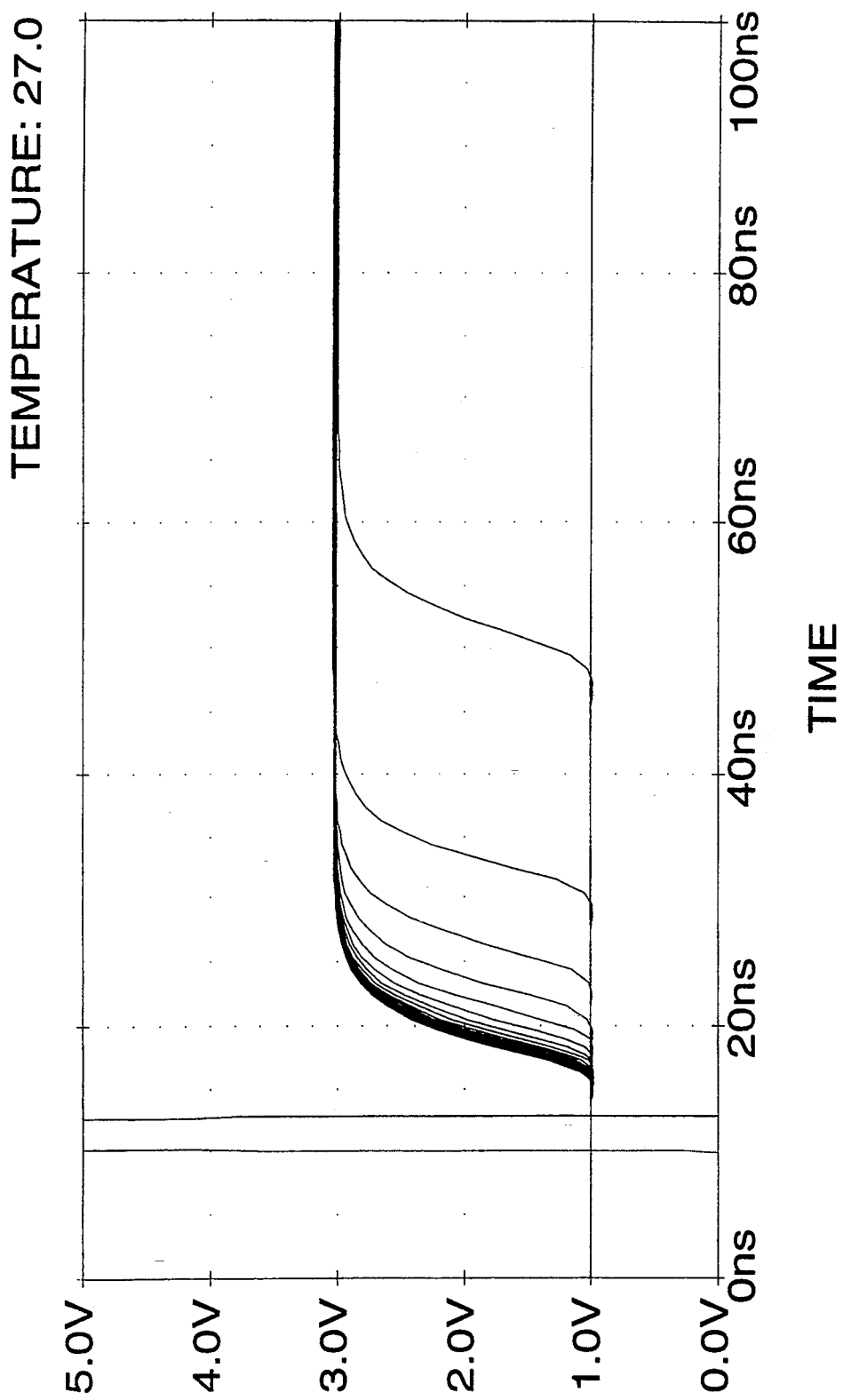
FIG. 14 is a graph of a simulation of excitatory post synaptic potentials generated by the processing element.

FIG. 14 shows an expanded view of the smallest rate-of-change area, plotted in FIG. 13.

Adaptation Module

The adaptation modules either increase, decrease or shunt a particular bias a delta amount in response to an input AP. These input APs can originate from any point in the network; connections from neighboring PEs as well as from the output of the PE to which the adaptation module is attached.

The delta bias change produced by an AP entering the adaptation module will have a different effect depending on where the bias is currently located on the bias/parameter nonlinearity. The module adjusts the effect of each incoming AP by modeling the bias/parameter nonlinearity and using negative feedback to either increase or decrease the effect of the individual incoming APs.

Figure 15:
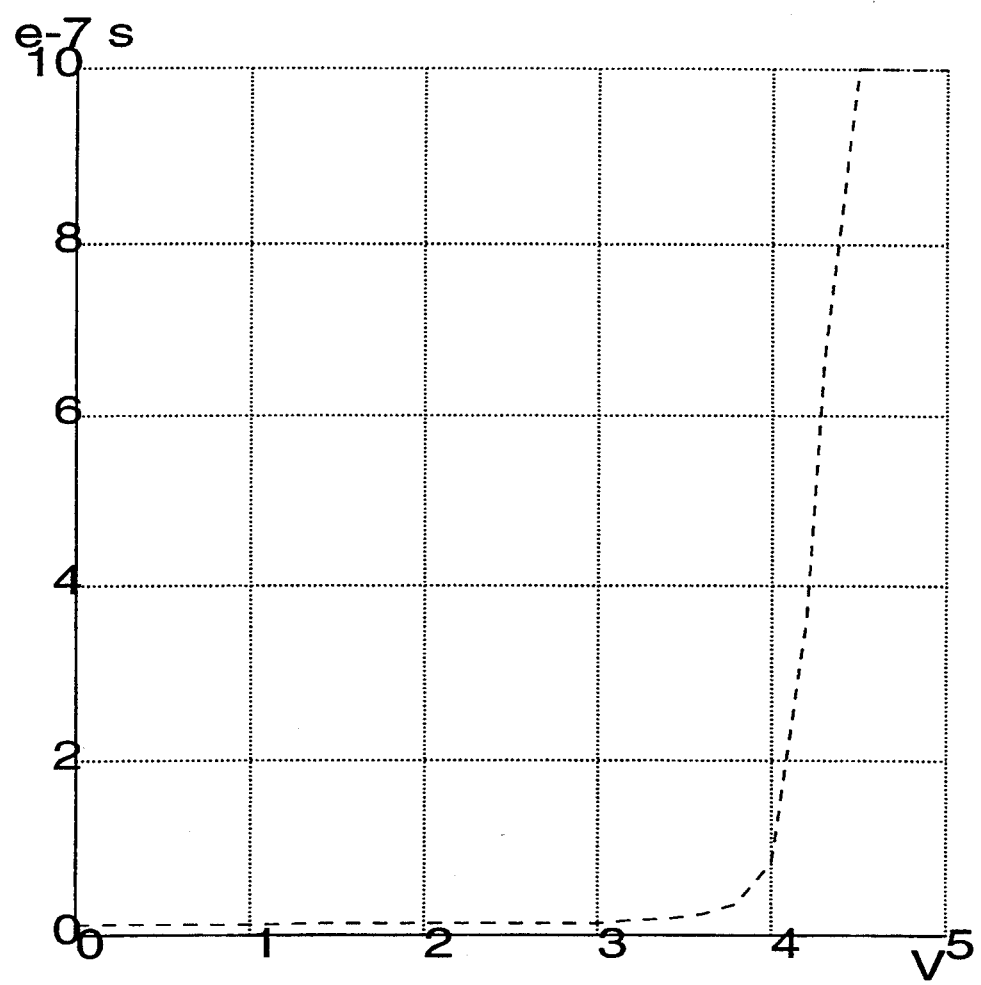
FIG. 15 is a graph of the typical non-linearity representing the relationship between a DC bias voltage and the preferred processing element parameter it controls.

FIG. 15 shows the typical nonlinear relationship between the DC biases and the parameters they control. This nonlinearity is characteristic of a single MOSFET transistor.

Schematics

Figure 16:
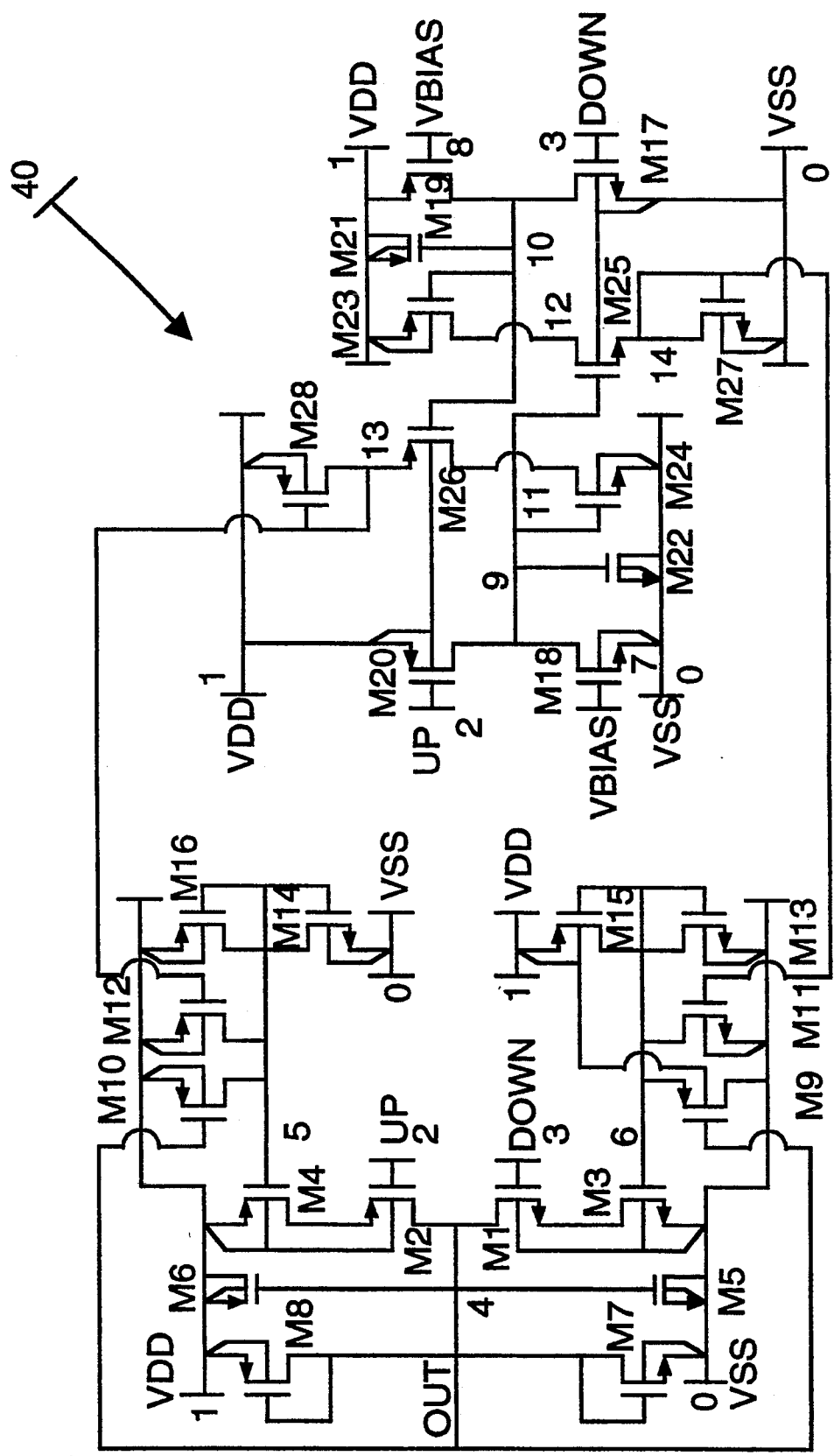
FIG. 16 is a schematic of three adaptation networks of the present invention.
Figure 16:
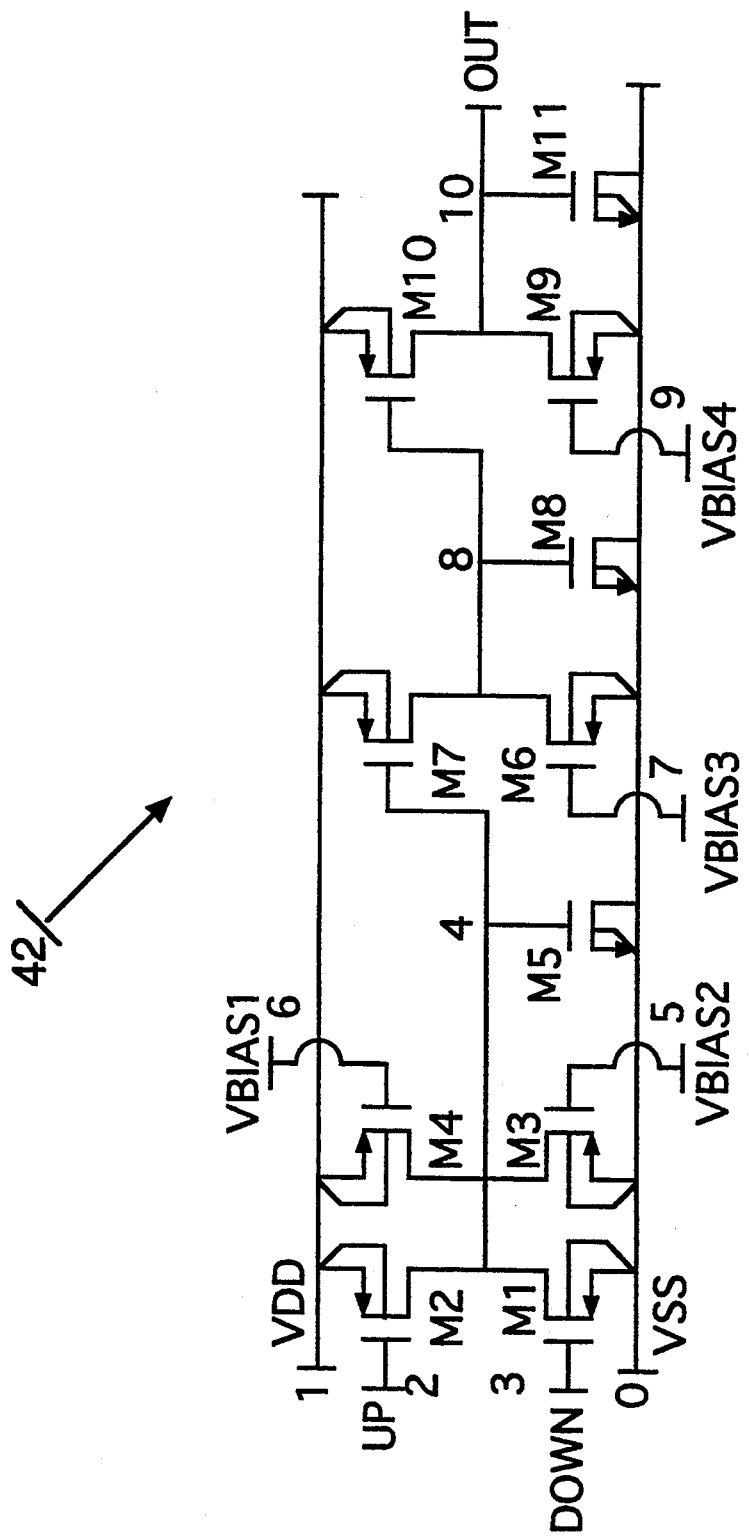
Figure 16:
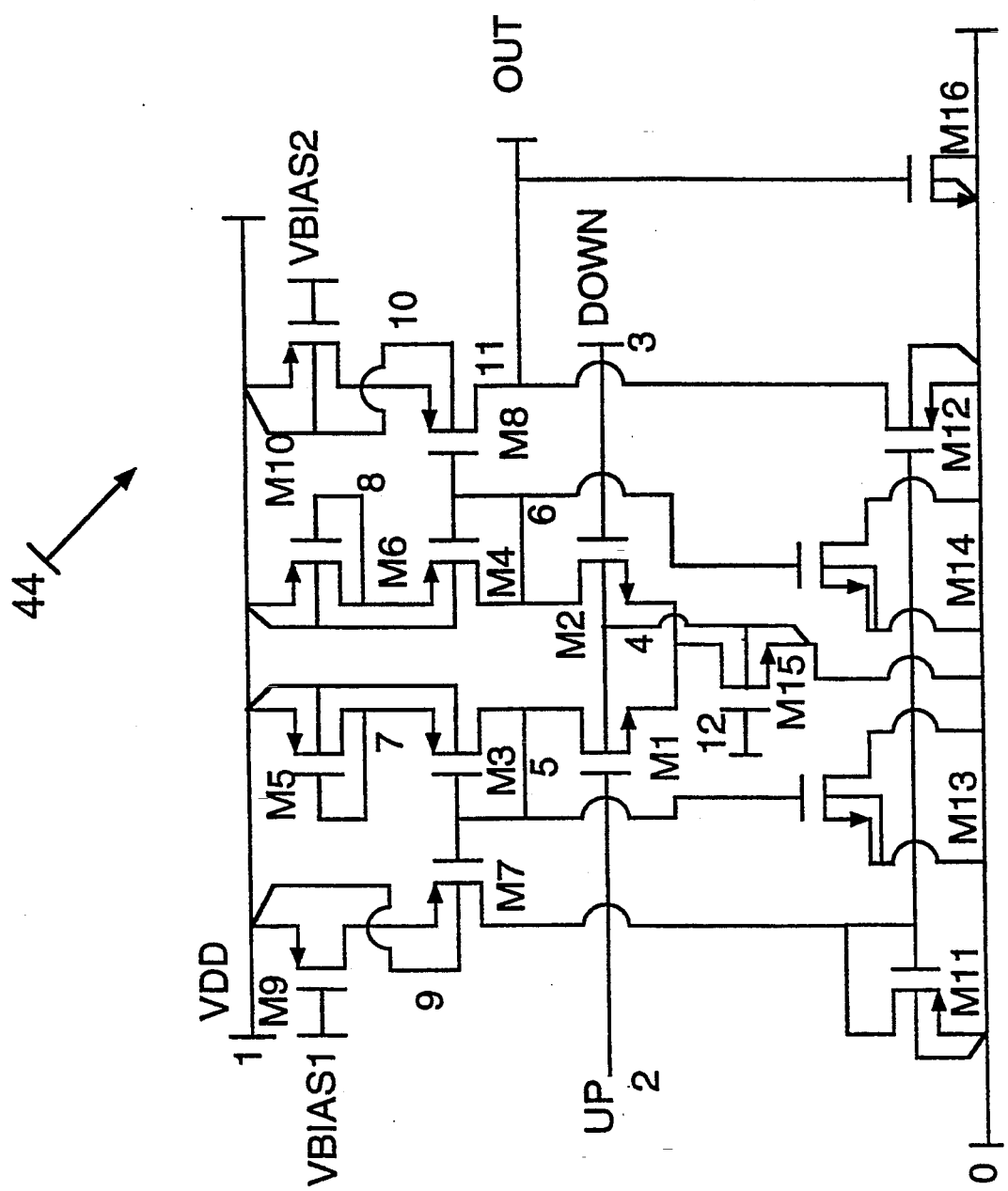

FIG. 16 shows schematic diagrams for three implementations of adaptation modules useful in conjunction with the PE of the present invention. Adaptation module 40 contains nonlinearity compensation and oscillation compensation feedback circuitry. Adaptation module 42 has feedforward circuitry for adjusting the range and rate of adaptation. Adaptation module 44 contains differential amplifier circuitry used to amplify differences between module inputs. All adaptation modules may contain reset circuitry that returns the module to a resting state (i.e., shunting behavior). All adaptation modules may also contain a plurality of up, down, and reset inputs.

Simulations

Figure 17:
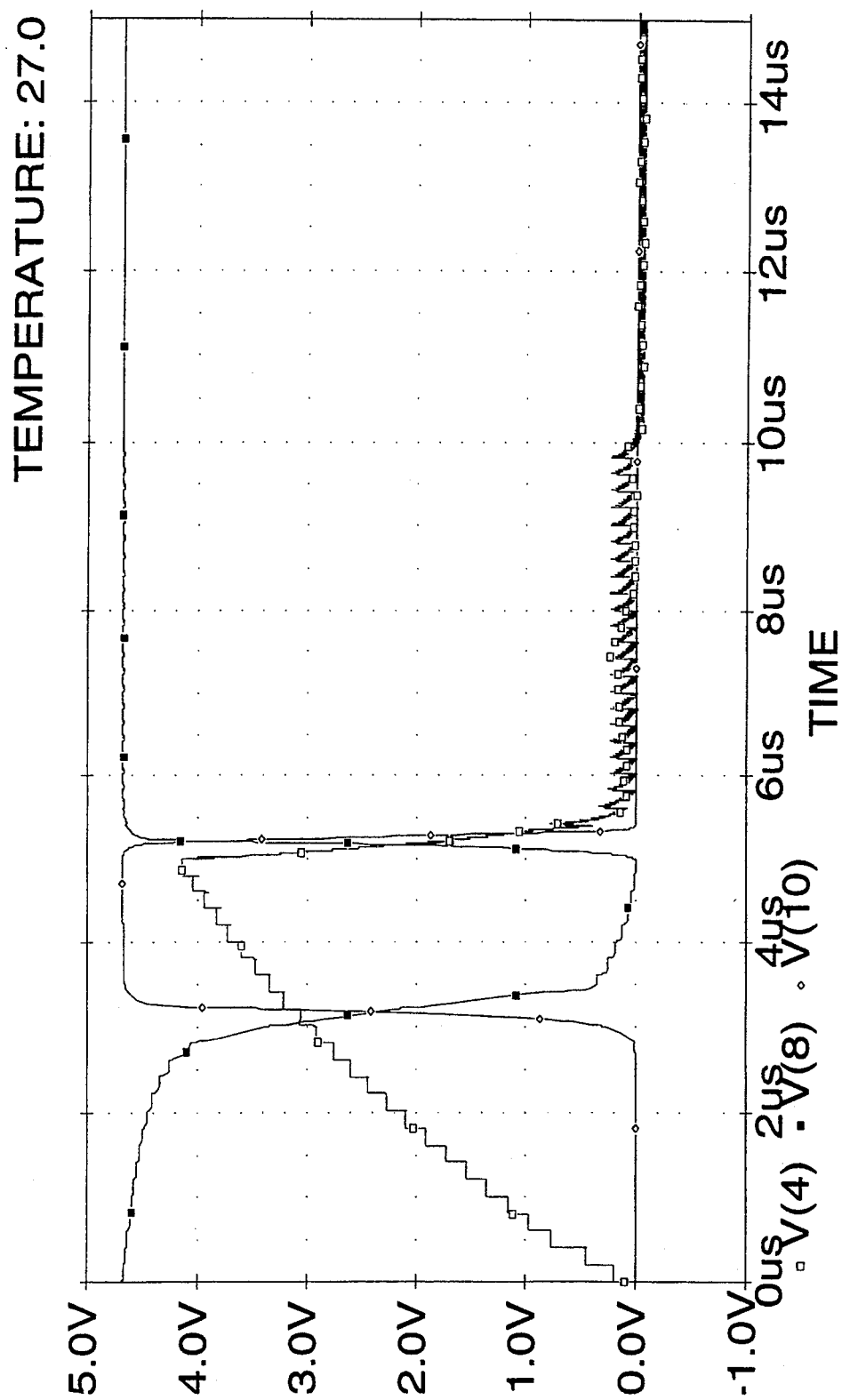
FIG. 17 is a graph of the simulated behavior of the adaptation network.
Figure 18:
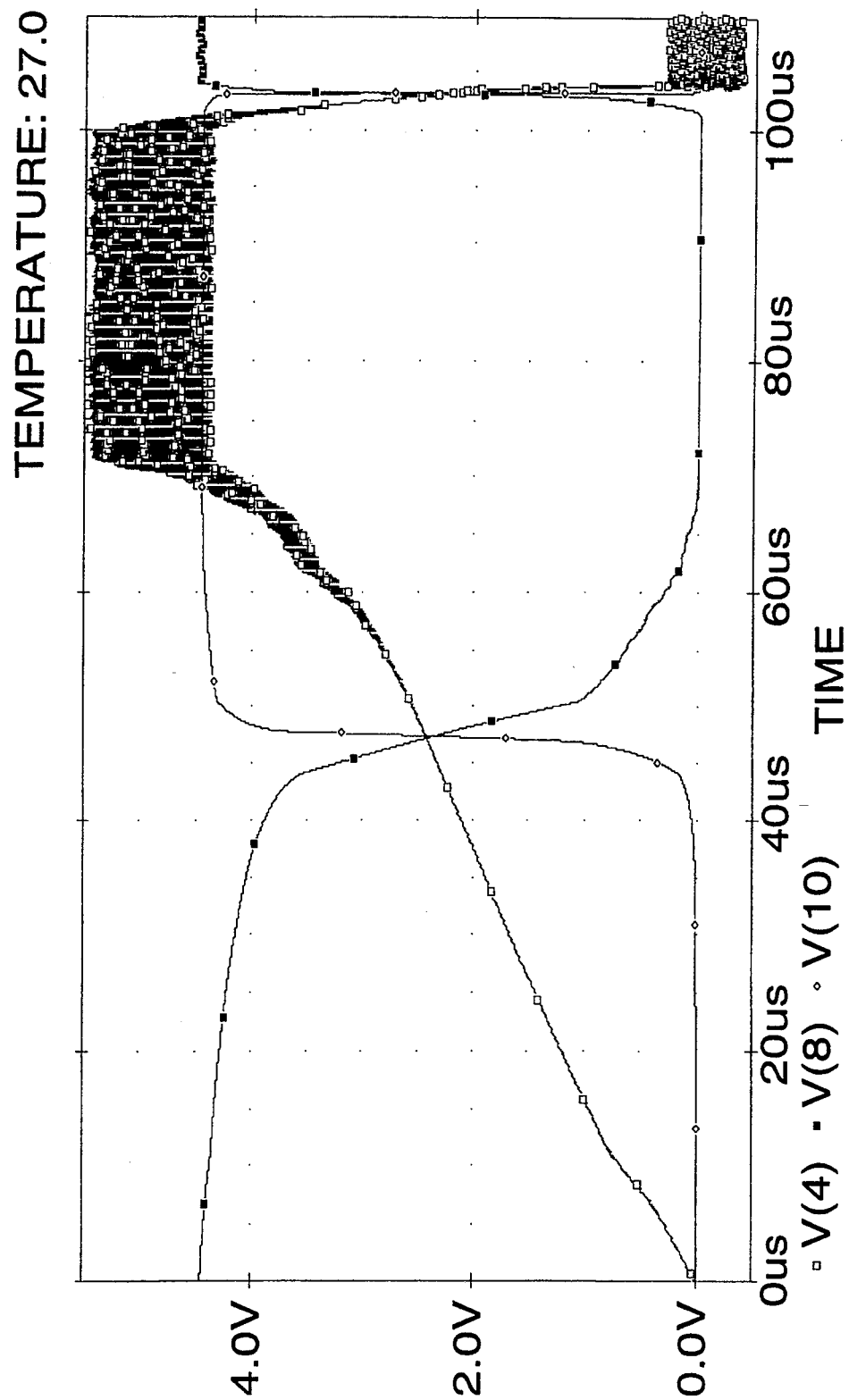
FIG. 18 is a graph of the simulated behavior of the adaptation network.

FIG. 17 and 18 show simulations for adaptation module 42 for two different adaptation rates. In both simulations, the analog voltage V10 is first increased then decreased through a voltage range of 0 to approximately 5 volts. In FIG. 17, V10 is leveled at 5 volts for approximately 2 microseconds. In FIG. 18, V10 is leveled at 4 volts for 50 nanoseconds. In FIG. 17, the voltage V4 of adaptation module 42 rises from 0 to 4 volts in 5 microseconds. In FIG. 18, the voltage V4 of adaptation module 42 rises from 0 to 4 volts in 70 nanoseconds. The slope and location of the DC bias V10 produced by adaptation module 42 in both FIG. 17 and FIG. 18 can be adjusted.

Implementation Independence of Media

None of the benefits of the present invention are dependent on the implementation media. The speed at which the invention operates is the speed of the signal propagation delay for the media. Re-implementing the invention in faster media would result in an even faster operation speed. In any media processing resolution may be at least two orders of magnitude faster than the propagation speed of the media because minute phase shifts are detectable by the asynchronous temporal PE of the invention. Other media types include, but are not limited to: GaAs, superconducting media, and optical circuitry.

EXAMPLES (INDUSTRIAL APPLICABILITY)

Figure 19:
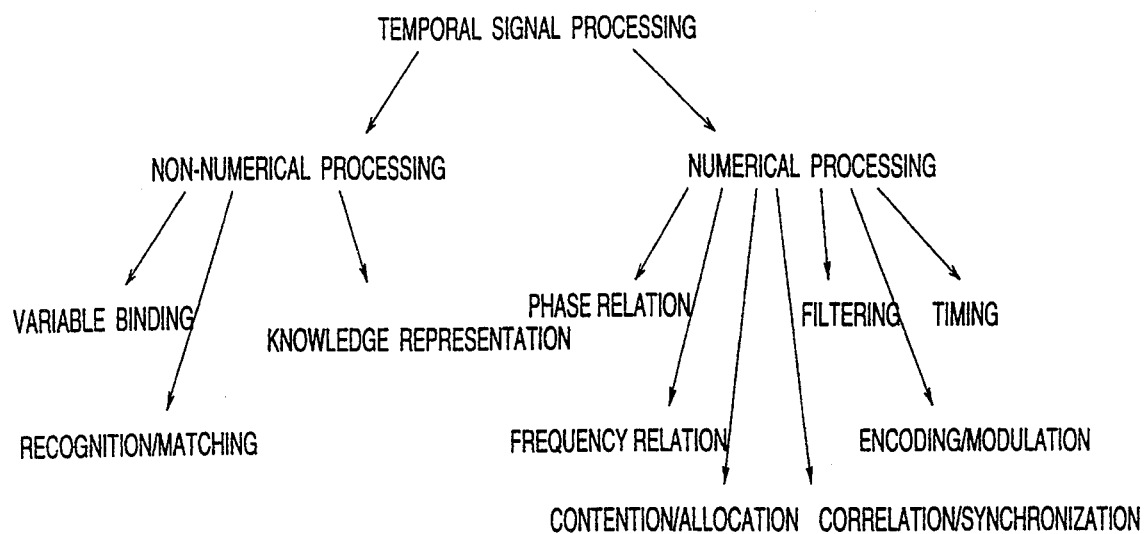
FIG. 19 is a taxonomy of temporal signal processing problems.

There are a large number of problems in engineering and in nature that require adherence to the temporal properties of their input. FIG. 19 shows a sample hierarchy relating a subset of these problems. The hierarchy is in no way meant to be complete or even absolutely correct, but is meant to serve as an example on which to base discussion of issues in temporal signal processing problems (TSPs).

A distinction that can be made at a relatively high level in the categorization of TSPs is between numerical and non-numerical processing. While it is obvious that all TSPs operate on signals (e.g. electrical, optical, radio), the function of the operations differs. Abstract processing is processing done to obtain qualitative results, such as modeling particular aspects of human cognition or biological reality. Numerical processing tasks are those that produce quantitative results, such as numerical measures of phase shift or frequency.

Many traditional signal processing problems fall into the numerical processing category. Filtering operations are needed in almost all signal processing applications for removing noise or extracting data from a signal. The measurement and adjustment of the phase shift between n periodic signals is another commonly required temporal processing operation. Phase-relation systems are used to establish a reference to which data extracting mechanisms can be synchronized. The pre-transmission encoding and post-transmission decoding of information through various phase and frequency modulation schemes is a widely practiced communication technique. Simple oscillatory systems are used to provide synchrony in serial operations or serve as drivers for more complex oscillators, such as those used for symbolic knowledge representation and robotic control. Single-layer arbitration systems with temporal decision criterion are used to resolve contentions between n input signals. Hierarchical arbitration systems provide an ordered resolution of temporal contentions.

The class of non-numerical temporal signal processing problems include those relating to cognitive or biological functioning, such as reasoning, pattern matching, and neuron simulation. High level cognitive reasoning, such as rule application and generalization, can be aided by representing conceptual entities with oscillatory systems. Reasoning tasks such as variable-binding and conceptual association are accomplished by frequency and phase modulation of these oscillator systems. By modulating oscillatory patterns, complex relationships can be concisely represented and used in a variety of inferencing and pattern matching applications.

Oscillatory systems are also being studied for their potential in solving complex control problems such as legged robot locomotion or multi-axis robotic arm control. In this case, the oscillatory systems represent information about the phase and timing relationships between each degree of freedom under control.

Given the number and complexity of the members in the class of TSPs, there is a need for small, fast hardware to solve them. In many cases, the temporal nature of these problems lead to large digital VLSI or clumsy algorithmic solutions which lose practicality in a real-world environment. The present invention is of a high-speed, neural processing element that is ideally suited for TSPs. Its small size and high-speed make it an ideal alternative to digital or algorithmic implementation.

Temporal signal processing subsumes non-temporal signal processing being a superset of the latter, while the reverse is not true. With this in mind, we highlight some TSPs with the realization that traditional non-temporal signal processing problems can be easily accommodated.

Figure 20:
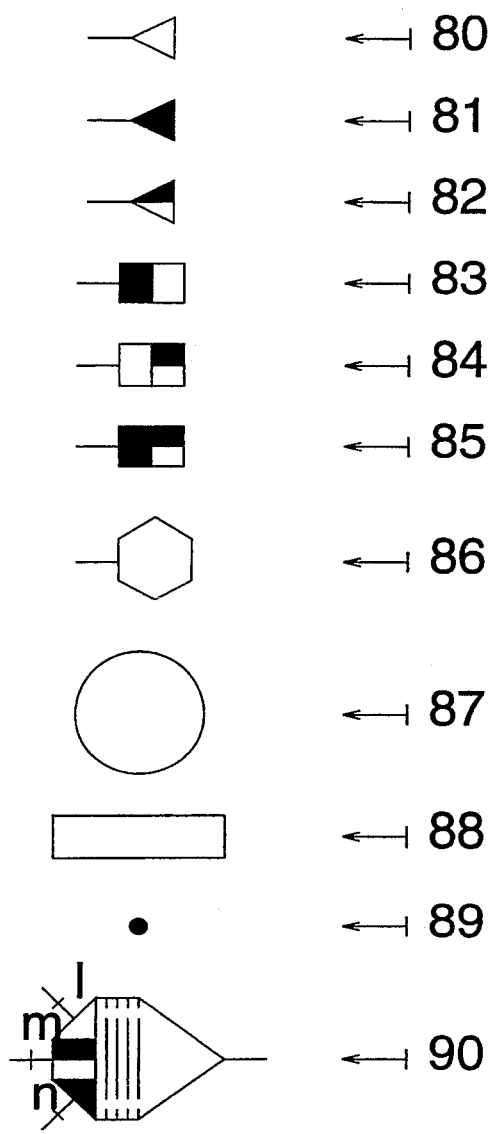
FIG. 20 is a block diagram of the preferred components using in constructing networks of the processing element.
Figure 21A:
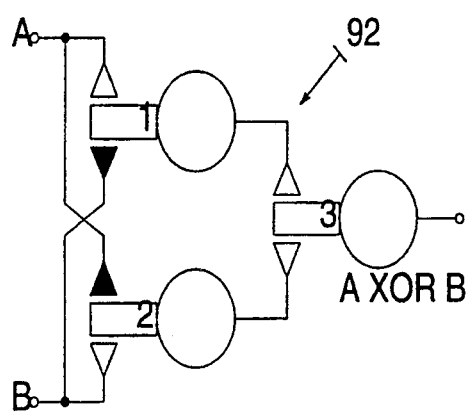
FIG. 21 is a block diagram of continuous windowed logic systems employing the processing clement.
Figure 21B:
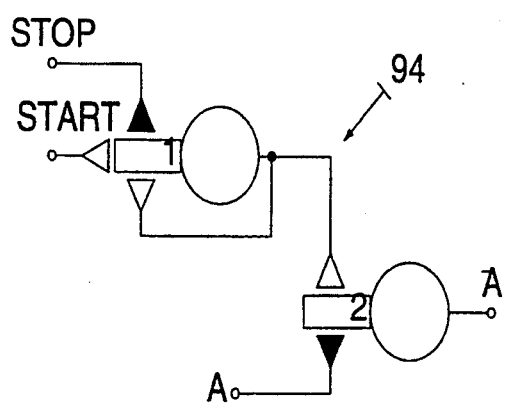
Figure 21C:
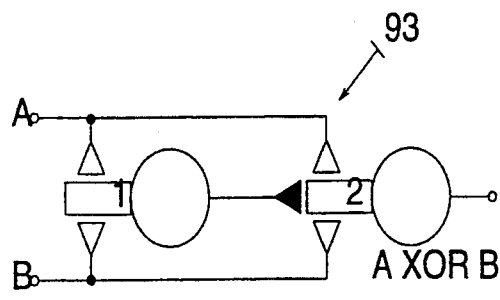
Figure 21D:
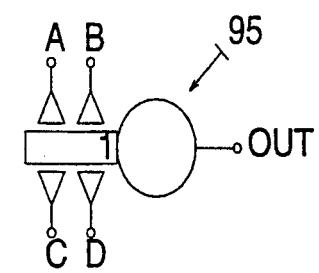

Accordingly, the invention is further illustrated by the following non-limiting examples. FIG. 20 illustrates the symbology for PE components from which more complex systems may be constructed. The components are excitatory synapse 80, inhibitory synapse 81, shunting synapse 82, inhibitory-excitatory synapse pair 83, excitatory-shunting synapse pair 84, inhibitory-shunting synapse pair 85, inhibitory-excitatory-shunting synapse triad 86, axon hillock 87, soma node 88, asynchronous reset 89, and adaptation module 90. The symbology of FIG. 20 will be used consistently throughout the following figures supplementing the examples.

EXAMPLE 1

The first set of components constructible from the PE of the present invention are systems that perform the basic logic functions of inversion, union (OR), intersection (AND), and exclusive-or (XOR). These functions differ from their digital counterparts by functioning temporally; the function output is dependent on past inputs as well as the current input. This time dependence produces a windowing effect; for example, a two-input AND gate has an asserted output only when both of its inputs arc asserted, while in the windowed AND gate the output becomes asserted if and only if the inputs are asserted within some adjustable time window. The inputs do not have to be simultaneous.

FIG. 21 shows the PE-level diagrams of two exclusive-or systems 92 and 93, inverter system 94, and a windowed AND/OR coincidence gate 95.

The exclusive-or system 92 performs the exclusive-or operation using cross-coupled inhibition. If one input is active it inhibits the other; therefore, if both inputs become active the cross-coupled inhibitory connections will prevent the output of either input PE from becoming active. The output PE is biased as an OR system, and thus becomes active when either or both input PEs are active. FIG. 22 shows the simulated I/O behavior of the XOR system for the trivial case of neither input being asserted, the number one input PE only being asserted, the number two input PE only being asserted, and both input PEs being asserted. The output A XOR B displays the XOR operation. The response time of the output to a given input state is fully adjustable. In FIG. 22 the response time of the system is relatively slow. The exclusive-or circuit 93 offers a solution with one less processing element by combining the AND and OR functions simultaneously within a single node.

The inverter system 94 performs an inversion function where inversion is defined as the presence of output activity in response to no input activity and vice-versa. This system can be used to evoke a response from a system when a particular signal line becomes inactive, thus preventing the system from becoming inactive due to a lack of input activity. This concept will be detailed further in a later example of phase relation systems, where it is useful as a component in a self-adaptation architecture.

The windowed AND/OR coincidence gate 95 performs any combination of temporal AND and OR. For example, if the EPSPs produced by each excitatory synapse are large enough to fire the hillock, the system performs the OR function. If, on the other hand, the EPSPs must occur within a window of each other to produce a soma potential large enough to fire the hillock, the system performs the AND function. These functions can be combined to form more complex temporal logic functions, such as (A B) (C D).

EXAMPLE 2

Oscillatory systems have a wide variety of applications in both parallel and synchronous processing systems. Oscillatory systems provide rhythmic patterns which may be used for synchronized/coordinated motion of multiple limbs, as required for robot locomotion. In invertebrates these rhythmic patterns are generated by oscillatory systems known as Central Pattern Generators (CPGs). These oscillatory systems are responsible for repetitive operations such as motion, respiration, circulation, and food intake. In sequential machines, oscillators (clocks) provide synchrony for all processing. Neural networks are typically not thought of as synchronous systems, but from the real world computational point of view the need for serialization is apparent. Systems in which sequential neural subsystems are available would offer processing capabilities such as finite state machine emulation, which may prove useful in interfacing parallel asynchronous neural systems with conventional digital processing systems. Sequential capabilities may also prove useful in applications such as time-series prediction.

Figure 23A:
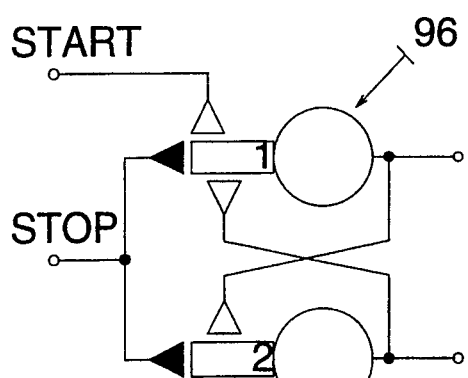
FIG. 23 is a block diagram of oscillatory systems employing the processing element.
Figure 23C:
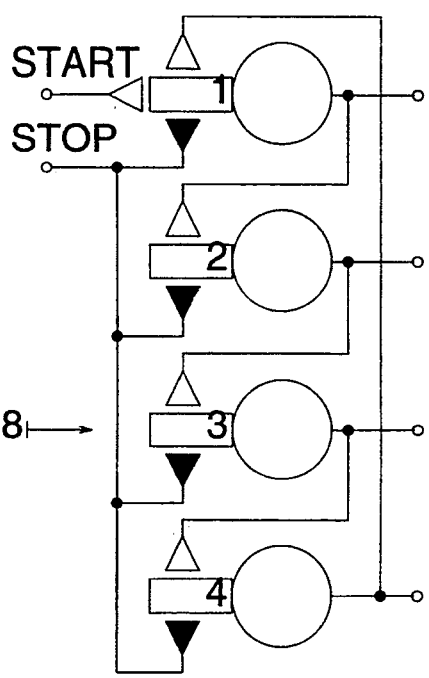
Figure 23B:
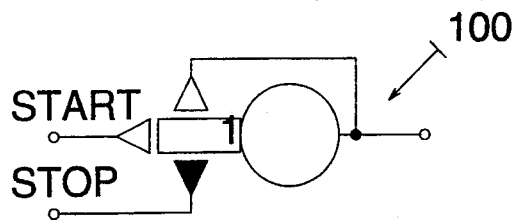

FIG. 23 shows three basic oscillator structures. In all cases oscillation is achieved by mutual excitatory feedback between PEs or within a single PE. In Pulse Oscillator (PO) 96, oscillation is initiated by the arrival of a single AP on the START line. The excitatory input causes PE 1 to become active. This activity is fed to the input of PE 2. The output of PE 2 becomes active; this activity is in turn fed back to the input of PE 1 and oscillation is achieved. The oscillator is stopped by a single AP on the STOP line. The frequency of oscillation is variable by multiple mechanisms, including varying the excitatory synapse amplitude or hillock refractory period. The phase shift between the two pulse streams is adjustable via the synapse delay setting.

FIG. 24 shows an interesting behavior of the PO 96. When the START pulse arrives oscillation begins. Due to the particular bias settings in this simulation, the oscillation is at a maximal rate. The IPSP can be adjusted to decrease the output frequency without completely stopping the oscillation. By pulsing the STOP line the output appears as a Binary Frequency Shift Keyed (BFSK) signal representing a single high/low bit. Frequency shift keyed (FSK) modulation is useful in locomotion systems for switching between different stable gaits, which generally requires both different frequencies and different phase relations between limbs. If multiple inhibitory synapses with different bias settings are connected to the oscillator inputs, a range of oscillation frequencies can be achieved.

An extension of the PO concept is made to a system with four PEs that functions as a Four Bit Oscillator (FBO) 98. The operational principle is exactly the same as that of the PO 96. The four bit structure is useful when a large number of correlated/synchronized pulse streams are required. FIG. 24 shows the output of an FBO simulation in which the bias settings are such that each PE of the FBO fires a double burst during the oscillatory cycle. A simple Single Cell Oscillator (SCO) 100 requires the least amount of circuitry and is useful when single driver pulse streams are needed. Complex synchronous and asynchronous CPGs can be derived by using these basic oscillators to drive frequency divider/multiplier systems (discussed in the example of single PE spatio-temporal correlation systems).

Figure 26:
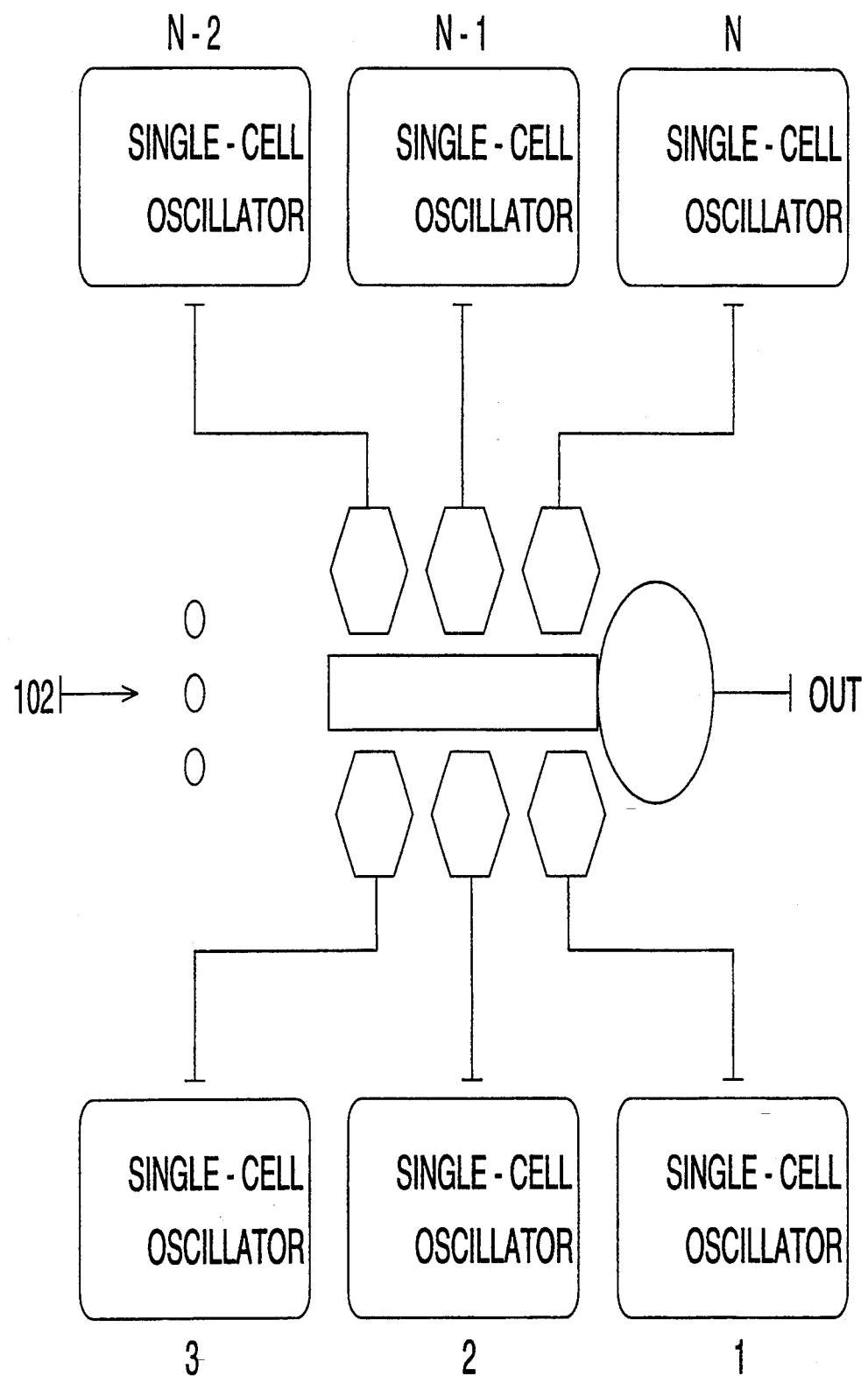
FIG. 26 is a block diagram of an uncoupled data oscillator employing the processing element.

Complex oscillatory patterns can be generated by modulating a number of patterns. FIG. 26 shows an uncoupled data oscillator 102 for modulating the oscillatory patterns of n different inputs. This general system shows n SCOs 100 feeding inputs through synapse triads to a node. All inputs are independent and can be configured to produce a wide variety of complex oscillatory patterns based on the biases controlling the n synapse triads. Using the uncoupled data oscillator, primitive features represented by the SCOs can be independently combined through modulation to create a representation of a complex data object.

Figure 27:
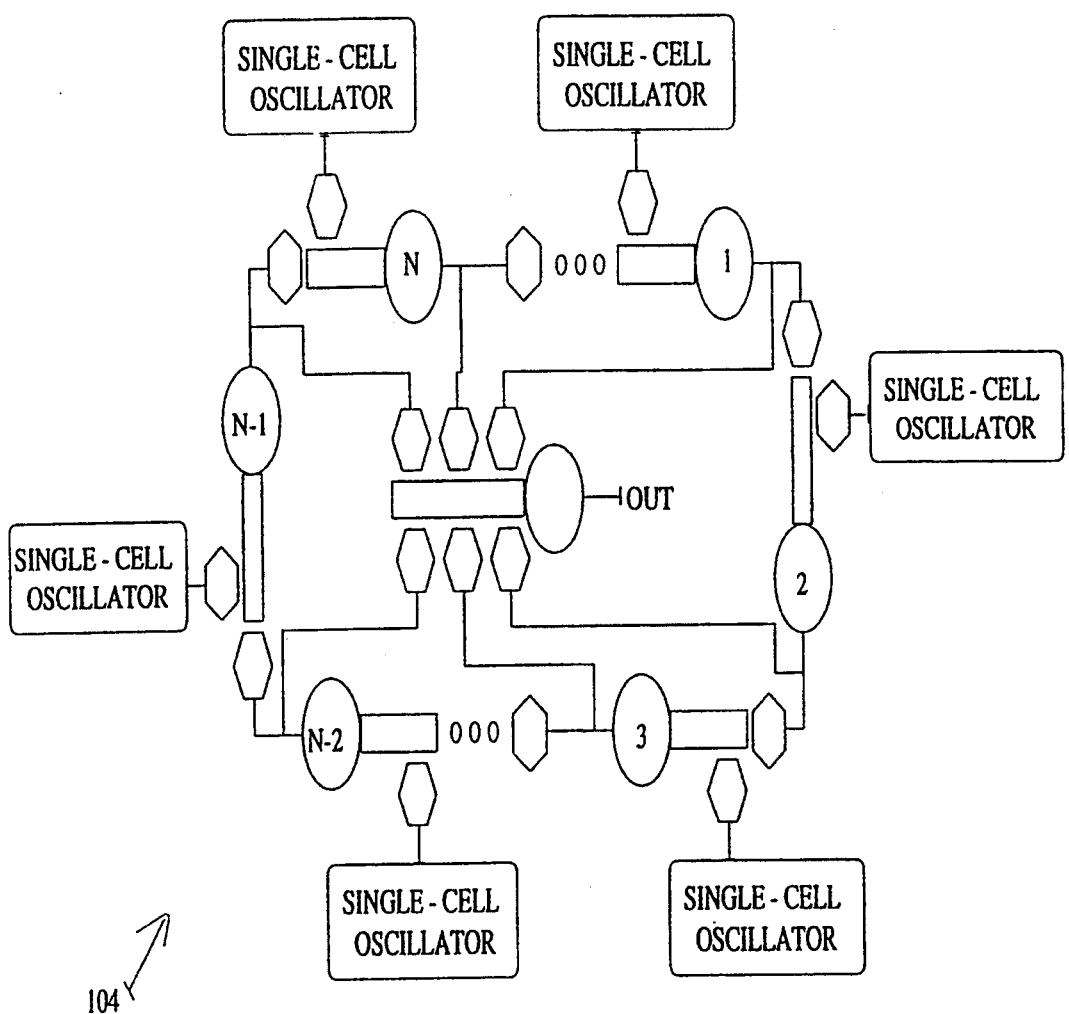
FIG. 27 is a block diagram of a coupled data oscillator employing the processing element.

FIG. 27 shows a coupled data oscillator 104. As in the uncoupled data oscillator 102, the system consists of n SCOs connected by synapse triads to a node. However, in this system the output of node i−1 is directly connected by a synapse triad to node i. This adds an even larger range of behaviors to the system because the inputs to the coupled data oscillator are dependent on one another. When the SCOs get a start pulse, the output of each node i will feed into the central node to produce an output similar to the uncoupled data oscillator. Since each output is also fed to a neighboring node, the next input received by the central node will be the output of each node i modulated with the output of node i−1. Dependencies between data stored in the SCO can thus be modeled and represented by the system.

EXAMPLE 3

Figure 30A:
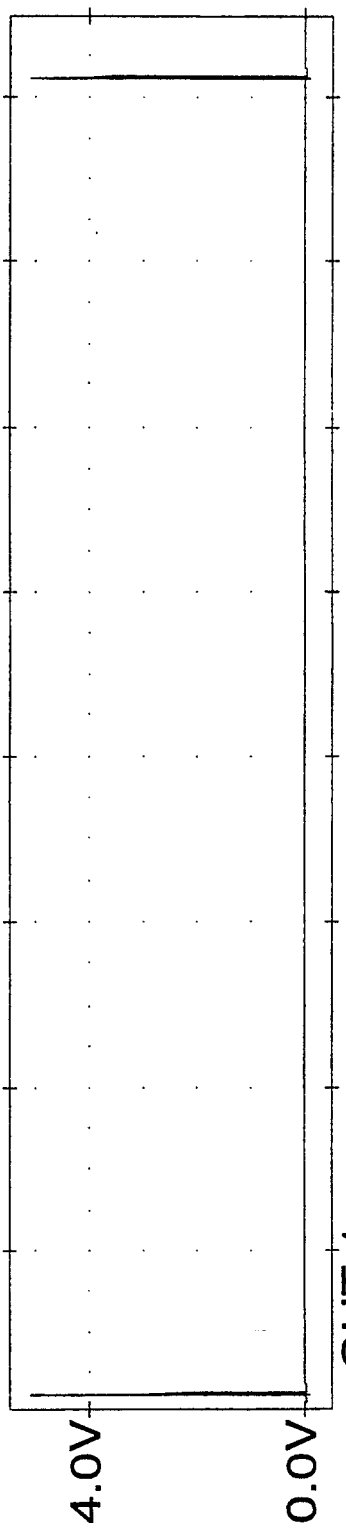
FIG. 30 is a graph of the simulated behavior of the auto-reset timer network of FIG. 28 having a long duration between output action potentials.
Figure 30B:
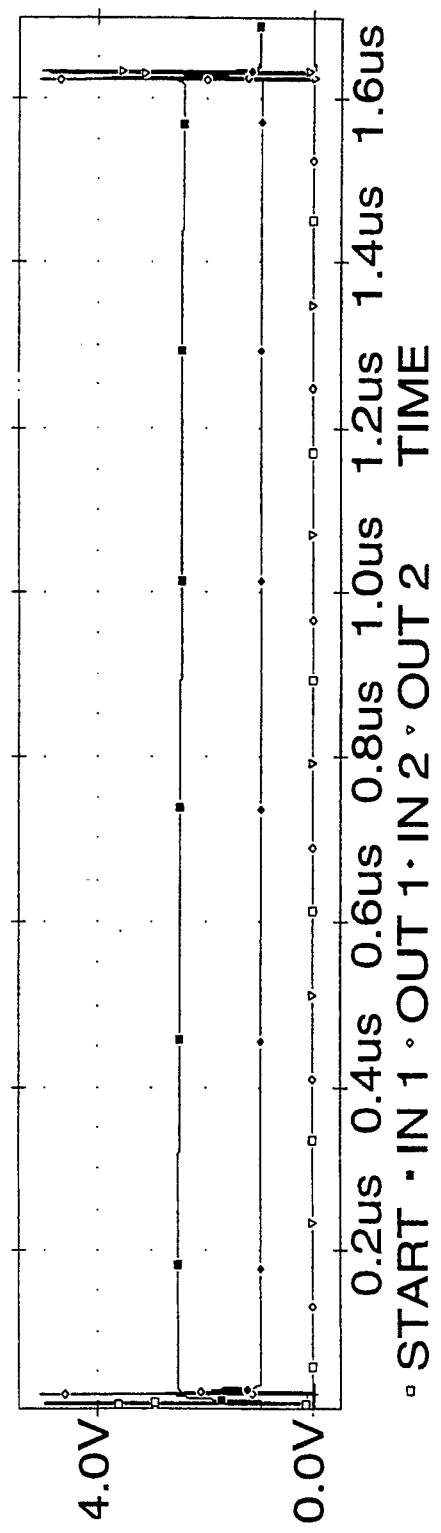

Another set of constructible components are tinning systems. FIG. 28 shows the PE-level diagram of an Auto-Reset Timer (AT) 106. When an AP arrives at the input of the AT system 106 it produces two APs separated by an adjustable period of time. The input AP enters an excitatory synapse on PE 1 and an inhibitory synapse on PE 2. The excitatory synapse on PE 1 generates an EPSP and causes PE 1 to fire an AP. The AP feeds back to the input of PE 2. The EPSP generated by the feedback AP is absorbed by an IPSP that was produced at the input of PE 2 in response to the input AP. After the first output AP is generated the input of PE 1 is still active and PE 2 has returned to a resting state. When the refractory period of PE 1 has elapsed it fires another AP in response to its still excited soma node. This AP once again feeds back to the input of PE 2 as an EPSP; since the IPSP has dissipated, this causes PE 2 to fire an AP. This AP resets PE 1 to its resting state and the cycle is complete. Thus the timing period is the refractory period of PE 1, which can range from a nanosecond to practical infinity (See Table 2). FIG. 29 shows the AT system 106 repeatedly fired at a time period of approximately 38 ns. FIG. 30 shows the time period extended to approximately 1600 ns to illustrate range.

The AT system 106 may be used to form more elaborate timing systems such as a Retriggerable Timer (RT) 108 and a Ring Oscillator (RO) 110. The RT system 108 consists of two AT systems that are switched by a toggle system that is itself very similar to the AT system 106. The outputs of the two AT systems are input to an OR operation system to produce a single output. The RT system 108 is retriggered each time an AP arrives on the input line by toggling between the two identically biased AT systems and thus restarting the timing period.

The RO system 110 consists of n AT systems connected in series. The input of each succeeding stage is fed by the single reset pulse of the preceding AT system 106 (output of PE 2). Master START and STOP mechanisms are included for global control. The unique characteristic of this oscillator is that each component of the complete oscillatory cycle is independently controlled with respect to the duration of the other components. The length of the complete oscillation is a function of the RO 110 as a whole. The individual components of the oscillation are functions of the states of the component ATs, and can be used to represent components of a single variable or data item.

EXAMPLE 4

The need to relate signals in terms of their phase relations is present in almost all signal processing applications. No information can be extracted from a signal if a reference point has not be established. The reference may be the phase relation between n input signals, or between n input signals and an internally generated synchronizing signal.

Figure 31A:
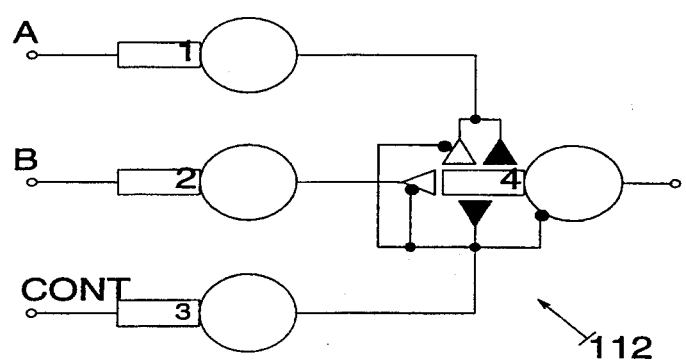
FIG. 31 is a block diagram of phase relation systems employing the processing element.
Figure 31B:
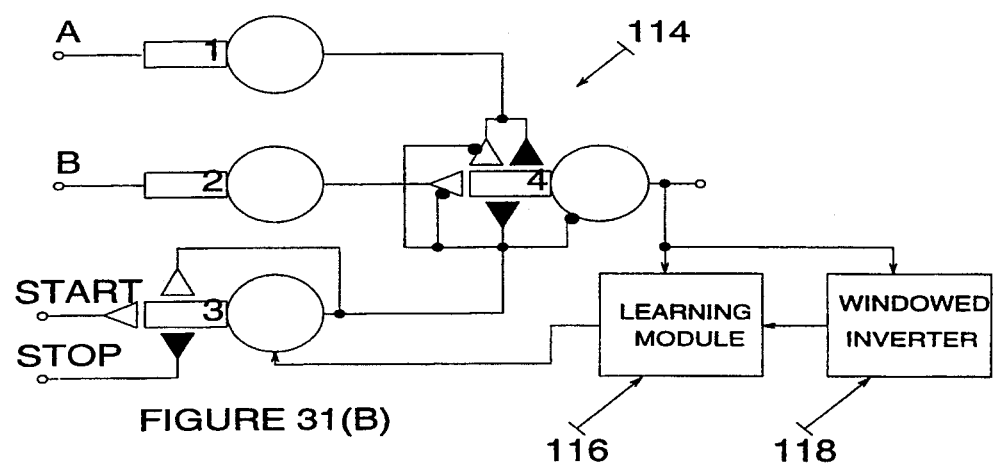
Figure 34A:
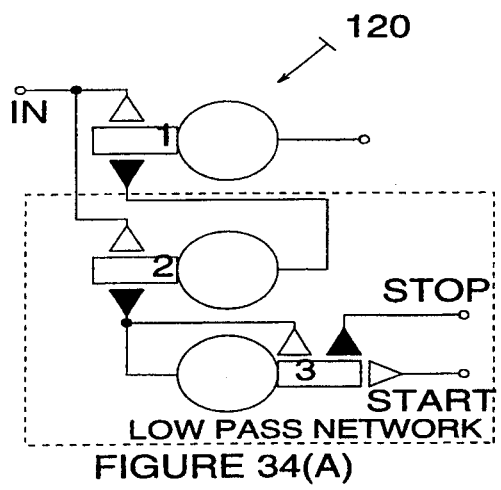
FIG. 34 is a block diagram of filtering systems employing the processing element.
Figure 34C:
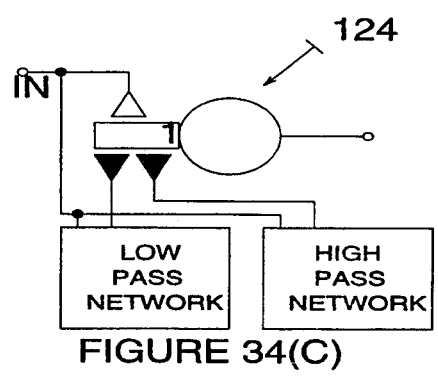
Figure 34B:
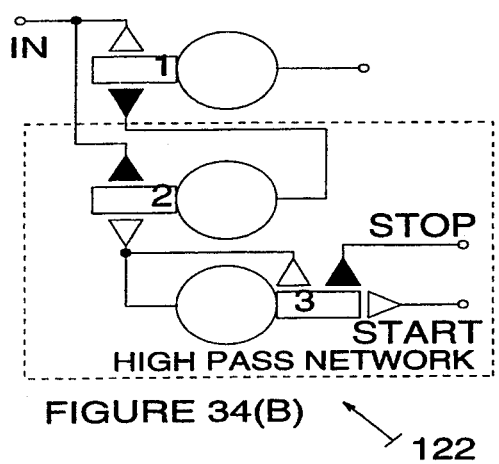
Figure 34D:
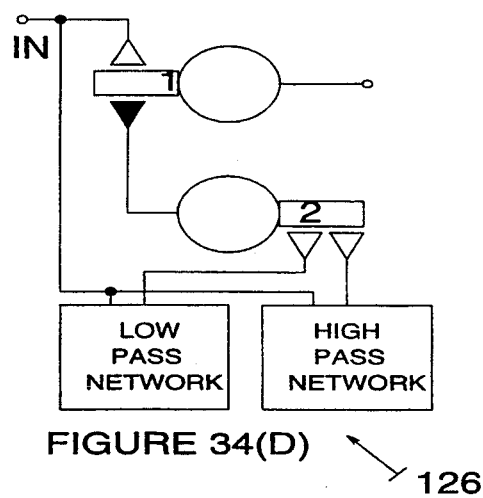

FIG. 31 shows a Phase Shift Demodulator (PSI)) system 112 that determines if the phase difference between two periodic signals is within a window. If the phase shift is within the window the output (PE 4) becomes active. The PSD system 112 functions in the following manner. A periodic signal is input to PE 1, which is set to fire once each period of the incoming signal. Each AP generated by PE 1 fires an IPSP and an EPSP simultaneously on the input of PE 4. The EPSP has a long time duration at an amplitude not high enough to fire PE 4. The IPSP has a very short time duration and is used to shape the rising edge of the PE 4 soma waveform. The long-duration low-amplitude EPSP serves as an enable signal for PE 4. A periodic signal of the same frequency as that applied to PE 1, but with a possibly-zero phase shift, is input to PE 2. PE 2 is also set to fire an AP once each period of the input signal. This AP drives an excitatory synapse on PE 4 that produces a short-duration low-amplitude EPSP. If this EPSP occurs while PE 4 is enabled it will cause PE 4 to become active and fire an AP. The length of the enable period is set by a control signal on PE 3. The control signal has a phase shift with respect to the signal on the input of PE 1. This phase shift is the window within which PE 4 is enabled. The control signal causes PE 3 to fire an AP, which resets the excitatory synapses connected to PE 4 and the PE 4 hillock itself. If the PE 2 EPSP occurs when PE 4 is not enabled is does not have sufficient amplitude to cause PE 4 to become active. The system is thus controlled by the relative phase shift between the PE 1 and 3 input signals and with proper bias settings will offer linear control.

Two self-contained alternatives can be obtained by augmenting the PSD system 112 of FIG. 31. First, the external control signal can be replaced with an internal oscillator which is synchronized with respect to the PE 1 input signal. The enable window on PE 4 will then be a function of the relative phase shift between the PE 1 input signal and the internally generated signal, and is adjusted via the oscillator biases, which do not offer linear control. Second, the control signal can be done away with completely, in which case the enable window becomes a function of the time duration of the PE 1 EPSP that is input to PE 4 (in the original PSI) configuration its duration is set to be longer than the input signal period). The control in this case is also nonlinear and involves the adjustment of more than one system parameter to shift the enable window. FIGS. 32 and 33 show the PSD system response to two input scenarios. In FIG. 32 the PE 2 input signal is lagging the PE 1 input signal by 60 degrees. It can be seen in the second plot of FIG. 32 that PE 4 becomes active (OUT 4), which signifies the phase shift is within the acceptable window. If the phase shift between the PE 1 and 2 input signals is increased to 70 degrees lagging it is no longer within the acceptable window and therefore PE 4 does not become active (see second plot of FIG. 33).

The PSD system 112 is only designed to monitor the case where the PE 2 input signal is lagging the PE 1 input signal. If both lagging and leading phase shifts are to be monitored simultaneously the PSD system must be modified as follows. A toggle system is used to cross-couple PE 1 and PE 2 such that the first signal to arrive fires the long-duration low-amplitude enable EPSP and the second signal to arrive fires the short-duration low-amplitude EPSP, regardless of the order of arrival. This would allow for the monitoring of both leading and lagging signals, but the PE 4 output will only signify an acceptable phase shift and not its polarity. To also monitor the polarity of the shift an additional two PE system must also be added to the original PSD system 112. This two PE network determines the arrival order of the two signals (the phase shift polarity). This subsystem is discussed in the example of winner-take-all systems.

The PSD system 112 and its hybrids only determine if n signals arrive within some window of each other, and do not actually measure the phase shift between the signals. An elaboration of the PSD system 112 called the Phase Shift Quantifier (PSQ) 114 measures the relative phase shift between two inputs, and is also shown in FIG. 31. The output state of the system is fed back to control the phase of the internal oscillator that controls the length of the enable window. The feedback involves the previously described windowed inverter 118 and a learning (adaptation) module 116. The learning module 116 is an adaptation module that controls a particular DC bias parameter of a PE, as discussed in the description of the preferred embodiments.

The PSQ system 114 shown in FIG. 31 operates as follows. The output of PE 4 is active when the phase shift between the signals on the inputs of PE 1 and 2 is within the enable window. This activity is fed into the Type H1 learning module 116 to decrease the threshold/delay bias of the SCO, which causes a reduction in the phase shift of the SCO with respect to the PE 1 input signal, and thus a reduction in the enable window duration. This continues until the window is reduced to the point where PE 4 becomes inactive. At this point the inactivity of PE 4 is inverted by the the windowed inverter 118, and the inverted signal is input to the adaptation module to increase the threshold/delay bias of the SCO hillock, and thus increases the enable window duration. As PE 4 oscillates about active/inactive states it converges to the actual phase shift between the PE 1 and 2 input signals. There arc two possible scenarios in which the oscillations are too large and do not converge to a tight enough value about the desired settling point. If the bias value is in the nonlinear region of the bias/parameter curve, the delta bias changes can cause large jumps back and forth about the desired solution. The nonlinear feedback mechanism described above is designed to cope witch this situation. It is also possible that the desired settling point is not in the nonlinear region of the bias/parameter curve, and therefore will not be compensated for by the above nonlinear feedback mechanism. A second control mechanism must be employed in the learning module network, by adding a system that either increases or decreases the effect of the individual AP depending on the rate of change of the adaptation module inputs (i.e., the second derivative of the bias voltage). The effect of each AP arriving on an "increase" input will be changed such that net activity between the increase/decrease inputs becomes equal. This settling as learning behavior can be extended to larger, more complex systems.

EXAMPLE 5

Filtering is used ubiquitously in signal processing applications to remove noise from an input signal or demodulate signals from a carrier wave. PE-level diagrams of the four basic filter structures (low-pass 120, high-pass 122, band-pass 124, and band-stop 126) are shown in FIG. 34. From examination of FIGS. 36 and 37 it can be seen that the band-pass and band-stop filters 124 and 126 are formed by ORing and ANDing the low-pass and high-pass network 120 and 122 outputs, respectively.

Before describing the operation of the filtering systems, the filtering of pulse streams must be discussed. The half-power frequency (3 dB point) of the filter and the filter type effectively define which frequencies are passed and which frequencies are attenuated by the filter, i.e., the pass-band of the filter. If a frequency of interest is within the pass-band of the filter, it should be allowed to pass pulse for pulse. If, on the other hand, the frequency of interest is not in the pass-band of the filter, it should be attenuated by at least fifty percent. When dealing with pulse streams a logical interpretation of attenuation by fifty percent is the removal of every other pulse from the scream, thus reducing the frequency and overall power of the stream by fifty percent. This definition of pulse stream attenuation will be used in the following discussion of the four basic filters.

FIG. 34 shows the PE-level diagram of the low pass filter system 120. An incoming AP stream fires EPSPs on the inputs of both PE 1 and 2. PE 1 is biased so as to allow a one-to-one firing ratio between the PE input and output if the inhibitory synapse on PE 1 is inactive. The inhibitory feedback from PE 2 to PE 1 is inactive if the input frequency is sufficiently low to allow the SCO to maintain subthreshold activity on the input of PE 2. If the input frequency increases to the point where it begins to overcome the SCO inhibitory input on PE 2, the inhibitory feedback to PE 1 will become active causing a reduction in the input/output firing ratio of PE 1. When the 3 dB frequency is reached the input/output firing ratio of PE 1 will be 2:1. The high-pass filter system 122 operates by the same principle, except the role of the excitatory and inhibitory synapses on the input of PE 2 is reversed. If the input frequency becomes high enough to overcome the SCO excitatory input the inhibitory feedback to PE 1 becomes inactive and the input/output firing ratio becomes 1:1. FIGS. 35 and 36 show the I/O response of the high-pass filtering system 122. FIG. 35 shows the filter allowing a pulse-stream with a period of 64 nanoseconds to pass 1:1, while FIG. 36 shows a pulse-stream in which the period is increased to 67 nanoseconds, and the signal is not allowed to pass at all. The slope of the transition region is a function of the IPSP duration and the frequency of the internal SCO (PE 3).

The band-pass and band-stop filters 124 and 126 are composites of the low-pass and high-pass filter systems 120 and 122. If the outputs of the low-pass and high-pass structures 120 and 122 are ORed together and the 3 dB frequency of the low-pass filter 120 is higher than the 3 dB frequency of the high-pass filter 122, the composite filter is a band-pass. The pass-band is the band between the two respective frequencies. If the output of the low-pass and high-pass structures 120 and 122 are ANDed together and the 3 dB frequency of the low-pass filter 120 is lower than the 3 dB frequency of the high-pass filter 122, the composite filter is a band-stop. The stop-band is the frequencies between the two respective frequencies.

The addition to the basic filter structures of a feedback adaptation network similar to the one employed in the PSQ system 114 of FIG. 31 can produce an auto-tuning filter system. During the tuning phase of operation the feed-back network will tune the SCO of the filter system such that the 3 dB frequency/frequencies of the filter are set to the frequency/frequencies present on the system input. Once tuned the feedback system is relaxed, and the filter is in normal operation mode with fixed parameters until such time that another tuning cycle is desired.

EXAMPLE 6

Another component constructible from the PEs of the present invention is a set of Winner-Take-All (WTA) systems that choose a winner or winners from a group of contending signals, based on some selection mechanism such as signal arrival time or signal frequency.

Figure 37A:
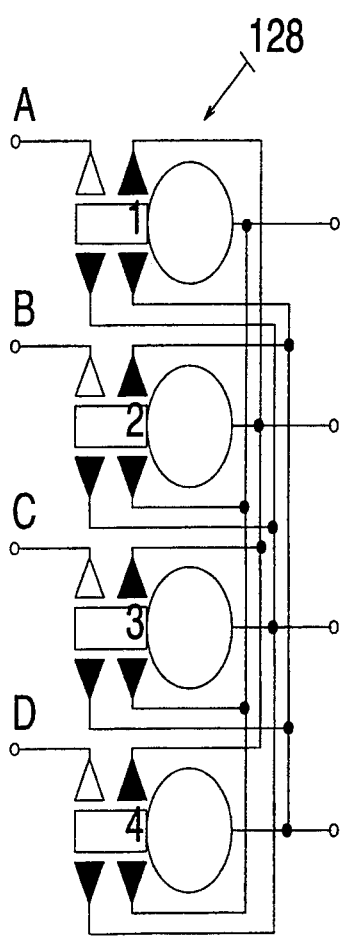
FIG. 37 is a block diagram of winner-take-all systems employing the processing element.
Figure 37B:
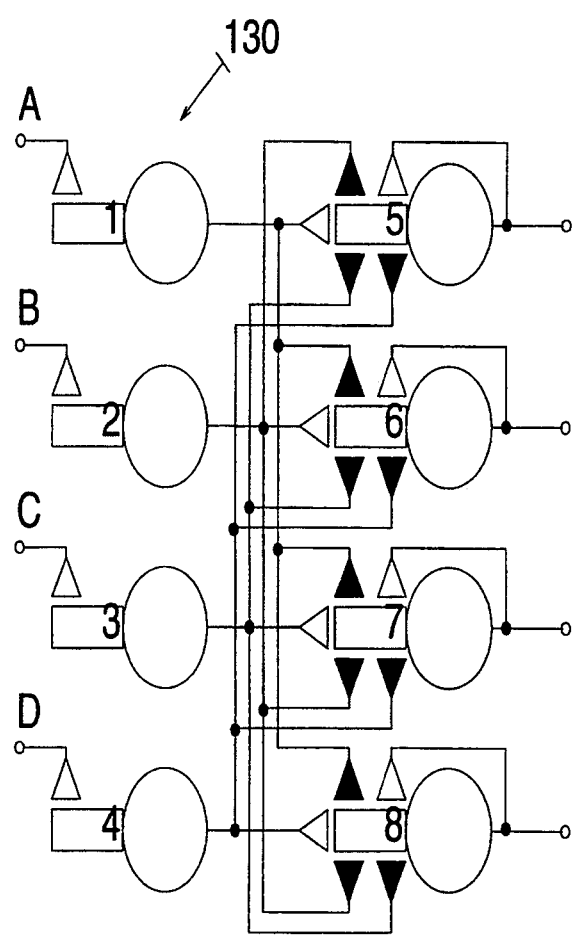

FIG. 37 shows a bifunctional WTA system 128 that is capable of choosing a winner based on either signal arrival time or signal frequency. Which criterion is used is a function of the input signal period and the time duration of inhibitory feedback. The bifunctional WTA network 128 is a single-layer structure that uses mutual inhibitory feedback to choose a winner from a group of $n = 4$ contenders. If the period of the incoming pulse streams is less than the duration of the inhibitory feedback the network chooses a winner or winners based on signal arrival time, and is called a Temporal-WTA. This behavior can be seen in FIG. 38. If the duration of the inhibitory feedback is longer than the period of the incoming signals the periods of inhibition overlap and therefore prevent any pulses that arrive after the decision has been made from ever being considered. If the inhibitory feedback is strong enough that only one IPSP is needed to completely inhibit the PE input then only the first signal to arrive wins. In the simulation shown in FIG. 39, three PEs must become active in order for the inhibitory feedback to sufficiently inhibit the input of the forth PE, therefore the first three PEs to become active are chosen as winners.

If the period of the input pulse streams is longer than the duration of the inhibitory feedback the WTA network 128 of FIG. 37 chooses a winner based on pulse stream frequency and is referred to as a MAXfNET. Since the duration of the inhibitory feedback is less than the period of the incoming signals the feedback inhibition has gaps during which another PE may become active. The PE with the higher frequency input has a higher probability of becoming active during these gaps and will eventually will become dominant over the other PEs. With proper bias settings only the PE with the highest input frequency remains active, but in the general case spurious APs are produced by the low frequency PEs. There is such a large frequency difference between the output pulse streams that if the single-layer network is cascaded only the highest frequency signal is allowed to pass through both layers. FIG. 39 shows the I/0 behavior of the single-layer MAXfNET.

FIG. 37 also shows a general Temporal-WTA network 130. The behavior of the single-layer Temporal-WTA 128 is strongly frequency dependent, which limits its applicability to general problems. The general Temporal-WTA 130 on the other hand is frequency independent. The frequency independence is achieved by the input layer of the network. Incoming pulse streams cause the input PEs to become active, but the refractory periods of these input PEs are set such that only the first AP is allowed to pass, and therefore only a single AP passes to the second layer regardless of the input frequencies. The second layer of the network uses self-excitatory feedback and mutual-inhibitory feed-forward connections to choose a winner or winners based solely on the arrival time of input pulse streams. FIG. 40 shows the I/O behavior of the general Temporal-WTA 130 as it chooses the first three signals to arrive.

Similar structures can be constructed to pick only the $k^{th}$ signal to arrive or the $k^{th}$ highest frequency. WTA networks with much more complicated decision criterion may also be developed. These WTA systems are in a sense coupled filters in which the relationships between signals as well as the relationships between the signals and the networks themselves determine the overall behavior of the system. WTA networks are typically used as arbiters in applications that are competitive in nature, such as resource allocation, data routing, data compression, selective attention, and competitive learning.

EXAMPLE 7

All of the previous multi-PE systems :perform spatio-temporal correlation, either between input signals or between the input signals and the current states of the systems themselves. A single PE system, however, is also capable of a wide range of spatio-temporal correlation behaviors. The behavior of the multi-PE systems is usually much more diverse and easier to control than the single PE systems, but in restricted problems the single PE approach offers a simpler solution.

A single PE system consisting of an excitatory synapse attached to a hillock can be used as a high pass filter, a basic delay element, and a frequency divider/multiplier. The system is performing a high-pass filtering operation if the amplitude and duration of the EPSP are set such that an input AP stream of a certain minimum frequency is needed to produce activity. By adjusting the delay of the EPSP the system can be made to function as a delay unit that delays the regeneration of an input AP by the delay of the EPSP plus the system propagation time. If the refractory period of the hillock is set to be a little longer than the period of the incoming AP stream, it will ignore every other AP in the input stream. More APs are ignored as the refractory period is lengthened. In this mode of operation, the PE behaves as a fixed-ratio frequency divider for a particular narrow range of input frequencies. If the refractory period of the hillock is set to be some fraction of the period of the input pulse stream and the EPSP duration is approximately equal to the period of the incoming AP stream, the PE behaves as a fixed-ratio frequency multiplier for a narrow range of input frequencies.

The windowed AND/OR operation discussed earlier is an example of a single PE spatio-temporal correlation system. In conventional AND and OR gates the output conveys the state of the inputs for a particular point in time. The windowed AND/OR system, however, conveys the temporal relation of the inputs over a period of time. Suppose the duration of one EPSP is set to 20 nanoseconds and the duration of the other is set to 50 nanoseconds. If an AP arrives at the short duration synapse first the second AP must arrive within 20 nanoseconds to assert the system output. If, on the other hand, an AP arrives at the long duration synapse first the second AP has a longer 50 nanosecond period in which to arrive. This offers much more information than the conventional AND and OR operations.

EXAMPLE 8

Figure 41:
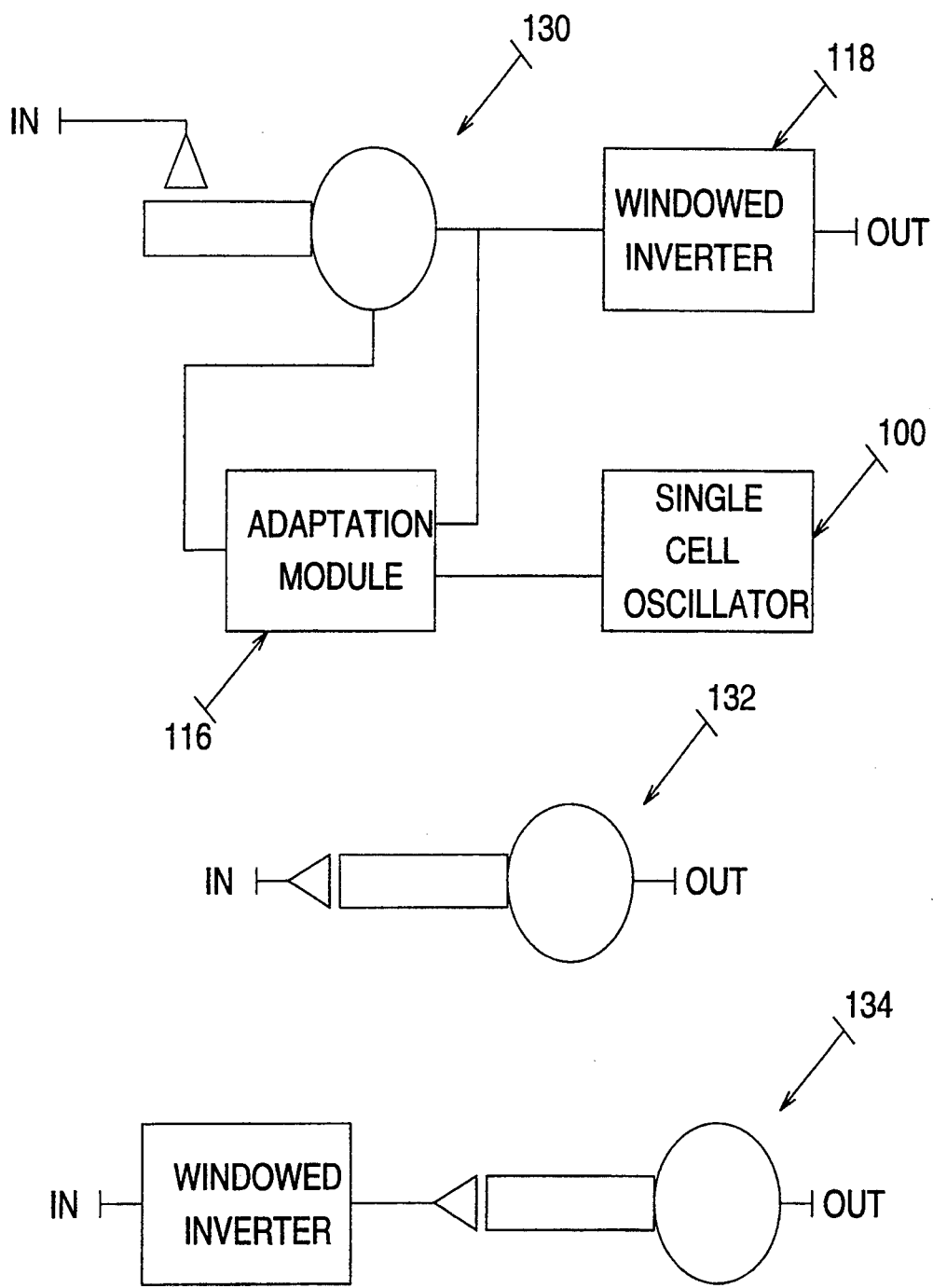
FIG. 41 is a block diagram of an extrema detector employing the processing element.

The measurement of extrema in waveforms is an important task with many applications. FIG. 41 shows three components used to form two extrema detectors. The adaptable extrema detector 130 is designed to modify the threshold of the node to be equal to the level of the input signal. When the signal reverses direction, an extrema is found. To detect a maximum, the SCO 100 pressures the adaptation module 116 to move the threshold down. Thus, before the input line, IN, becomes active causing the PE to become active, the threshold of the node will be at the resting potential. When the PE becomes active, the adaptation module moves the threshold up enough to match the input signal. Because there is a delay between the input signal arriving and the adaptation module adjusting the threshold, the node will fire APs. The APs are trapped by the windowed inverter 118, rendering the system output inactive. When the input signal reverses direction, it will immediately be below the threshold set by the adaptation unit, causing the node to cease firing. As this happens, the windowed inverter begins firing APs. The output of detector 130 may be connected to the input of node 132. Node 132 has a minimum threshold and an infinite refractory period. When an AP arrives on the IN line of node 132, the node will fire one AP and then will indefinitely remain in its refractory period.

To detect a minimum, the operation of the adaptation module 116 and SCO 100 of the adaptive extrema detector 130 are reversed: the SCO pressures the adaptation module to move the threshold up, and the adaptation module attempts to move the threshold down in response to the activity of the PE. Connected to the output of the adaptive extrema detector is the inverse input node 134. Upon start up, the threshold is such that the PE will be active. This activity will cause the adaptation unit to reduce the threshold of the device to a level just below the input activity level. This minimal activity level is maintained until the input reverse direction and begins to increase. The increase will cause a nonlinear jump at the output of the PE. The windowed inverter 118 captures these APs to turn the system off. However, the second windowed inverter of node 134 then turns on, sending APs. Node 134, like node 132, is set to have a minimum soma threshold and an infinite refractory period. Thus, the A Ps from the windowed inverter of node 134 will cause one AP to be emitted from node 134, and will then :indefinitely remain in its refractory period.

EXAMPLE 9

Figure 42:
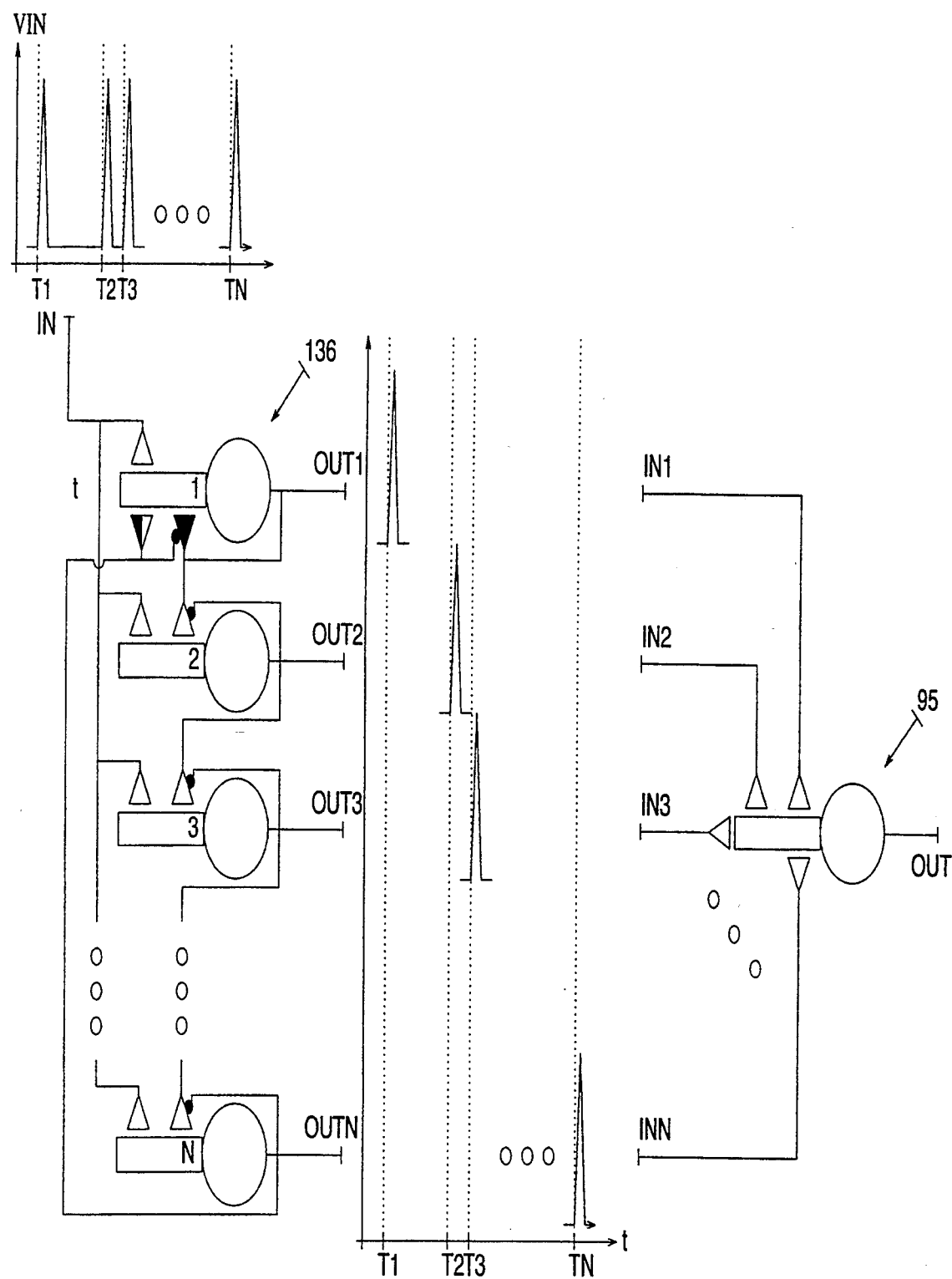
FIG. 42 is a block diagram of a serial pulse stream to parallel pulse stream converter and a parallel pulse stream to serial pulse stream converter employing the processing element.

Data conversion circuits are also extremely useful. FIG. 42 shows a Serial Pulse Stream to Parallel Pulse Stream Converter 136. The signals on input line IN, which are shown at times $T_1 \ldots T_N$, are distributed in sequence throughout lines 1 ... N, appearing on output lines OUT1 ... OUTN with the same relative delays, $T_i - T_{i-1}$. Nodes 2 ... N require both excitatory synapses to be enabled in order to fire. Node 1 is held at a resting potential until the first AP arrives on its excitatory synapse. Node 1 fires an AP on OUT1 which is connected to the inhibitory synapse on node 1 and a second excitatory synapse on node 2. The AP stops node 1 from firing again until reset, and enables node 2. The second spike arriving on input line IN will bypass node 1, which is now inactive, and be received at node 2. Since the second excitatory synapse of node 2 has been enabled, it fires an AP. The delay between the AP of node 1 and the AP of node 2 is equal to the delay between the first and second spikes on the input line. The AP from node 2 feeds back to the second excitatory synapse on node 2 to disable it until it is re-enabled, and enables the second excitatory synapse on node 3. This process continues until the Nth signal arrives. The output from node N is connected to a shunting synapse and also resets the inhibitory synapse on node 1, enabling node 1 for the next input spike. The shunting synapse returns node 1 to the resting state and the cycle begins again with the next incoming AP.

FIG. 42 also shows a single node AND/OR coincidence gate 95. The coincidence gate is biased to fire on receipt of any EPSP and therefore performs a Parallel Pulse Stream to Serial Pulse Stream conversion.

Figure 43:
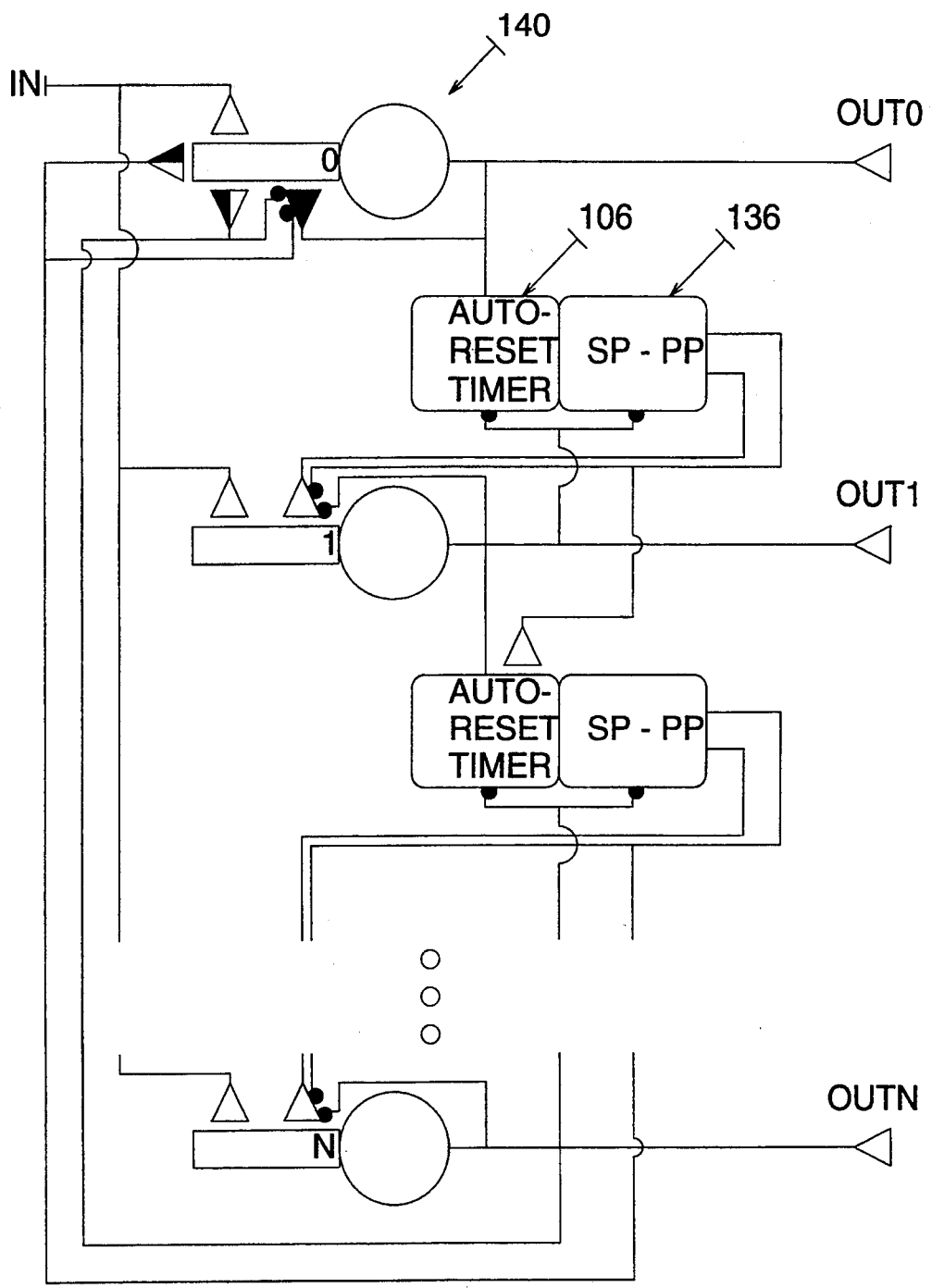
FIG. 43 is a block diagram of serial digital to parallel pulse stream converter employing the processing element.

FIG. 43 shows a Serial Digital to Parallel Pulse Stream Converter 140. Unlike the previous converters, the signal arriving on the input line, IN, is a digital signal. Thus, the presence or absence of an AP implies a high or low digital bit. A single hillock is used to convert each rising edge of the digital signal to an AP.

A start pulse activates the system by firing the excitatory synapse on node 0, which causes node 0 to fire on line OUT0. The output of node 0 feeds back to the inhibitory synapse on node 0. This prevents any further APs from activating node 0, until the inhibitory synapse is reset. The output of node 0 also starts the auto-reset timer 106. The period of the AT is set to be the digitization rate of the digital signal. The AT sends two serial pulses delayed by the period of the clock signal to the Serial Pulse Stream to Parallel Pulse Stream (SP-PP) converter 136 with n=2. The first pulse from the converter enables the excitatory synapse on node 1. If an AP arrives on the input line, IN, when the excitatory synapse is enabled, the node becomes enabled. This activity is fed back to reset the enable synapse on the input to node 1, as well as resetting the AT and the SP-PP converter of node 0. The output from node 1 also enables the AT of node 2. If an AP does not arrive on IN, the timer elapses and the second AP from the AT on node 0 is sent to reset the excitatory synapse on node 1. The second AP also starts the AT of node 2. The process continues until the Nth processor is reached. The line OUTN and the second line from the SP-PP converter feed back to shunting synapses on node 1, and also reset the inhibitory synapse on node 0.

Figure 44:
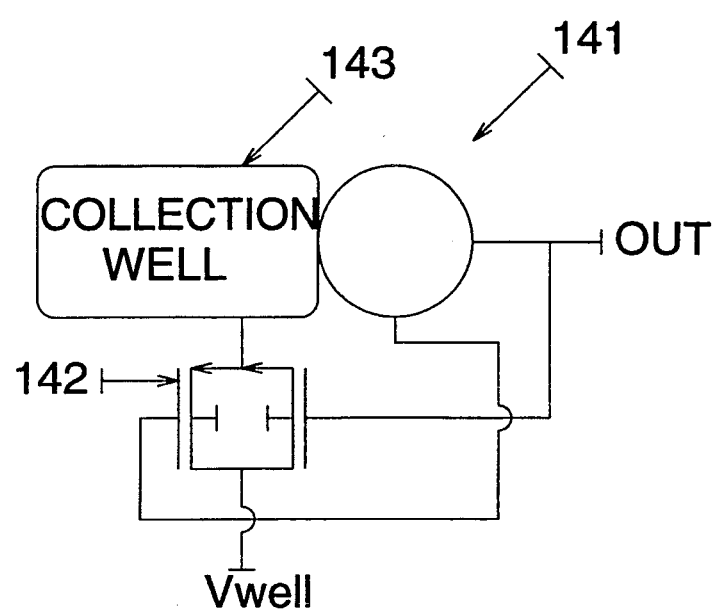
FIG. 44 is a block diagram of an electromagnetic radiation to pulse stream converter employing the processing element.

FIG. 44 shows an Electromagnetic Radiation to Pulse Stream converter 141. Electromagnetic radiation incident on the collection well 143 causes a charge to accumulate in the well, producing a voltage input to the axon hillock. If the voltage exceeds a threshold, the hillock becomes active. This produces an AP stream on the output line OUT. The activity also feeds back to the pass transistor 142 and enables it. This causes the collection well to be reset to Vwell. This allows for the asynchronous conversion of electromagnetic radiation such as visible light to an AP stream.

EXAMPLE 10

Figure 45:
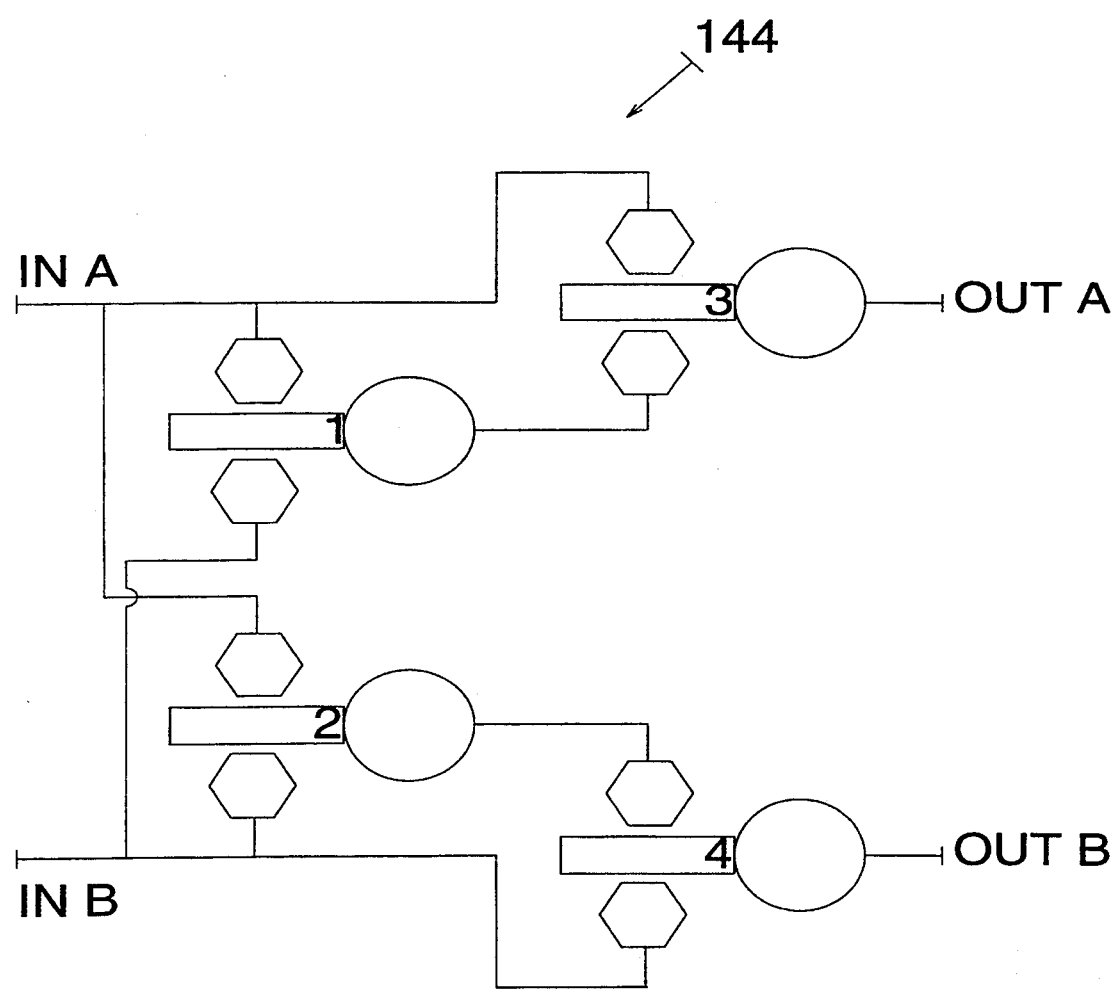
FIG. 45 is a block diagram of a spatial feature extractor employing the processing element.

It is useful to extract spatial and temporal features from multi-dimensional data. FIG. 45 shows a spatial feature extractor 144. The input lines INA and INB correspond to two spatially adjacent PEs. The activity of A and B is fed through synapse triads to nodes 1 and 2, allowing any correlation operation to be performed on the inputs at nodes 1 and/or 2. The outputs of nodes 1 and 2 reflect any correlation or anti-correlation of the two input signals which happen to be of interest. The correlation information output by node 1 can then be correlated in another desired manner with signal INA by node 3 and the result output to OUTA. The correlation information output by node 2 can be correlated with signal INB by node 4, with output to OUTB. Any number of neighbor correlations and metacorrelations can be processed by employing an additional level of nodes subsequent to the level of node 3 and node 4.

Figure 46:
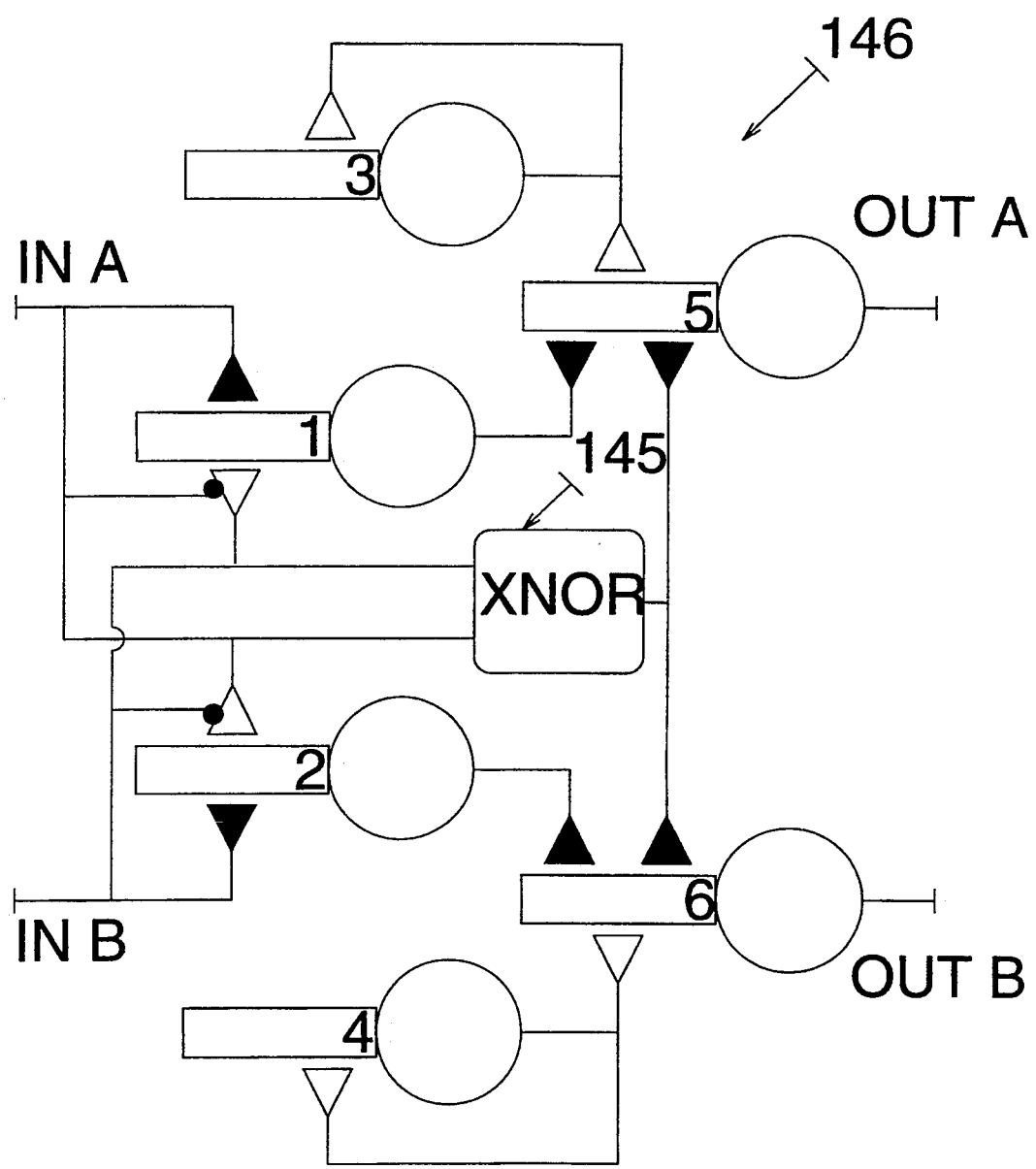
FIG. 46 is a block diagram of a temporal feature extractor employing the processing element.

FIG. 46 shows a temporal feature extractor 146. Again, INA and INB are considered to correspond to spatially adjacent cells. The function of the circuit is to detect motion across the adjacent cells. INA excites node 2 and inhibits node 1 while INB does the opposite. Node 1 inhibits node 5 (which is stimulated by oscillating node 3) and thereby slows or stops output on OUTA. Node 2 inhibits node 6 (which is stimulated by oscillating node 4) and thereby slows or stops output on OUTB. When INA and INB are dissimilar, OUTA or OUTB is firing according to which of INA or INB is dominant. When INA and INB are similar, the XNOR circuit 146 (which is simply XOR circuit 93 piped to an inverter circuit 94) causes nodes 5 and 6 to stop firing. When INA and INB are dissimilar for a long period (as would occur in sensory detection of an edge), OUTA or OUTB, depending on dominance of INA or INB, will be firing rapidly. If the dissimilarity is short, INA or INB will be firing more slowly.

EXAMPLE 11

Figure 47:
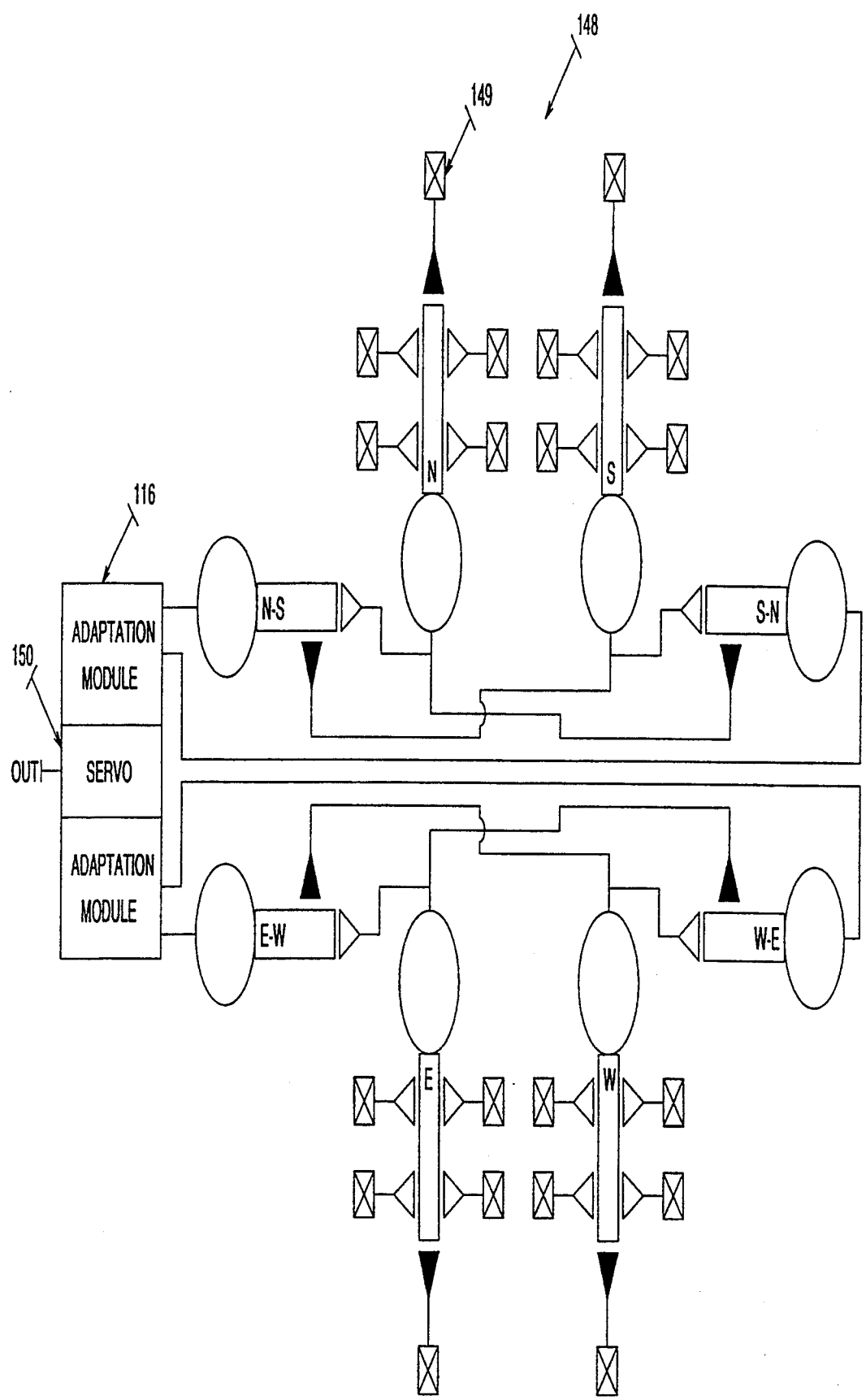
FIG. 47 is a block diagram of an X-Y position controller employing the processing element.

Practical problems often require the systems developed with the PEs of the present invention to cause actions in the outside world, such as three dimensional positioning. FIG. 47 illustrates an X-Y position controller 148. The circuit comprises a servo 160 for controlling the X-Y position of a input collection device on a point within a two-dimensional grid. The circuit further comprises ORed inputs 149 representing levels of activity (e.g., video, audio, radio, etc.) along a horizontal or vertical line through the target grid. North, South, East, and West nodes detect overall levels of activity in the corresponding hemisphere of the grid, and provide excitatory and inhibitory input to servo controlling directional nodes, which operate on the two servos (NS, EW) via adaptation modules 116. This system can be expanded to higher dimensions.

Figure 48:
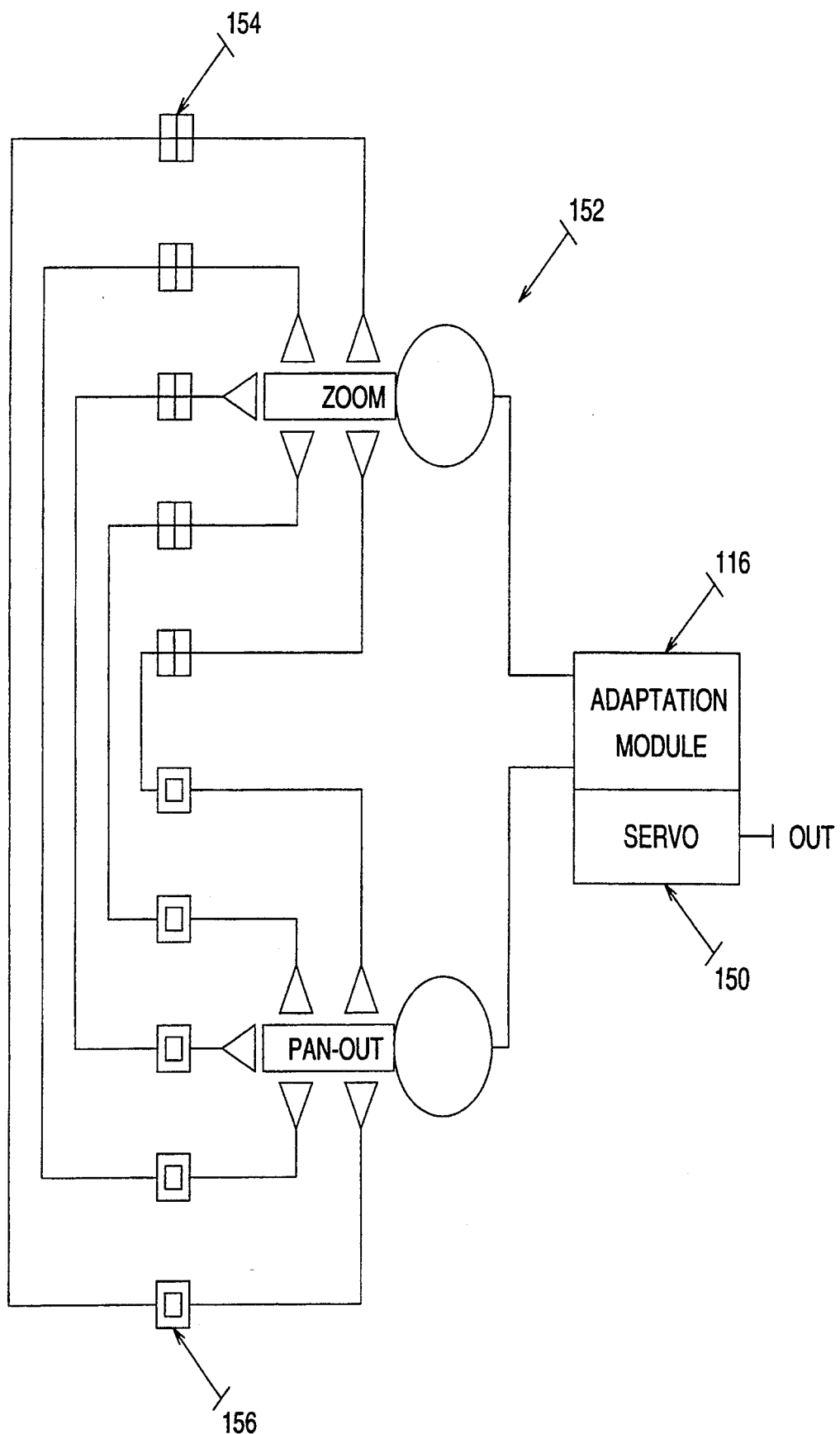
FIG. 48 is a block diagram of a Z position controller employing the processing element.

FIG. 48 illustrates a Z position controller 152. The circuit also comprises a servo 150, but one designed for focusing of a sensor on a point at a distance closer to or farther away from the sensor. Inputs to the system are through ORed inputs 154 representing levels of activity at the outer edges of squares of varying widths, the squares being nested within one another. The ORed inputs supply signals to excitatory synapses on a ZOOM node as well as to inverters 156 which in turn supply signals to a PAN-OUT node. The ZOOM and PAN-OUT nodes operate on the servo via an adaptation module 116. This system may be expanded to be used to focus on more complex geometric objects.

EXAMPLE 12

Figure 49:
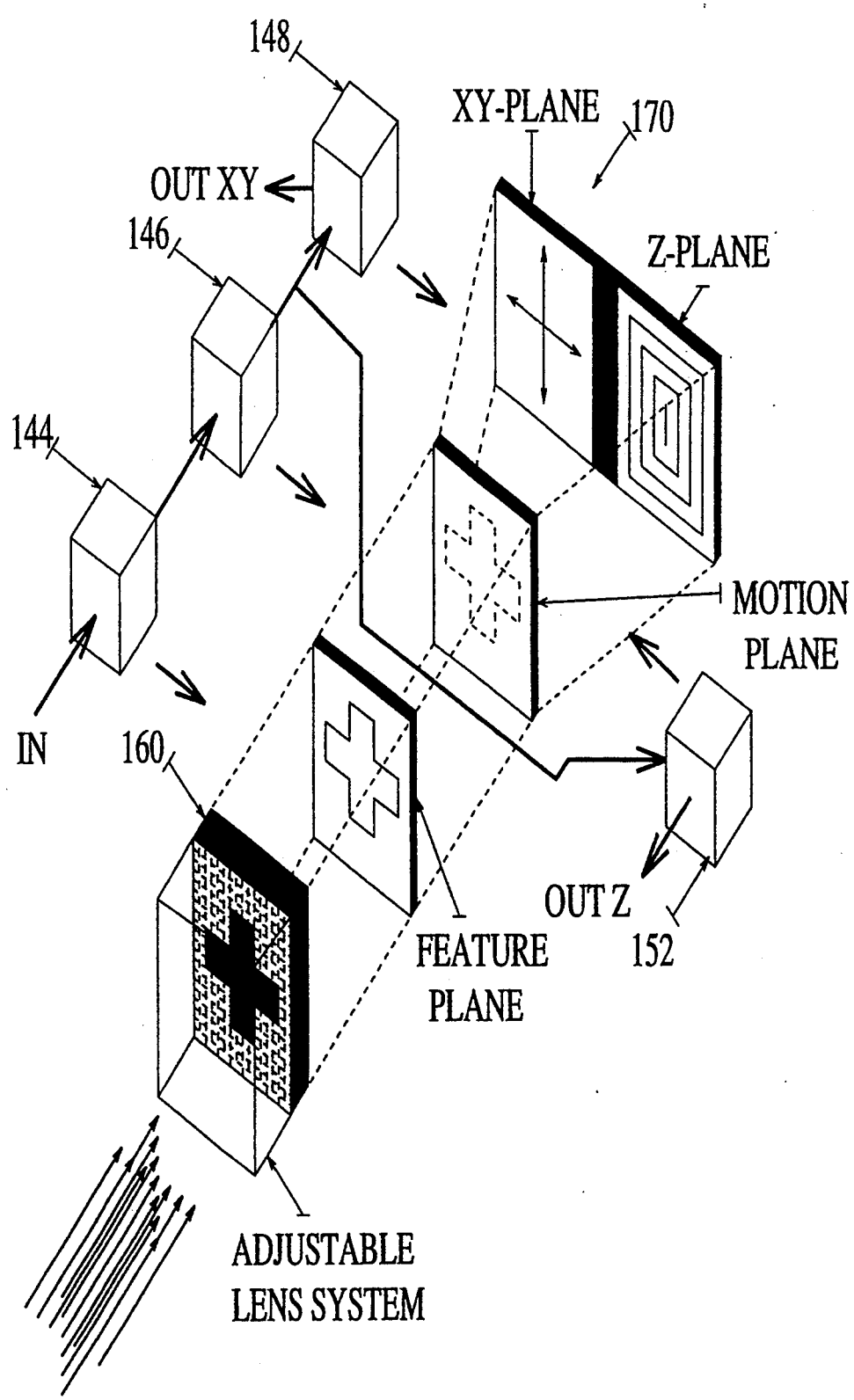
FIG. 49 is a block diagram of a retinal processor employing the processing element.

A coupled-grid retinal processor 170, illustrated in FIG. 49, is constructible from the processing element of the present invention. An example retinal processor is formed by combining the subsystems of Example 10 and Example 11. The retinal processor provides real-time visual processing capabilities. The system is a multi-layered network of PEs.

The circuit comprises an interface system 160 which comprises an array of electromagnetic radiation to pulse stream converters 141 for real-time image data gathering and processing and a variation of the serial digital to parallel pulse stream converter 140. The latter is useful for the processing of stored digital image data rather than analog visual data. The output of the interface system is provided to spatial feature detection systems 144, which in turn provides data to temporal feature detection systems 146, which then provides data to both X-Y position controller 148 and Z position controller 152. The position controllers then supply commands to mechanical actuators for system positioning.

The system performs four basic functions: feature enhancement and extraction; motion detection and velocity measurements; target tracking; and system focal length adjustment. These functions are the principal components of the motivating task of the retinal system: the tracking and enhancement of non-uniform objects with various background conditions. The time-dependent nature of the PEs of the present invention allows the system to extract information from the temporal as well as spatial characteristics of the input signals. Utilization of the temporal characteristics of the input often produces more efficient solutions than could be produced using static, time invariant input signals.

The input layer of the system is a two-dimensional array of the electromagnetic radiation to pulse stream converters 141 that produces an AP stream in response to photon absorption. Intermediate layers of the system are locally highly connected and globally sparsely connected. Each layer may obtain inputs from and provide outputs to any other layer in the system. The local connections take the form of task-specific subsystems designed to address the, spatio-temporal characteristics of a node and its nearest neighbors. The local connection subsystem for feature extraction and enhancement amplifies the similarities and attenuates the differences between neighbors 144. Motion detection and velocity measurements are done by highlighting the temporal differences between a node and its neighbors 146.

The X-Y 148 and Z 152 position control subsystems are both implemented by imposing global constraints on the input layer. The output of the subsystems under these constraints interfaces with the servo control system which balances the constraints by moving or changing the focal length of the lens system.

The real-time processing capability of the retinal system stems directly from its inherently parallel architecture. Receiving input data in parallel greatly reduces time needed to prepare inputs when compared to serial data input. Real-time parallel processing of the input data also allows the system to capture subtle temporal characteristics that might be lost through serialization. Since the gathered charge is viewed directly, the "smearing" effect associated with CCD cameras is not an issue. This gives the system a higher effective resolution than a comparable serial CCD system.

This example discusses a retinal processing system as it applies to visual light. By adjusting the DC biases, the system can be applied to input wavelengths from at least $3E^{-3}$ to $3E^9$ meters.

EXAMPLE 13

Figure 50:
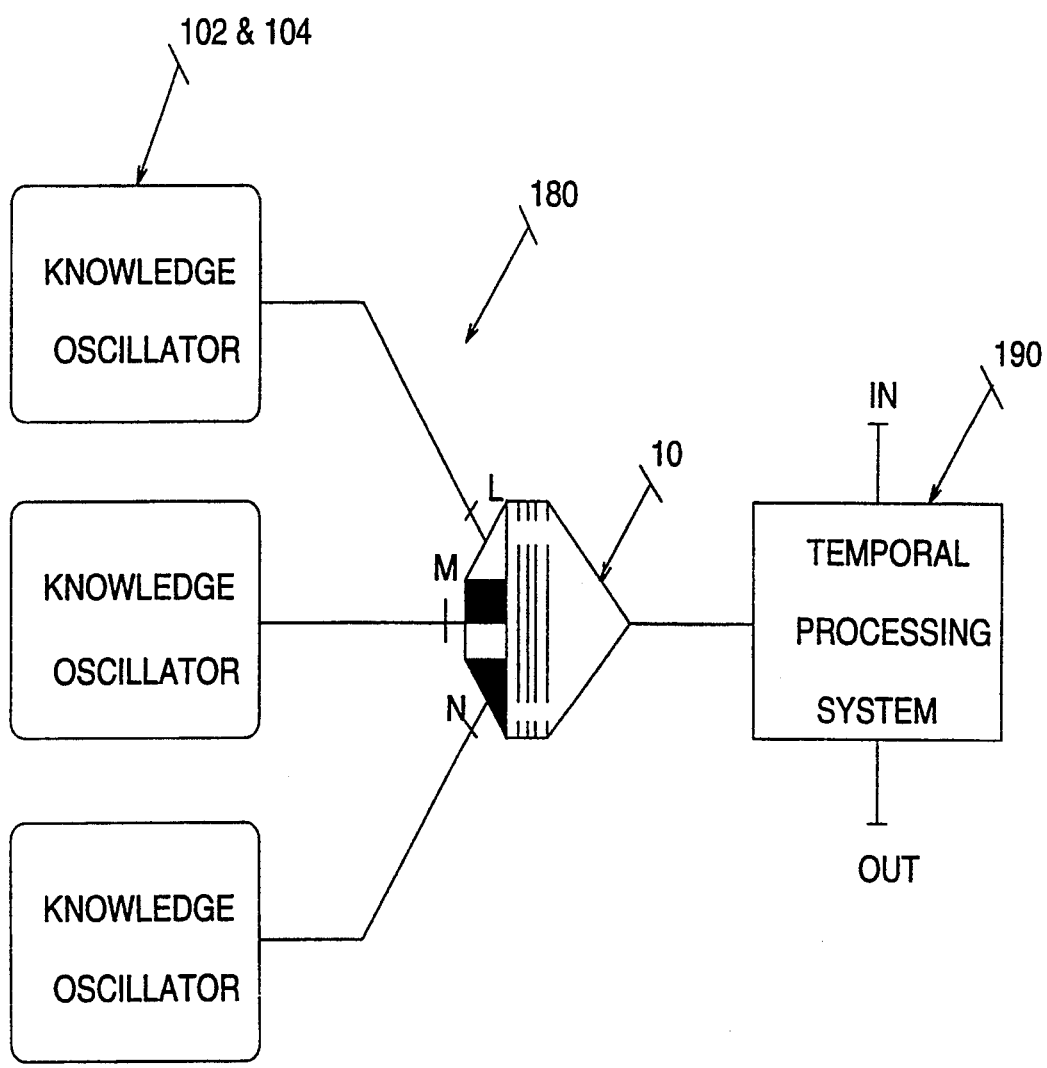
FIG. 50 is a block diagram of a general programming system employing the processing element.

As in all data processing systems it is desirable to program a particular sequence of behaviors. FIG. 50 illustrates a general purpose system 180, useful for programming any system 190 (whether or not made up of the PEs of the present invention). For illustration purposes, in FIG. 50 system 190 has been shown as a temporal processing system. The coupled and uncoupled data oscillators 102 and 104 illustrated in FIGS. 26 and 27 can be thought of as storing patterns of information which, when provided to an adaptation module 10, constitute continuous programs. The programs provide instructions to the adaptation module which controls a bias parameter of system 190, which in turn dictates system behavior.

Figure 51:
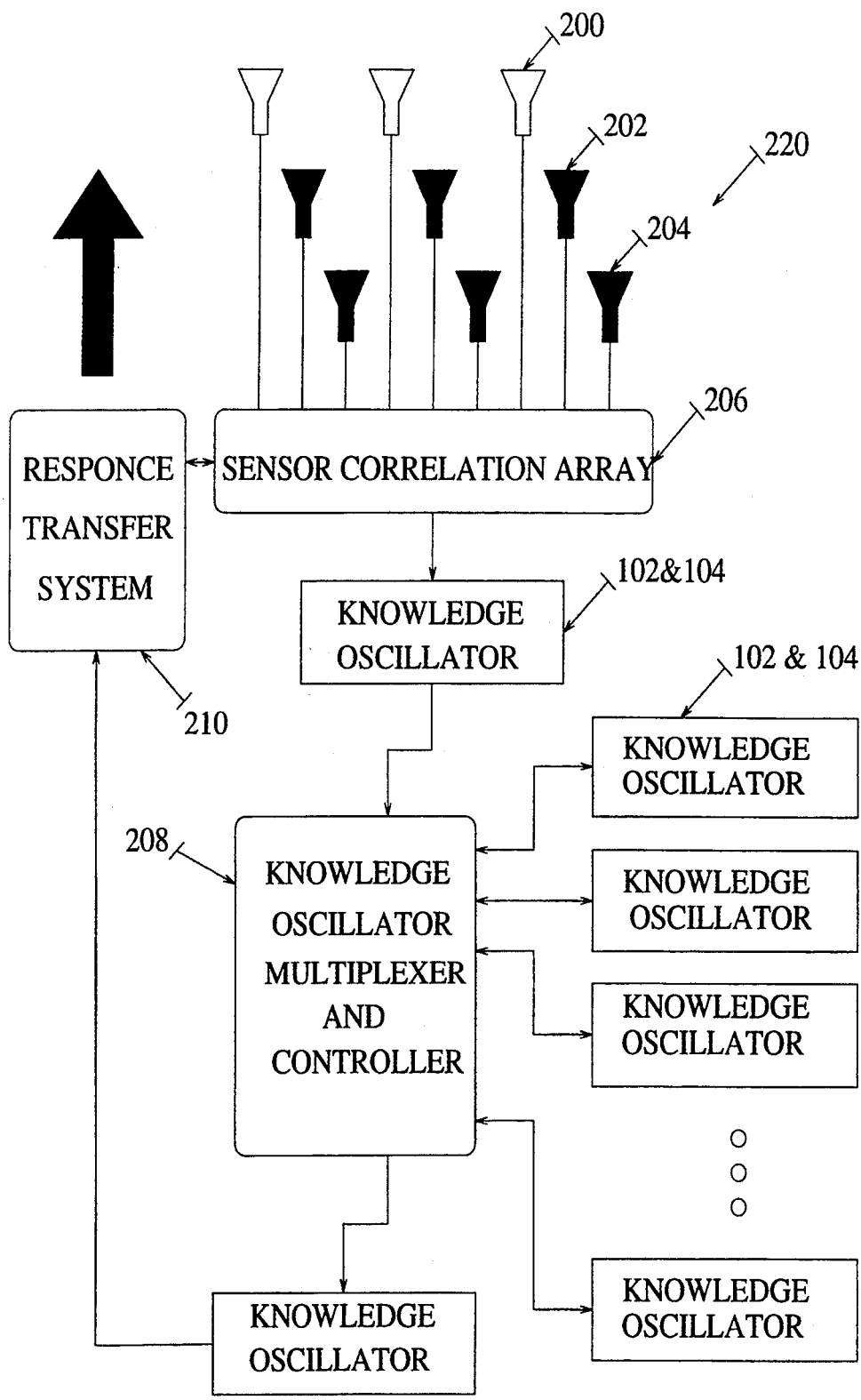
FIG. 51 is a block diagram of a general cognition machine employing the processing element.
Figure 52:
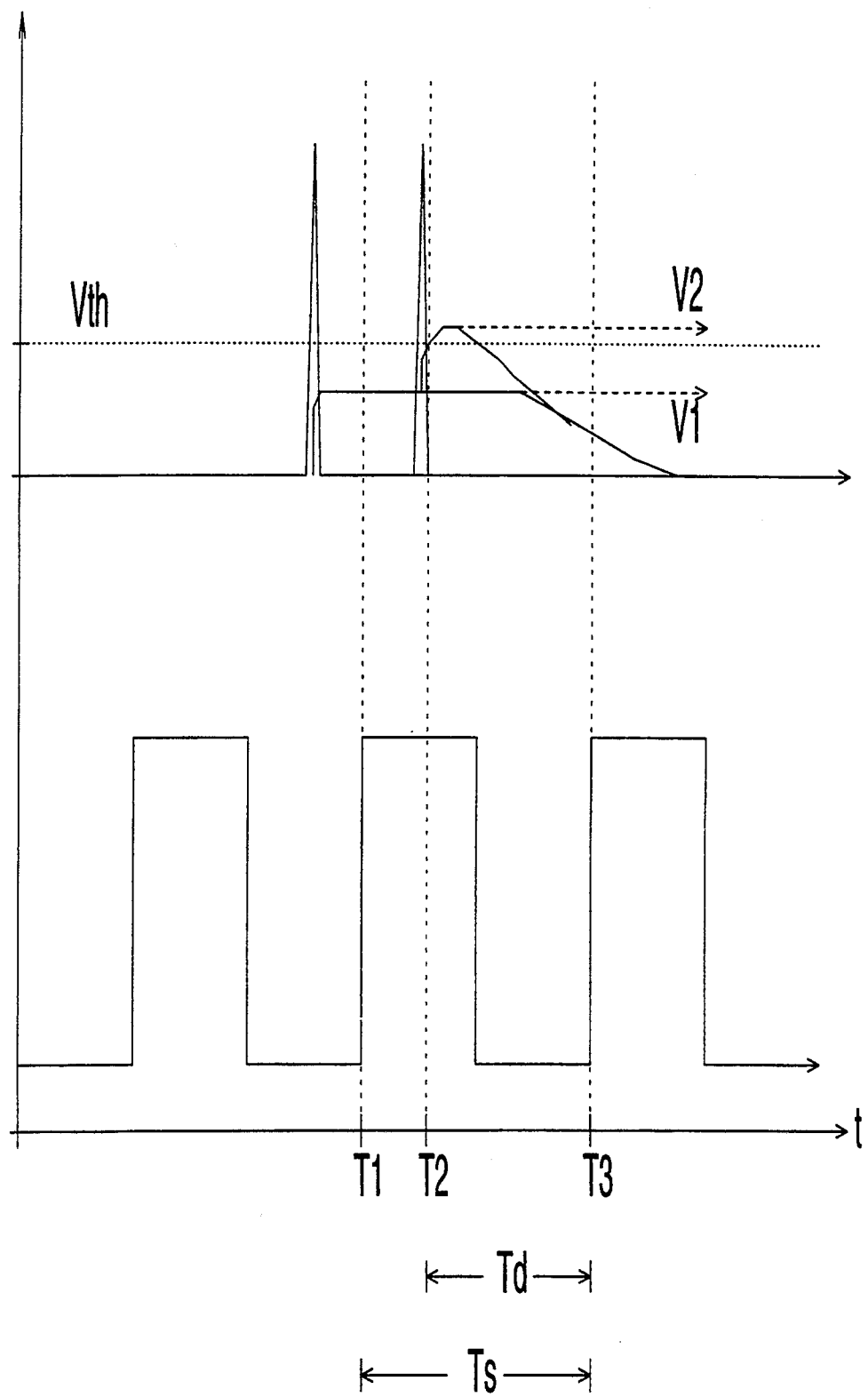
FIG. 52 Is a signal diagram demonstrating disadvantages of conventional digital signal processing.
Figure 53:
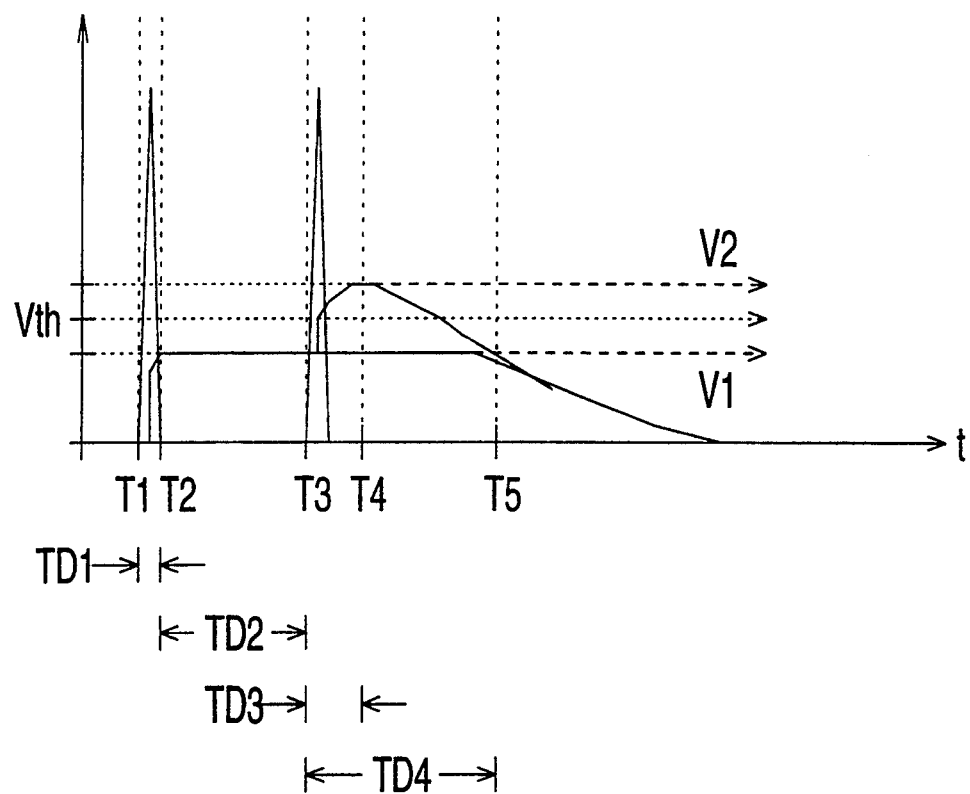
FIG. 53 is a signal diagram demonstrating disadvantages of conventional analog signal processing.

FIG. 51 illustrates a general cognition system 220 that also utilizes the data oscillators 102 and 104. The system takes in real-time environmental stimulus from a variety of sensor arrays 200, 202, and 204 and provides a response stimulus to the environment. The sensors arrays provide data to sensor correlation array 206 which constructs an overall synthesis of the external stimulus to a present-state knowledge oscillator, which may be either coupled or uncoupled. The knowledge oscillator multiplexor and controller 208 interfaces with the present-state knowledge oscillator and an array of knowledge oscillators for storing patterns. A correlated pattern is output from the multiplexor and controller, which includes a program for driving response transfer system 210, such as a servo mechanism.

EXAMPLE 14

The schematic of the preferred PE of the present invention shown in FIG. 9 is fully defined by the following SPICE simulation file for the circuit and by the following MOSFET node equations corresponding to the correspondingly labeled points in the schematic:

Excitatory Synapse
```
** SPICE file created for circuit esyn
** Technology: scmos
**
** NODE: 0 = GND
** NODE: 1 = Vdd
** NODE: 2 = Error
M0 100 1 101 0 nfet L=11.0U W=5.0U
```

-continued

```
M1  0 102 103 0 nfet L=2.0U W=10.0U
M2  102 102 0 0 nfet L=2.0U W=5.0U
M3  0 104 102 0 nfet L=2.0U W=10.0U
M4  102 105 106 0 nfet L=2.0U W=10.0U
M5  101 103 1 1 pfet L=2.0U W=10.0U
M6  0 106 0 0 nfet L=10.0U W=10.0U
M7  1 103 103 1 pfet L=2.0U W=5.0U
M8  0 1 106 0 nfet L=2.0U W=5.0U
M9  104 107 1 0 nfet L=2.0U W=20.0U
M10 0 108 104 0 nfet L=2.0U W=5.0U
M11 0 104 0 0 nfet L=10.0U W=10.0U
M12 102 109 1 1 pfet L=2.0U W=5.0U
M13 0 110 104 0 nfet L=2.0U W=5.0U
M14 1 109 109 1 pfet L=2.0U W=5.0U
M15 111 107 1 0 nfet L=2.0U W=10.0U
M16 0 112 111 0 nfet L=5.0U W=5.0U
M17 0 111 0 0 nfet L=10.0U W=10.0U
M18 0 110 111 0 nfet L=2.0U W=5.0U
M19 109 111 0 0 nfet L=2.0U W=10.0U
** NODE: 112 = m2
C0 111 0 43F
** NODE: 111 = !4
C1 110 0 23F
** NODE: 110 = m14
C2 109 0 41F
** NODE: 109 = !5
** NODE: 107 = m1
C3 108 0 22F
** NODE: 108 = !14
C4 106 0 39F
** NODE: 106 = !8
** NODE: 105 = !7
C5 101 0 37F
** NODE: 101 = !10
C6 104 0 50F
** NODE: 104 = m17
C7 103 0 45F
** NODE: 103 = !9
C8 1 0 123F
** NODE: 1 = Vdd!
C9 100 0 13F
** NODE: 100 = !20
C10 102 0 54F
** NODE: 102 = !6
** NODE: 0 = GND!
*
* analysis
vin 107 0 pulse(0 5 10n 0.2n 0.2n 2.5n 10000n)
vdc1 112 0 dc 0.8v
vdc2 105 0 dc 3.0v
vdc3 108 0 dc 5.0v
vdc4 110 0 dc 0.0v
*vr 110 0 pulse(0 5 50n 0.2n 0.2n 2.5n 100n)
vdc5 100 0 dc 1.0v
Vdd 1   0 dc 5.0v
.options itl5=0
.tran 1.0n 1500n 0.0n 1.0n
.step vdc1 0 5 .2
.probe v(107) v(111) v(109) v(102) v(106) v(103) v(101) v(104) v(110)
*
*
.MODEL nfet NMOS LEVEL=2 LD=0.250000U TOX=409.000008E-10
+ NSUB=9.618740E+14 VTO=0.838473 KP=4.551000E-05 GAMMA=0.2116
+ PHI=0.6 UO=539 UEXP=0.102074 UCRIT=93907.4
+ DELTA=1.62282 VMAX=76566.1 XJ=0.250000U LAMBDA=4.954671E-03
+ NFS=1.086360E+12 NEFF=1 NSS=1.000000E+10 TPG= 1.000000
+ RSH=27.530000 CGDO=3.166085E-10 CGSO=3.166085E-10 CGBO=4.061267E-10
+ CJ=8.657000E-05 MJ=0.796110 CJSW=4.985600E-10 MJSW=0.342724 PB=0.800000
*
*
.MODEL pfet PMOS LEVEL=2 LD=0.250000U TOX=409.000008E-10
+ NSUB=1.124300E+16 VTO=-0.848423 KP=2.094000E-05 GAMMA=0.7236
+ PHI=0.6 UO=265 UEXP=0.294641 UCRIT=54996.8
+ DELTA=4.886458E-02 VMAX=100000 XJ=0.250000U LAMBDA=5.144312E-02
+ NFS=1.198081E+12 NEFF=1.001 NSS=1.000000E+10 TPG= -1.000000
+ RSH=66.580000 CGDO=3.166085E-10 CGSO=3.166085E-10 CGBO=4.274259E-10
+ CJ=3.208700E-04 MJ=0.592940 CJSW=3.06660E-10 MJSW=0.294696 PB=0.800000
*
.end
```

Inhibitory Synapse

```
** SPICE file created for circuit isyn
** Technology: scmos
```

-continued

```
**
** NODE: 0 = GND
** NODE: 1 = Vdd
** NODE: 2 = Error
M0   0   100 101 0 nfet L=2.0U  W=10.U
M1   100 100 0   0 nfet L=2.0U  W=5.0U
M2   0   102 100 0 nfet L=2.0U  W=10.0U
M3   100 103 104 0 nfet L=2.0U  W=10.0U
M4   101 0   105 1 pfet L=11.0U W=5.0U
M5   0   104 0   0 nfet L=10.0U W=10.0U
M6   0   1   104 0 nfet L=2.0U  W=5.0U
M7   102 106 1   0 nfet L=2.0U  W=20.0U
M8   0   107 102 0 nfet L=2.0U  W=5.0U
M9   0   102 0   0 nfet L=10.0U W=10.0U
M10  100 108 1   1 pfet L=2.0U  W=5.0U
M11  0   109 102 0 nfet L=2.0U  W=5.0U
M12  1   108 108 1 pfet L=2.0U  W=5.0U
M13  110 106 1   0 nfet L=2.0U  W=10.0U
M14  0   111 110 0 nfet L=5.0U  W=5.0U
M15  0   110 0   0 nfet L=10.0U W=10.0U
M16  0   109 110 0 nfet L=2.0U  W=5.0U
M17  108 110 0   0 nfet L=2.0U  W=10.0U
** NODE: 111=m2
C0 110 0 43F
** NODE: 110 = !4
C1 109 0 23F
** NODE: 109 = m14
C2 108 0 41F
** NODE: 108 = !5
** NODE: 106 = m1
C3 107 0 22F
** NODE: 107 = !14
C4 105 0 16F
** NODE: 105 = !20
C5 104 0 39F
** NODE: 104 = !8
** NODE: 103 = !7
C6 1 0 89F
** NODE: 1 = Vdd!
C7 102 0 50F
** NODE: 102 = m17
C8 101 0 34F
** NODE: 101 = !9
C9 100 0 54F
** NODE: 100 = !6
** NODE: 0 = GND!
*
* analysis
vin 106 0 pulse(0 5 10n 0.2n 0.2n 2.5n 100n)
vdc1 111 0 dc 0.8v
vdc2 103 0 dc 1.2v
vdc3 107 0 dc 5.0v
*vdc4 109 0 dc 0.0v
vr 109 0 pulse(0 5 50n 0.2n 0.2n 2.5n 100n)
vdc5 105 0 dc 5.0v
Vdd  1   0 dc 5.0v
.options itl5=0
.tran 0.1n 150n 0.0n 0.1n
*.step vdc3 0 5 .2
.probe v(106) v(110) v(108) v(100) v(104) v(101) v(102) v(109)
*
*
*
.MODEL nfet NMOS LEVEL=2 LD=0.250000U TOX=409.000008E-10
+ NSUB=9.618740E+14 VTO=0.838473 KP=4.551000E-05 GAMMA=0.2116
+ PHI=0.6 UO=539 UEXP=0.102074 UCRIT=93907.4
+ DELTA=1.62282 VMAX=76566.1 XJ=0.250000U LAMBDA=4.954671E-03
+ NFS=1.086360E+12 NEFF=1 NSS=1.000000E+10 TPG=1.000000
+ RSH=27.530000 CGDO=3.166085E-10 CGSO=3.166085E-10 CGBO=4.061267E-10
+ CJ=8.657000E-05 MJ=0.796110 CJSW=4.985600E-10 MJSW=0.342724 PB=0.800000
*
*
.MODEL pfet PMOS LEVEL=2 LD=0.250000U TOX=409.000008E-10
+ NSUB=1.124300E+16 VTO=-0.848423 KP=2.094000E-05 GAMMA=0.7236
+ PHI=0.6 UO=265 UEXP=0.294641 UCRIT=54996.8
+ DELTA=4.886458E-02 VMAX=100000 XJ=0.250000U LAMBDA=5.144312E-02
+ NFS = 1.198081E+12 NEFF=1.001 NSS=1.000000E+10 TPG=-1.000000
+ RSH=66.580000 CGDO=3.166085E-10 CGSO=3.166085E-10 CGBO=4.274259E-10
+ CJ=3.208700E-04 MJ=0.592940 CJSW=3.066600E-10 MJSW=0.294696 PB=0.800000
*
.end
```
Shunting Synapse -continued

```
** SPICE file created for circuit ssyn
** Technology: scmos
**
** NODE: 0 = GND
** NODE: 1 = Vdd
** NODE: 2 = Error
M0 0 100 101 0 nfet L=2.0U W=10.0U
M1 100 100 0 0 nfet L=2.0U W=5.0U
M2 0 102 100 0 nfet L=2.0U W=10.0U
M3 100 103 104 0 nfet L=2.0U W=10.0U
M4 101 0 105 1 pfet L=11.0U W=5.0U
M5 0 104 0 0 nfet L=10.0U W=10.0U
M6 0 1 104 0 nfet L=2.0U W=5.0U
M7 102 106 1 0 nfet L=2.U W=20.0U
M8 0 107 102 0 nfet L=2.0U W=5.0U
M9 0 102 0 0 nfet L=10.0U W=10.0U
M10 100 108 1 1 pfet L=2.0U W=5.0U
M11 0 109 102 0 nfet L=2.0U W=5.0U
M12 1 108 108 1 pfet L=2.0U W=5.0U
M13 110 106 1 0 nfet L=2.0U W=10.0U
M14 0 111 110 0 nfet L=5.0U W=5.0U
M15 0 110 0 0 nfet L=10.0U W=10.0U
M16 0 109 110 0 nfet L=2.0U W=5.0U
M17 108 110 112 0 nfet L=2.0U W=10.0U
** NODE: 111 = m2
C0 110 0 43F
** NODE: 110 = !4
C1 109 0 23F
** NODE: 109 = m14
C2 108 0 41F
** NODE: 108 = !5
** NODE: 106 = m1
C3 107 0 22F
** NODE: 107 = !14
C4 105 0 16F
** NODE: 105 = !20
C5 104 0 39F
** NODE: 104 = !8
** NODE: 103 = !7
C6 1 0 89F
** NODE: 1 = Vdd!
C7 102 0 50F
** NODE: 102 = m17
C8 101 0 34F
** NODE: 101 = !9
C9 100 0 54F
** NODE: 100 = !6
** NODE: 112 = !25
C10 112 0 14F
** NODE: 0 = GND!
*
* analysis
vin 106 0 pulse(0 5 10n 0.2n 0.2n 2.5n 100n)
vdc1 111 0 dc 0.8v
vdc2 103 0 dc 1.2v
vdc3 107 0 dc 5.0v
*vdc4 109 0 dc 0.0v
vr 109 0 pulse(0 5 50n 0.2n 0.2n 2.5n 100n)
vdc5 105 0 dc 5.0v
vdc6 112 0 dc 5.0v
Vdd 1   0 dc 5.0v
.options itl5=0
.tran 0.1n 150n 0.0n 0.1n
*.step vdc3 0 5 .2
.probe v(106) v(110) v(108) v(100) v(104) v(101) v(102) v(109)
*
*
*
.MODEL nfet NMOS LEVEL=2 LD=0.250000U TOX=409.000008E-10
+ NSUB=9.618740E+14 VTO=0.838473 KP=4.551000E-05 GAMMA=0.2116
+ PHI=0.6 UO=539 UEXP=0.102074 UCRIT=93907.4
+ DELTA=1.62282 VMAX=76566.1 XJ=0.250000U LAMBDA=4.954671E-03
+ NFS=1.086360E+12 NEFF=1 NSS=1.000000E+10 TPG=1.000000
+ RSH=27.530000 CGDO=3.166085E-10 CGSO=3.166085E-10 CGBO=4.061267E-10
+ CJ=8.657000E-05 MJ=0.796110 CJSW=4.985600E-10 MJSW=0.342724 PB=0.800000
*
*
.MODEL pfet PMOS LEVEL=2 LD=0.250000U TOX=409.000008E-10
+ NSUB=1.124300E+16 VTO=-0.848423 KP=2.094000E-05 GAMMA=0.7236
+ PHI=0.6 UO=265 UEXP=0.294641 UCRIT=54996.8
+ DELTA=4.886458E-02 VMAX=100000 XJ=0.250000U LAMBDA=5.144312E-02
+ NFS = 1.198081E+12 NEFF=1.001 NSS=1.000000E+10 TPG=-1.000000
```

+ RSH=66.580000 CGDO=3.166085E-10 CGSO=3.166085E-10 CGBO=4.274259E-10
+ CJ=3.208700E-04 MJ=0.592940 CJSW=3.066600E-10 MJSW=0.294696 PB=0.800000
*
.end Axon Hillock
** SPICE file created for circuit hillock
** Technologh: scmos
**
** NODE: 0 = GND
** NODE: 1 = Vdd
** NODE: 2 = Error
M0 1 100 101 1 pfet L=2.0U W=20.0U
M1 101 100 1 1 pfet L=2.0U W=20.0U
M2 0 100 101 0 nfet L=2.0U W=10.0U
M3 100 102 1 1 pfet L=2.0U W=25.0U
M4 0 102 100 0 nfet L=2.0U W=25.0U
M5 102 103 1 1 pfet L=2.0U W=10.0U
M6 0 104 102 0 nfet L=5.0U W=6.0U
M7 1 105 103 1 pfet L=2.0U W=10.0U
M8 105 106 1 1 pfet L=2.0U W=5.0U
M9 1 103 107 1 pfet L=2.0U W=5.0U
M10 0 105 103 0 nfet L=2.0U W=10.0U
M11 105 106 0 0 nfet L=5.0U W=5.0U
M12 106 103 1 1 pfet L=2.0U W=15.0U
M13 1 108 106 1 pfet L=2.0U W=10.0U
M14 0 109 107 0 nfet L=5.0U W=5.0U
M15 107 110 0 0 nfet L=2.0U W=10.0U
M16 106 106 1 1 pfet L=5.0U W=5.0U
M17 0 107 0 0 nfet L=10.0U W=10.0U
M18 111 106 1 1 pfet L=2.0U W=10.0U
M19 0 107 111 0 nfet L=2.0U W=10.0U
M20 111 112 1 0 nfet L=2.0U W=10.0U
M21 0 113 111 0 nfet L=5.0U W=5.0U
M22 111 105 0 0 nfet L=2.0U W=5.0U
M23 0 114 111 0 nfet L=2.0U W=10.0U
M24 106 111 0 0 nfet L=2.0U W=20.0U
** NODE: 113 = 3!
** NODE: 114 = 14!
** NODE: 112 = 2!
C0 111 0 87F
** NODE: 111 = 4!
** NODE: 110 = 16!
** NODE: 109 = 12!
C1 108 0 26F
** NODE: 108 = 15!
C2 107 0 53F
** NODE: 107 = 13!
C3 106 0 132F
** NODE: 106 = 5!
C4 105 0 59F
** NODE: 105 = 6!
** NODE: 104 = 9!
C5 103 0 68F
** NODE: 103 = 7!
C6 102 0 54F
** NODE: 102 = 8!
** NODE: 0 = GND!
C7 101 0 63F
** NODE: 101 = 11!
C8 100 0 109F
** NODE: 100 = 10!
C9 1 0 296F
** NODE: 1 = Vdd!
*
* analysis
vin 112 0 pulse(1 1.0 10n 400n 90000n 10000n)
vdc1 113 0 dc 1.4v
vdc2 114 0 dc 0.0v
vdc3 108 0 dc 5.0v
vdc4 110 0 dc 0.0v
vdc5 104 0 dc 5.0v
vdc6 109 0 dc 5.0v
Vdd 1 0 dc 5.0v
.options itl5=0
.tran 1.0n 100000n 0.0n 1.0n
.step vdc1 0 5 0.2
.probe v(112) v(111) v(106) v(105) v(100) v(103) v(102) v(101) v(107)
*
*
*
.MODEL nfet NMOS LEVEL=2 LD=0.250000U TOX=409.000008E-10
+ NSUB=9.618740E+14 VTO=0.838473 KP=4.551000E-05 GAMMA=0.2116

-continued

```
+ PHI=0.6 UO=539 UEXP=0.102074 UCRIT=93907.4
+ DELTA=1.62282 VMAX=76566.1 XJ=0.250000U LAMBDA=4.954671E-03
+ NFS=1.086360E+12 NEFF=1 NSS=1.000000E+10 TPG=1.000000
+ RSH=27.530000 CGDO=3.166085E-10 CGSO=3.166085E-10 CGBO=4.061267E-10
+ CJ=8.657000E-05 MJ=0.796110 CJSW=4.985600E-10 MJSW=0.342724 PB=0.800000
*
*
*
.MODEL pfet PMOS LEVEL=2 LD=0.250000U TOX=409.000008E-10
+ NSUB=1.124300E+16 VTO=-0.848423 KP=2.094000E-05 GAMMA=0.7236
+ PHI=0.6 UO=265 UEXP=0.294641 UCRIT=54996.8
+ DELTA=4.886458E-02 VMAX=100000 XJ=0.250000U LAMBDA=5.144312E-02
+ NFS=1.198081E+12 NEFF=1.001 NSS=1.000000E+10 TPG=-1.000000
+ RSH=66.580000 CGDO=3.166085E-10 CGSO=3.166085E-10 CGBO=4.274259E-10
+ CJ=3.208700E-04 MJ=0.592940 CJSW=3.066600E-10 MJSW=0.294696 PB=0.800000
*
*
*
.end
```

Synapse Node Equations $V_0$ = Ground - Vss (0 Volts)    (2)
$V_1$ = DC Supply Voltage - Vdd (5 Volts)    (3)
$V_2$ = $V_{IN}$ (Action Potential)    (4)
$V_3$ = DC Bias Voltage - $V_{B1S}$ (0 → 5 Volts)    (5)

$$V_4 = \frac{1}{C_4} \int_{t_0}^{t_0+\tau} (I_{D1} - I_{D2} - I_{D3})dt \qquad (6)$$

$$V_5 = \frac{1}{C_5} \int_{t_0}^{t_0+\tau} (I_{D6} - I_{D5})dt \qquad (7)$$

$$V_6 = \frac{1}{C_6} \int_{t_0}^{t_0+\tau} (I_{D10} - I_{D8})dt \qquad (8)$$

$$V_7 = \frac{1}{C_7} \int_{t_0}^{t_0+\tau} (I_{D7} - I_{D10} - I_{D11})dt \qquad (9)$$

$V_8$ = DC Bias Voltage - $V_{B2S}$ (0 → 5 Volts)    (10)
$V_9$ = DC Bias Voltage - $V_{B3S}$ (0 → 5 Volts)    (11)

$$V_{10} = \frac{1}{C_{10}} \int_{t_0}^{t_0+\tau} (I_{D12} - I_{D13} - I_{D14})dt \qquad (12)$$

$V_{11}$ = RESET(H) (Action Potential)    (13)

$$V_{12} = \frac{1}{C_{12}} \int_{t_0}^{t_0+\tau} (I_{D18} - I_{D17})dt \text{ (Excitatory)} \qquad (14)$$

$V_{12}$ = $V_{OUT}$ (Inhibitory PSP)    (15)
$V_{12}$ = $V_{SOMA}$ (0 → 5 Volts DC) (Shunting)    (16)
$V_{13}$ = $V_{OUT}$ (Excitatory PSP)    (17)
$V_{13}$ = N/A (Inhibitory)    (18)
$V_{13}$ = $V_{OUT}$ (Shunting PSP)    (19)

Action Potential $$\frac{2Vdd}{T}, 0 \leq t \leq \frac{t}{2}$$

$$2Vdd\left(1 - \frac{1}{T}\right), \frac{T}{2} \leq t \leq T$$

0 , Elsewhere    (20)

Axon Hillock Node Equations $V_0$ = Ground - Vss (0 Volts)    (1)
$V_1$ = DC Supply Voltage - Vdd (5 Volts)    (2)

$$V_2 = \frac{1}{C_2} \int_{t_0}^{t_0+\tau} \left( \sum_{j=1}^{J} I_{D19E} - \sum_{k=1}^{K} I_{D17I} \pm \sum_{i=1}^{L} I_{D17S} - I_{D1} \right)dt \qquad (3)$$

$V_3$ = $V_{SOMA}$ (0 → 5 Volts DC)    (4)
$V_4$ = DC Bias Voltage - $V_{B1H}$ (0 → 5 Volts)    (5)

-continued $$V_5 = \frac{1}{C_5} \int_{t_0}^{t_0+\tau} (I_{D3} + I_{D5} - I_{D2} - I_{D4} - I_{D24} - I_{D25})dt \qquad (6)$$

$$V_6 = \frac{1}{C_6} \int_{t_0}^{t_0+\tau} (I_{D7} + I_{D8} + I_{D9} - I_{D6})dt \qquad (7)$$

$V_7 = $ RESET(L) (Action Potential) $\qquad (8)$ $$V_8 = \frac{1}{C_8} \int_{t_0}^{t_0+\tau} (I_{D10} - I_{D11})dt \qquad (9)$$

$$V_9 = \frac{1}{C_9} \int_{t_0}^{t_0+\tau} (I_{D12} - I_{D13})dt \qquad (10)$$

$V_{10} = $ DC Bias Voltage - $V_{B2H}$ (0 → 5 Volts) $\qquad (11)$ $$V_{11} = \frac{1}{C_{11}} \int_{t_0}^{t_0+\tau} (I_{D14} - I_{D15})dt \qquad (12)$$

$$V_{12} = \frac{1}{C_{12}} \int_{t_0}^{t_0+\tau} (I_{D16} - I_{D17})dt \qquad (13)$$

$V_{13} = V_{OUT}$ (Action Potential) $\qquad (14)$
$V_{14} = $ DC Bias Voltage - $V_{B3H}$ (0 → 5 Volts) $\qquad (15)$ $$V_{15} = \frac{1}{C_{15}} \int_{t_0}^{t_0+\tau} (I_{D20} - I_{D21} - I_{D22})dt \qquad (16)$$

$V_{16} = $ RESET(H) (Action Potential) $\qquad (17)$
Action Potential $$V_{13} = \frac{1}{C_{13}} \int_{t_0}^{t_0+\tau} (I_{D18} - I_{D19})dt \qquad (18)$$

Although the invention has been described with reference to these preferred embodiments, other embodiments can achieve the same results. Variations and modifications of the present invention will be obvious to those skilled in the art and it is intended to cover in the appended claims all such modifications and equivalents.

What is claimed is:

1. A neural network processing element, a plurality of which comprise a neural network, said processing element comprising:
   means for simulating one or more chemical synapses;
   means for simulating a neuron soma;
   means for simulating one or more dendrites operably connecting said means for simulating one or more chemical synapses to said means for simulating a neuron soma;
   means for simulating an axon;
   means for simulating an axon hillock operably connecting said means for simulating a neuron soma to said means for simulating an axon:
   means for receiving asynchronous signals and providing said signals to said means for simulating one or more chemical synapses; and
   means for sending asynchronous signals from said means for simulating an axon.

2. The invention of claim 1 wherein said means for simulating one or more chemical synapses comprises means for simulating one or more chemical synapses selected from the group consisting of excitatory synapses, inhibitory synapses, and shunting synapses.

3. The invention of claim 1 wherein said means for simulating one or more chemical synapses comprises means for simulating one or more presynaptic regions.

4. The invention of claim 1 wherein said means for simulating one or more chemical synapses comprises means for simulating one or more post synaptic regions.

5. The invention of claim 1 additionally comprising bias adaptation network means for dynamically controlling an operational parameter of said means for simulating an axon hillock, said operational parameter selected from the group consisting of a threshold/delay level, an action potential pulsewidth level, and a refractory period.

6. The invention of claim 1 additionally comprising bias adaptation network means for dynamically controlling an operational parameter of said means for simulating a chemical synapse, said operational parameter selected from the group consisting of a current amplitude, a current duration, and a delay period.

7. The invention of claim 1 wherein said means for sending signals comprises means for sending asynchronous pulsed signals.

8. The invention of claim 7 wherein said means for sending asynchronous pulsed signals comprises means for varying threshold/delay, pulsewidth, and refractory period of said asynchronous pulsed signals.

9. The invention of claim 1 additionally comprising asynchronous reset means for returning said processing element to a set of initial conditions.

10. A method of processing signals asynchronously comprising the steps of:

a) receiving one or more asynchronous action potential signals;

b) providing the action potential signals to one or more chemical synapse simulation means;

c) modifying the amount of energy stored in a neuron soma simulation means according to the action potential signals provided in step b); and d) sending an asynchronous action potential signal from axon hillock simulation means according to the amount of energy stored in the neuron soma simulation means.

11. A method of processing asynchronous signals, the method comprising the steps of:

(a) simulating one or more chemical synapses;

(b) simulating a neuron soma;

(c) simulating one or more dendrites operably connecting the simulated chemical synapses to the simulated neuron soma;

(d) simulating an axon;

(e) simulating an axon hillock operably connecting the simulated neuron soma to the simulated axon;

(f) receiving asynchronous signals and providing the signals to the simulated chemical synapses; and (g) sending asynchronous signals from the simulated axon.

12. The method of claim 11 wherein the step of simulating one or more chemical synapses comprises the step of simulating one or more chemical synapses selected from the group consisting of excitatory synapses, inhibitory synapses, and shunting synapses.

13. The method of claim 11 wherein the step of simulating one or more chemical synapses comprises the step of simulating one or more presynaptic regions.

14. The method of claim 11 wherein the step of simulating one or more chemical synapses comprises the step of simulating one or more post synaptic regions.

15. The method of claim 11 additionally comprising the step of providing a bias adaption network for dynamically controlling an operational parameter of the simulated axon hillock, the operational parameter selected from the group consisting of a threshold/delay level, an action potential pulsewidth level, and a refractory period.

16. The method of claim 11 additionally comprising the step of providing a bias adaption network for dynamically controlling an operational parameter of the simulated chemical synapses, the operational parameter selected from the group consisting of a current amplitude, a current duration, and a delay period.

17. The method of claim 11 wherein the step of sending asynchronous signals comprises the step of sending asynchronous pulsed signals.

18. The method of claim 17 wherein the step of sending asynchronous pulsed signals comprises the step of varying threshold/delay, pulsewidth, and the refractory period of the asynchronous pulsed signals.

19. The method of claim 11 additionally comprising the step of returning to a set of initial conditions by asynchronous reset.

* * * * *